(12) United States Patent
More et al.

(10) Patent No.: US 12,211,938 B2
(45) Date of Patent: *Jan. 28, 2025

(54) FINFET DEVICE AND METHOD OF FORMING SAME

(71) Applicant: Taiwan Semiconductor Manufacturing Co., Ltd., Hsinchu (TW)

(72) Inventors: Shahaji B. More, Hsinchu (TW); Shih-Chieh Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,529

(22) Filed: Jul. 25, 2023

(65) Prior Publication Data

US 2023/0378362 A1 Nov. 23, 2023

Related U.S. Application Data

(63) Continuation of application No. 17/402,815, filed on Aug. 16, 2021, now Pat. No. 11,764,301, which is a
(Continued)

(51) Int. Cl.
*H01L 29/78* (2006.01)
*H01L 21/265* (2006.01)
(Continued)

(52) U.S. Cl.
CPC .... *H01L 29/7851* (2013.01); *H01L 21/26513* (2013.01); *H01L 21/28185* (2013.01);
(Continued)

(58) Field of Classification Search
CPC ... H01L 29/7851; H01L 29/7853–7854; H01L 21/823481; H01L 21/823412; H01L 29/1054; H01L 29/41791; H01L 27/0924
See application file for complete search history.

(56) References Cited

U.S. PATENT DOCUMENTS 8,629,512 B2 1/2014 Liaw
9,093,530 B2 7/2015 Huang et al.
(Continued)

FOREIGN PATENT DOCUMENTS

CN 103367442 A 10/2013
CN 107680940 A 2/2018
(Continued)

*Primary Examiner* — Jose R Diaz
(74) *Attorney, Agent, or Firm* — Slater Matsil, LLP

(57) ABSTRACT

A FinFET device and a method of forming the same are provided. The method includes forming semiconductor strips over a substrate. Isolation regions are formed over the substrate and between adjacent semiconductor strips. A first recess process is performed on the isolation regions to expose first portions of the semiconductor strips. The first portions of the semiconductor strips are reshaped to form reshaped first portions of the semiconductor strips. A second recess process is performed on the isolation regions to expose second portions of the semiconductor strips below the reshaped first portions of the semiconductor strips. The second portions of the semiconductor strips are reshaped to form reshaped second portions of the semiconductor strips. The reshaped first portions of the semiconductor strips and the reshaped second portions of the semiconductor strips form fins. The fins extend away from topmost surfaces of the isolation regions.

20 Claims, 62 Drawing Sheets

Related U.S. Application Data continuation of application No. 16/245,519, filed on Jan. 11, 2019, now Pat. No. 11,094,826.

(60) Provisional application No. 62/737,218, filed on Sep. 27, 2018.

(51) Int. Cl.

| | | |
|---|---|---|
| *H01L 21/28* | (2006.01) | |
| *H01L 29/06* | (2006.01) | |
| *H01L 29/08* | (2006.01) | |
| *H01L 29/10* | (2006.01) | |
| *H01L 29/423* | (2006.01) | |
| *H01L 29/49* | (2006.01) | |

(52) U.S. Cl.
CPC .... *H01L 21/28238* (2013.01); *H01L 29/0653* (2013.01); *H01L 29/0847* (2013.01); *H01L 29/1054* (2013.01); *H01L 29/42392* (2013.01); *H01L 29/4966* (2013.01)

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,595,612 B2 | 3/2017 | Kim et al. |
| 9,601,342 B2 | 3/2017 | Lee et al. |
| 9,608,116 B2 | 3/2017 | Ching et al. |
| 9,666,716 B2 * | 5/2017 | Kim ............ H01L 29/7854 |
| 9,947,656 B2 | 4/2018 | Chung |
| 10,084,094 B1 | 9/2018 | Cheng et al. |
| 11,094,826 B2 | 8/2021 | More et al. |
| 2007/0205459 A1 | 9/2007 | Cho et al. |
| 2011/0175149 A1* | 7/2011 | Kim ............ H01L 29/0653 |
| | | 257/288 |
| 2013/0221447 A1 | 8/2013 | Lee et al. |
| 2013/0256764 A1 | 10/2013 | Liaw |
| 2014/0252428 A1 | 9/2014 | Chang et al. |
| 2014/0252557 A1 | 9/2014 | Flachowsky et al. |
| 2015/0228647 A1 | 8/2015 | Chang et al. |
| 2015/0311125 A1 | 10/2015 | Ju et al. |
| 2016/0155838 A1 | 6/2016 | Kim et al. |
| 2016/0308058 A1 | 10/2016 | Cheng et al. |
| 2018/0151441 A1 | 5/2018 | Lin et al. |

FOREIGN PATENT DOCUMENTS

| | | |
|---|---|---|
| CN | 107689331 A | 2/2018 |
| KR | 20070090375 A | 9/2007 |
| KR | 20130109909 A | 10/2013 |
| TW | 201336021 A | 9/2013 |
| TW | 201340322 A | 10/2013 |
| TW | 201543575 A | 11/2015 |
| TW | 201631667 A | 9/2016 |
| TW | 201820413 A | 6/2018 |

* cited by examiner

FINFET DEVICE AND METHOD OF FORMING SAME

PRIORITY CLAIM AND CROSS-REFERENCE

This application is a continuation of U.S. patent application Ser. No. 17/402,815 filed on Aug. 16, 2021, now U.S. Pat. No. 11,764,301 issued Sep. 19, 2023, and entitled "FinFET Device and Method of Forming Same," which is a continuation of U.S. patent application Ser. No. 16/245,519 filed on Jan. 11, 2019, and entitled "FinFET Device and Method of Forming Same," now U.S. Pat. No. 11,094,826 issued Aug. 17, 2021, which claims the benefit of U.S. Provisional Application No. 62/737,218, filed on Sep. 27, 2018, and entitled "FinFET Device and Method of Forming Same," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a fin field-effect transistor (FinFET), which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-16A are cross-sectional views of intermediate stages in the manufacture of a FinFET device in accordance with some embodiments.

FIGS. 32A-34A are cross-sectional views of intermediate stages in the manufacture of a FinFET device in accordance with some embodiments.

FIGS. 38A-42A are cross-sectional views of intermediate stages in the manufacture of a FinFET device in accordance with some embodiments.

DETAILED DESCRIPTION

Figure 1:
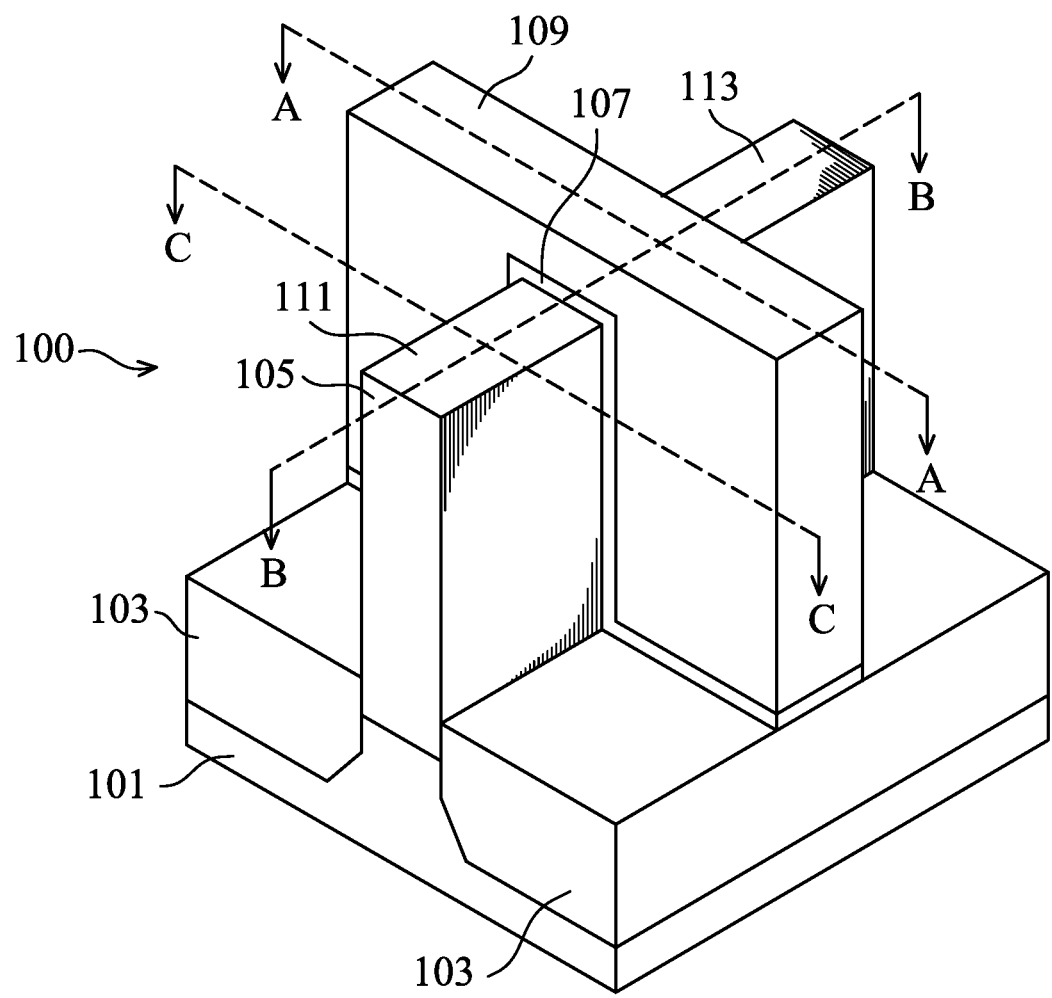
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a fin field-effect transistor (FinFET) device and a method of forming the same. Various embodiments presented herein are discussed in the context of a FinFET device formed using a gate-last process. In other embodiments, a gate-first process may be used. Various embodiments discussed herein allow for controlling strain in a channel of a FinFET device at a fin bottom and reducing or eliminating fin wiggle/bend effect, and allow for a FinFET device having a uniform threshold voltage (Vt) along a fin height. Various embodiments discussed herein further allow for improving device performance such as, for example, a drive current of a FinFET device.

FIG. 1 illustrates an example of a fin field-effect transistor (FinFET) 100 in a three-dimensional view. The FinFET 100 comprises a fin 105 on a substrate 101. The substrate 101 includes isolation regions 103, and the fin 105 protrudes above and from between neighboring isolation regions 103. A gate dielectric 107 is along sidewalls and over a top surface of the fin 105, and a gate electrode 109 is over the gate dielectric 107. Source/drain regions 111 and 113 are disposed in opposite sides of the fin 105 with respect to the gate dielectric 107 and gate electrode 109. The FinFET 100 illustrated in FIG. 1 is provided for illustrative purposes only and is not meant to limit the scope of the present disclosure. As such, many variations are possible, such as epitaxial source/drain regions, multiple fins, multilayer fins, etc. FIG. 1 further illustrates reference cross-sections that are used in subsequent figures. Cross-section A-A is across a channel, the gate dielectric 107, and the gate electrode 109 of the FinFET 100. Cross-section C-C is in a plane that is parallel to the cross-section A-A and is across fin 105 outside of the channel. Cross-section B-B is perpendicular to the cross-sections A-A and C-C, and is along a longitudinal axis of the fin 105 and in a direction of, for example, a current flow between the source/drain regions 111 and 113. Subsequent figures refer to these reference cross-sections for clarity.

FIGS. 2A-22A, 24A-29A, 17B-22B, 24B-29B, and 18C-29C are cross-sectional views of intermediate stages in the manufacturing of a FinFET device 200 in accordance with some embodiments. In FIGS. 2A-22A, 24A-29A, 17B-22B, 24B-29B, and 18C-29C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 2A:
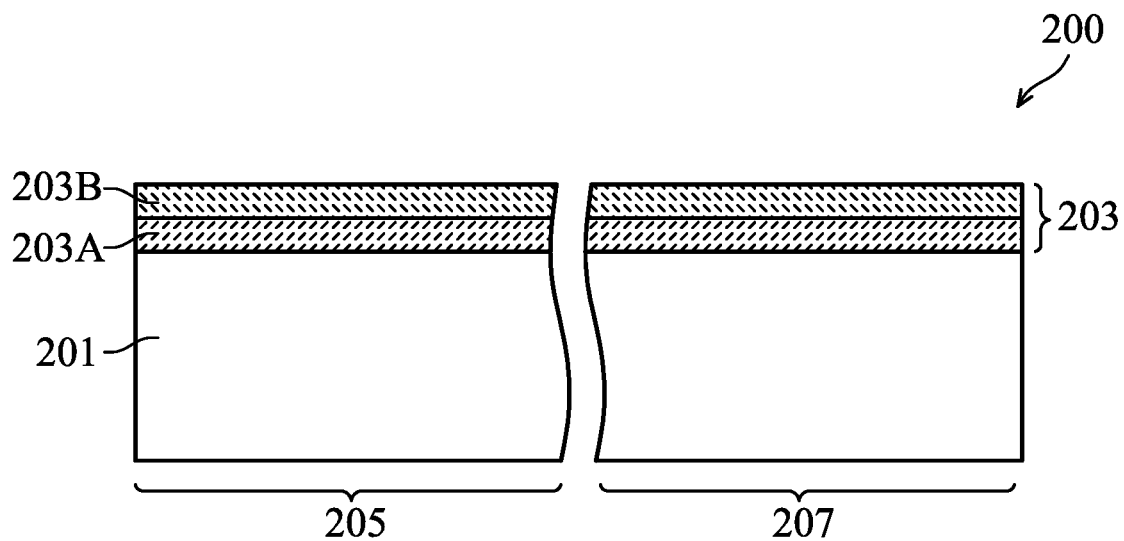

Referring to FIG. 2A, in some embodiments, the process of forming the FinFET device 200 starts with forming a mask 203 over a substrate 201. The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 201 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 201 to generate the structural and functional requirements of the design for the FinFET device 200. The integrated circuit devices may be formed using any suitable methods.

In some embodiments, the substrate 201 may comprise a first region 205 and a second region 207. As described below in greater detail, p-type devices are formed in the first region 205 and n-type devices are formed in the second region 207. The n-type devices may be NMOS devices, such as n-type FinFET devices. The p-type devices may be PMOS devices, such as p-type FinFET devices. Accordingly, the first region 205 may be also referred to as a PMOS region 205, and the second region 207 may be also referred to as an NMOS region 207.

Referring further to FIG. 2A, a mask 203 is formed over the substrate 201. In some embodiments, the mask 203 may be used in subsequent doping steps (see FIGS. 3A and 4A) to protect the substrate 201 during the doping process. In some embodiments, the mask 203 may comprise one or more mask layers. As shown in FIG. 2A, in some embodiments, the mask 203 may include a first mask layer 203A and a second mask layer 203B over the first mask layer 203A. The first mask layer 203A may comprise an oxide such as silicon oxide, or the like, and may be formed using any suitable process, such as thermal oxidation, atomic layer deposition (ALD), chemical vapor deposition (CVD), a combination thereof, or the like. The second mask layer 203B may comprise a nitride such as silicon nitride, silicon oxynitride, a combination thereof, or the like, and may be formed using any suitable process, such as thermal nitridation, ALD, CVD, a combination thereof, or the like.

Figure 3A:
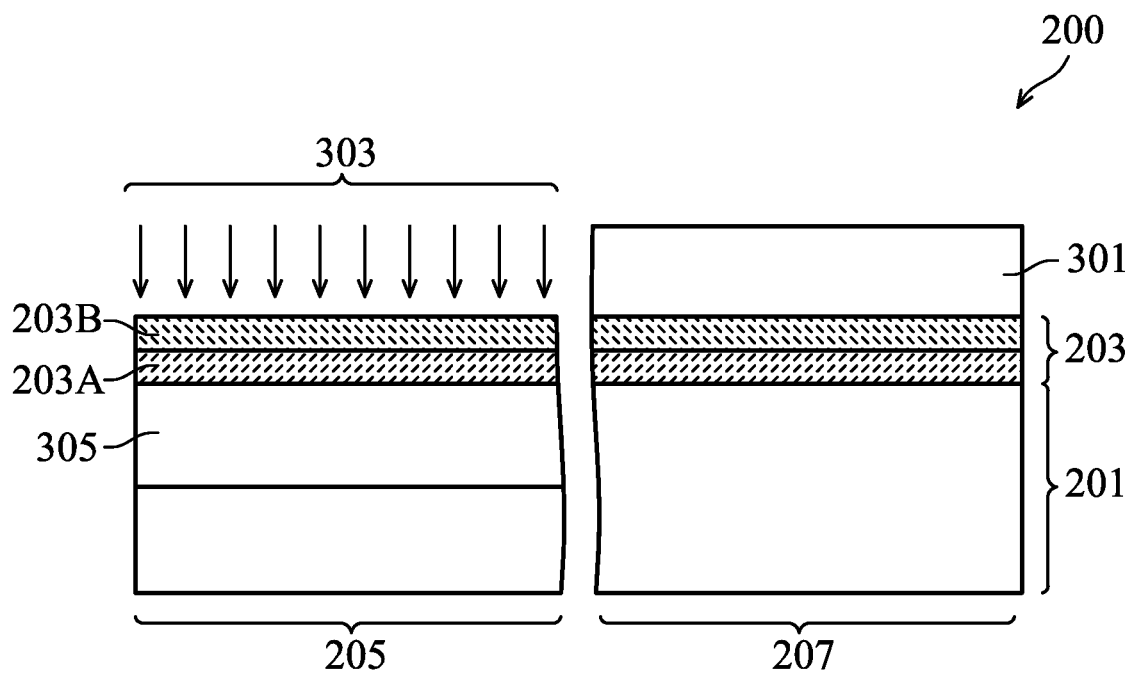

Referring to FIG. 3A, a mask 301 is formed over the mask 203. The mask 301 is patterned to expose portions of the mask 203 disposed over the PMOS region 205 of the substrate 201. In some embodiments, the mask 301 comprises a photoresist and may be formed using a spin-on technique. In some embodiments, the mask 301 may be patterned using acceptable photolithography techniques. Subsequently, a doping process 303 is performed on the PMOS region 205 of the substrate 201 to form a well 305 in the substrate 201, while protecting the NMOS region 207 of the substrate 201 with the mask 301. In some embodiments, the doping process 303 may comprise an ion implantation process, or the like. In some embodiments, n-type impurities are implanted into the substrate 201 to form the well 305, which is an n-well. The n-type impurities may be phosphorus, arsenic, or the like. After implanting the impurities, an annealing process may be performed on the substrate 201 to activate the impurities that were implanted.

Figure 4A:
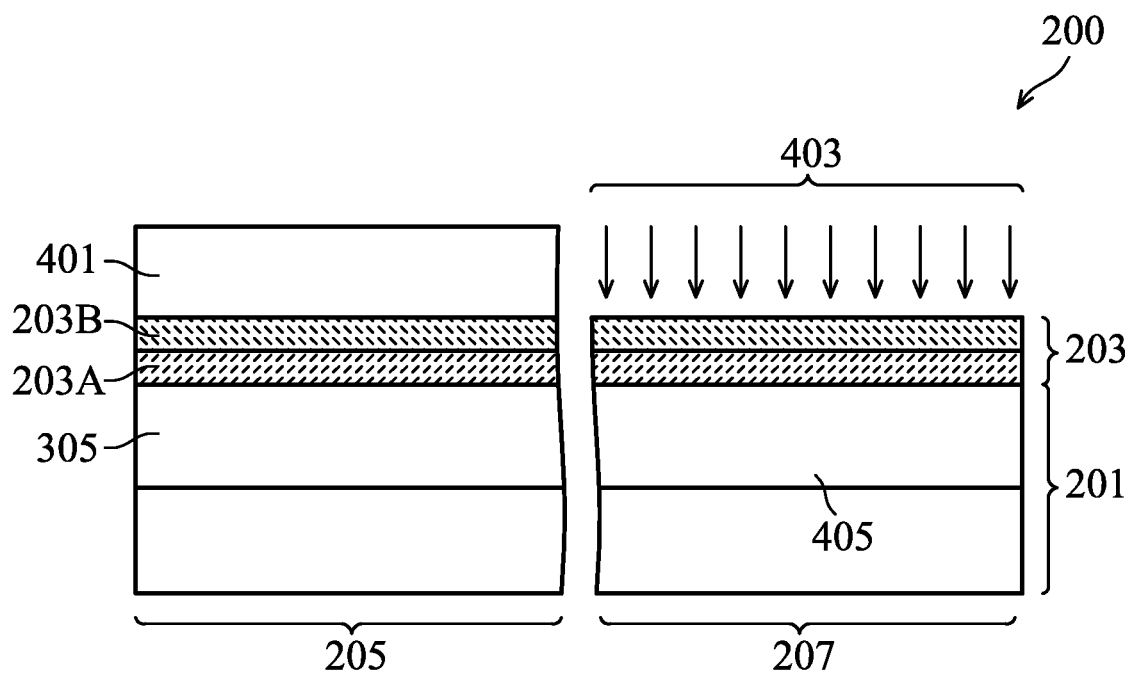

Referring to FIG. 4A, after performing the doping process 303, the mask 301 (see FIG. 3A) is removed. In some embodiments where the mask 301 comprises the photoresist, the mask 301 may be removed using an ashing process followed by a wet clean process, or other suitable photoresist removal processes. Subsequently, a mask 401 is formed over the mask 203. The mask 401 is patterned to expose portions of the mask 203 disposed over the NMOS region 207 of the substrate 201. In some embodiments, the mask 401 comprises a photoresist and may be formed using a spin-on technique. In some embodiments, the mask 401 may be patterned using acceptable photolithography techniques. Subsequently, a doping process 403 is performed on the NMOS region 207 of the substrate 201 form a well 405 in the substrate 201, while protecting the PMOS region 205 of the substrate 201 with the mask 401. In some embodiments, the doping process 403 may comprise an ion implantation process, or the like. In some embodiments, p-type impurities are implanted into the substrate 201 to form the well 405, which is a p-well. The p-type impurities may be boron, $BF_2$, or the like. After implanting the impurities, an annealing process may be performed on the substrate 201 to activate the impurities that were implanted.

Figure 5A:
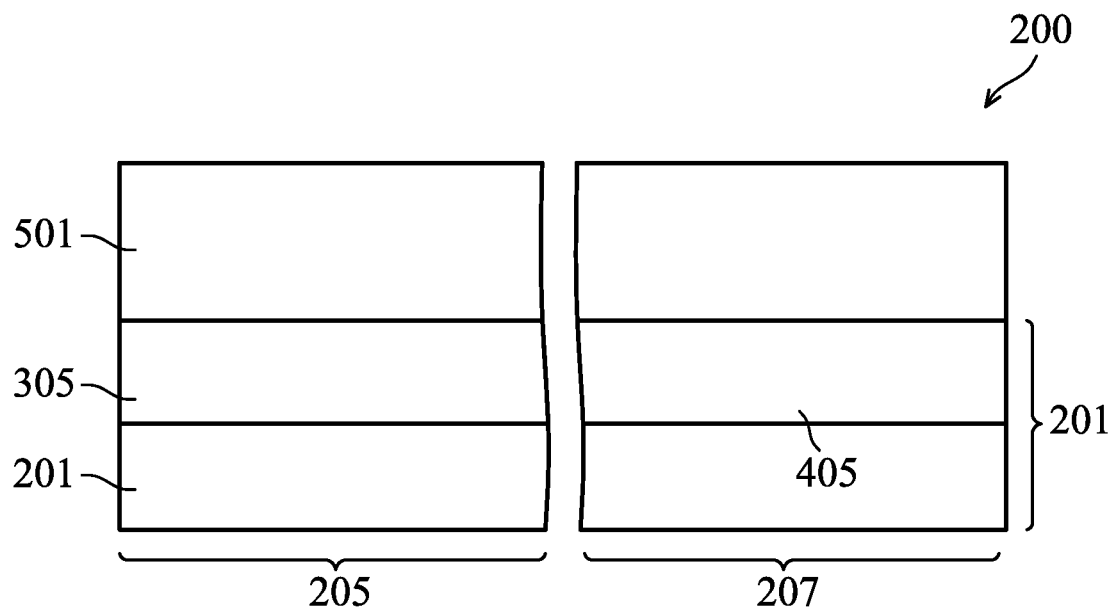

Referring to FIG. 5A, after performing the doping process 403, the mask 401 (FIG. 4A) is removed. In some embodiments where the mask 401 comprises the photoresist, the mask 401 may be removed using an ashing process followed by a wet clean process, or other suitable photoresist removal processes. After removing the mask 401, the mask 203 is removed to expose the substrate 201. In some embodiments, the mask 203 may be removed using a chemical mechanical polishing (CMP) process, an etching process, a grinding process, a combination thereof, or the like. After removing the mask 203, a semiconductor layer 501 is formed over the substrate 201. In some embodiments, the semiconductor layer 501 may comprise similar materials as the substrate 201 described above with reference to FIG. 2A and the description is not repeated herein. In an embodiment, the semiconductor layer 501 is a silicon layer. In some embodiments, the semiconductor layer 501 may be epitaxially grown over the substrate 201. Accordingly, the semiconductor layer 501 may also referred to as an epitaxial semiconductor layer 501.

Figure 6A:
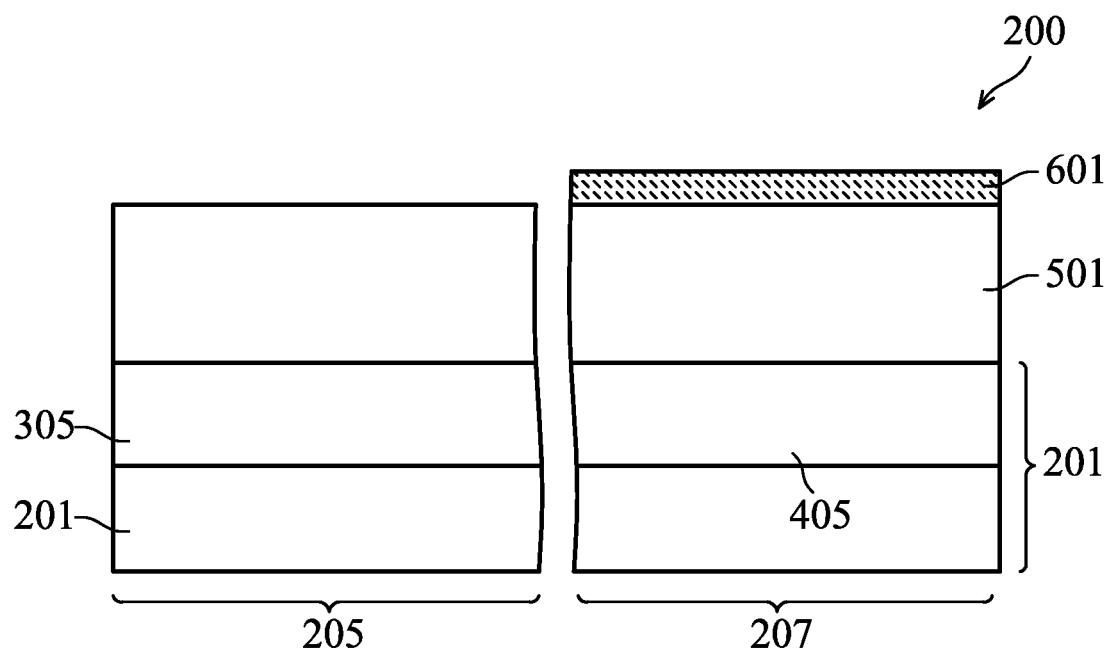

Referring to FIG. 6A, the mask 601 is formed over the semiconductor layer 501 and is patterned to expose a portion of the mask 601 disposed over the PMOS region 205 of the substrate 201. The mask 601 may comprise an oxide such as silicon oxide, or the like, and may be formed using any suitable process, such as thermal oxidation, ALD, CVD, a combination thereof, or the like. In some embodiments, the mask 601 may be patterned using suitable photolithography and etching methods.

Figure 7A:
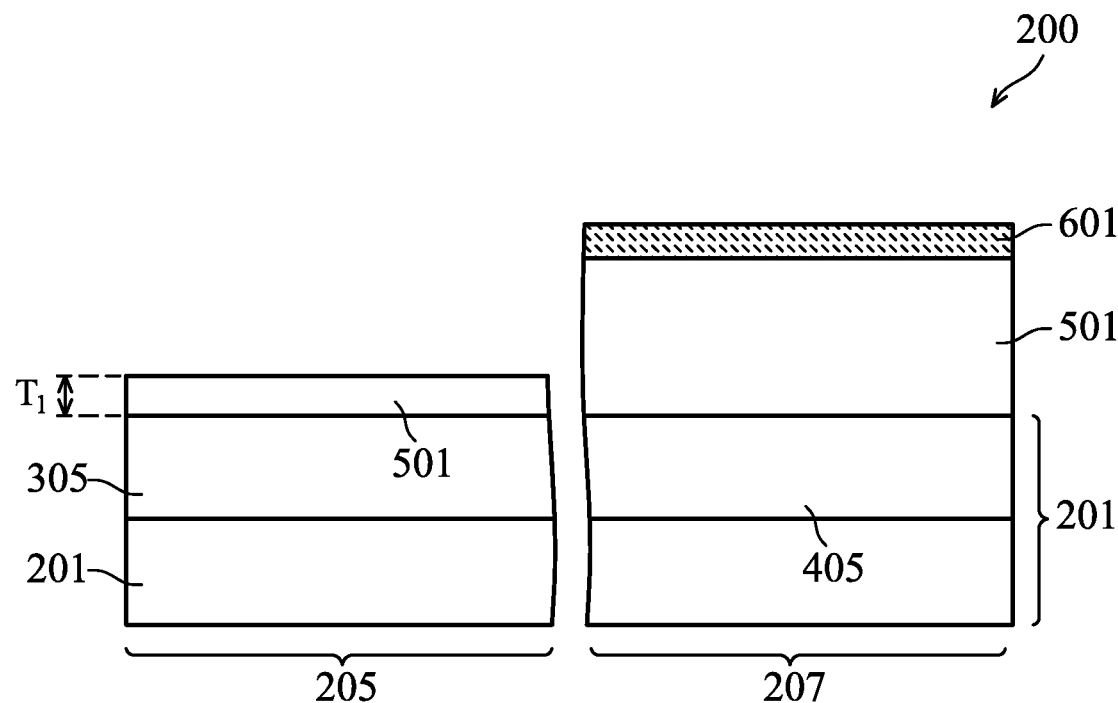

Referring to FIG. 7A, an exposed portion of the semiconductor layer 501 is recessed without completely removing the semiconductor layer 501 over the PMOS region 205 of the substrate 201. In some embodiments, the remaining portion of the semiconductor layer 501 over the PMOS region 205 of the substrate 201 may have a thickness $T_1$ between about 1 nm and about 10 nm. In some embodiments, the semiconductor layer 501 may be recessed using a suitable etching process while using the mask 601 as an etch mask.

Figure 8A:
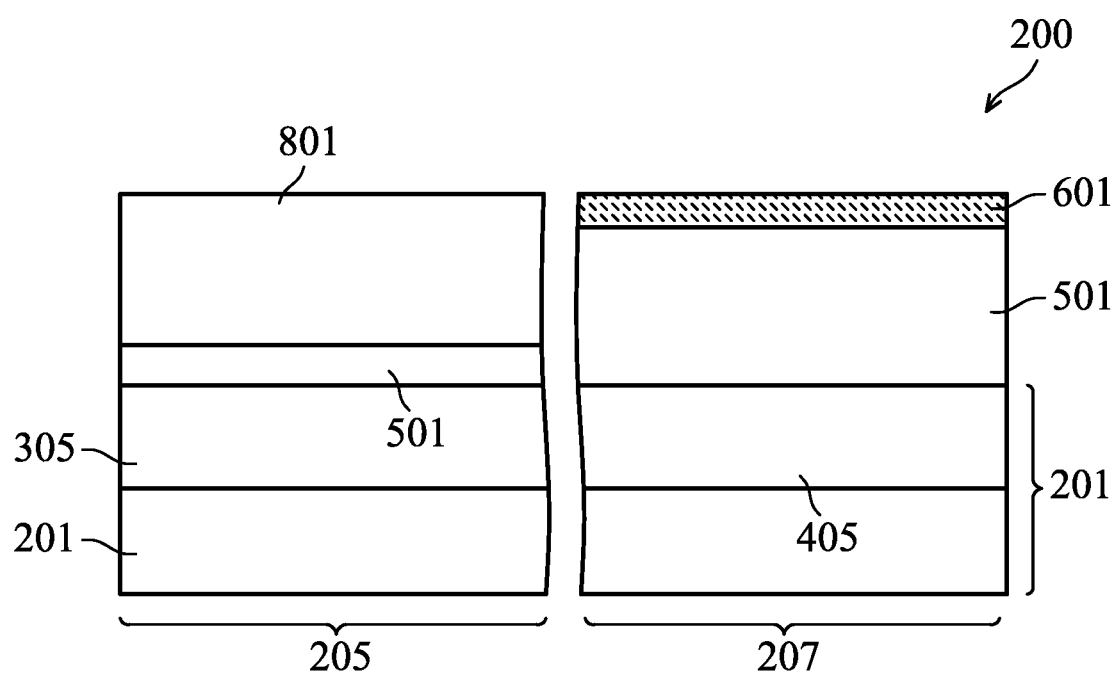

Referring to FIG. 8A, a semiconductor layer 801 is formed over the PMOS region 205 of the substrate 201. In some embodiments, the semiconductor layer 801 comprises SiGe and is epitaxially grown over the remaining portion of the semiconductor layer 501 in the PMOS region 205. In some embodiments, the semiconductor layer 801 comprising SiGe may be formed by low-pressure CVD (LPCVD) using suitable Ge and Si precursors. The Ge precursors may comprise $GeH_4$, $GeH_3CH_3$, $(GeH_3)_2CH_2$, a combination thereof, or the like. The Si precursors may comprise $SiH_2Cl_2$, $SiH_4$, a combination thereof, or the like.

Figure 9A:
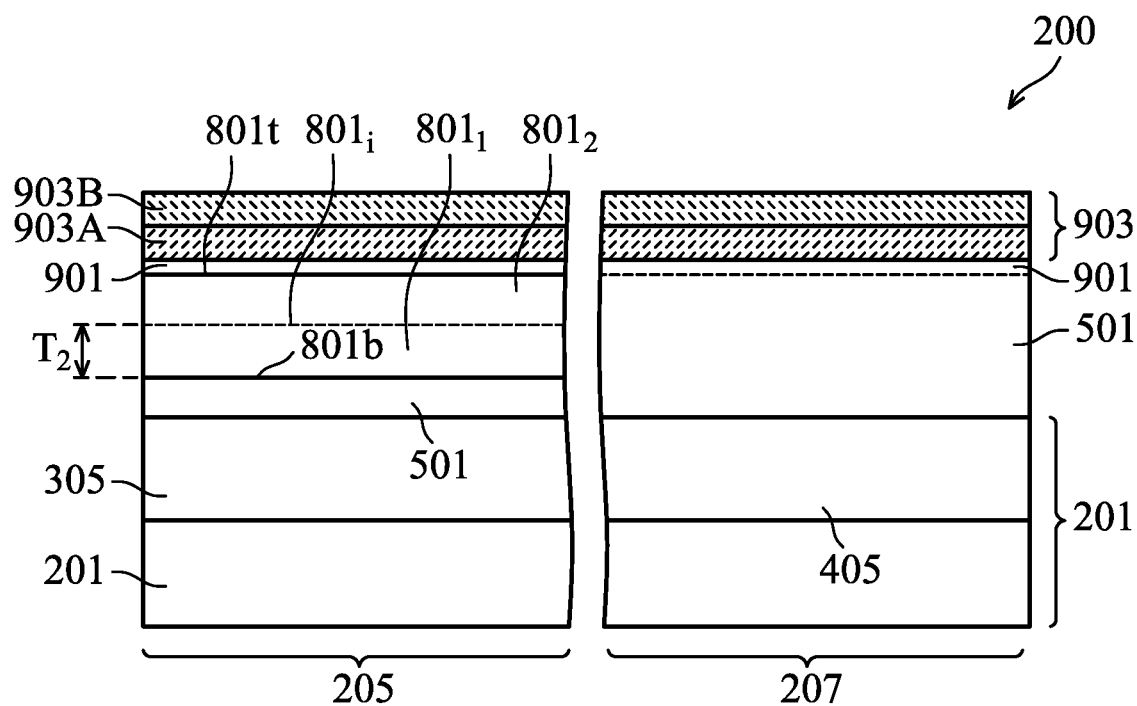

Referring to FIG. 9A, after forming the semiconductor layer 801, the mask 601 is removed. In some embodiments, the mask 601 (see FIG. 8A) may be removed using a CMP process, an etching process, a grinding process, a combination thereof, or the like. In some embodiments where the mask 601 comprises silicon oxide, the mask 601 is removed by an etching process using dilute HF. In some embodiments, after removing the mask 601, a polishing process is performed on the semiconductor layers 501 and 801. The polishing process may comprise a CMP process, an etching process, a grinding process, a combination thereof, or the like. In some embodiments, after performing the polishing process, a semiconductor layer 901 is formed over the semiconductor layers 501 and 801. In some embodiments, the semiconductor layer 901 has a thickness between about 1 nm and about 10 nm. In some embodiments, the semiconductor layer 901 may be formed using similar materials and methods as the semiconductor layer 501 described above with reference to FIG. 5A, and the description is not repeated herein. In some embodiments where the semiconductor layers 501 and 901 are silicon layers and the semiconductor layer 801 is a SiGe layer, an interface between the semiconductor layers 501 and 901 may not be detectable (as illustrated in FIG. 9A by a dashed line), while an interface between the semiconductor layers 801 and 901 is detectable (as illustrated in FIG. 9A by a solid line). In some embodiments, the semiconductor layer 901 may prevent Ge out diffusion from the semiconductor layer 801 during a subsequent patterning process for forming semiconductor strips (see FIG. 10A). Accordingly, the semiconductor layer 901 may also be referred to as a buffer layer.

Referring further to FIG. 9A, after forming the semiconductor layer 901, a mask 903 is formed over the semiconductor layer 901. In some embodiments, the mask 903 comprises a first mask layer 903A and a second mask layer 903B over the first mask layer 903A. In some embodiments, the first mask layer 903A may be formed using similar materials and methods as the first mask layer 203A described above with reference to FIG. 2A, and the description is not repeated herein. In some embodiments, the second mask layer 903B may be formed using similar materials and methods as the second mask layer 203B described above with reference to FIG. 2A, and the description is not repeated herein.

Referring further to FIGS. 8A and 9A, in some embodiments, the semiconductor layer 801 comprising SiGe has a uniform Ge concentration throughout. In such embodiments, the uniform Ge concentration is between about 15 atomic % and about 40 atomic %. In other embodiments, the semiconductor layer 801 comprising SiGe has a non-uniform Ge concentration, with the Ge concentration increasing from a lowest Ge concentration at a bottom surface $801b$ of the semiconductor layer 801 to a highest Ge concentration at a top surface $801t$ of the semiconductor layer 801. In some embodiments, the Ge concentration at the bottom surface $801b$ of the semiconductor layer 801 is between about 10 atomic % and about 20 atomic %. In some embodiments, the Ge concentration at the top surface $801t$ of the semiconductor layer 801 is between about 25 atomic % and about 35 atomic %. In yet other embodiments, the semiconductor layer 801 comprising SiGe has a non-uniform Ge concentration, with a lower portion $801_1$ of the semiconductor layer 801 having a uniform Ge concentration and an upper portion $801_2$ of the semiconductor layer 801 having a non-uniform Ge concentration. In such embodiments, the Ge concentration increases from a low Ge concentration at an interface $801i$ between the lower portion $801_1$ and the upper portion $801_2$ of the semiconductor layer 801 to a high Ge concentration at the top surface $801t$ of the semiconductor layer 801. In some embodiments, the uniform Ge concentration of the lower portion $801_1$ of the semiconductor layer 801 is between about 15 atomic % and about 40 atomic %. In some embodiments, the Ge concentration at the interface $801i$ is between about 10 atomic % and about 20 atomic %. In some embodiments, the Ge concentration at the top surface $801t$ of the semiconductor layer 801 is between about 25 atomic % and about 35 atomic %.

Figure 10A:
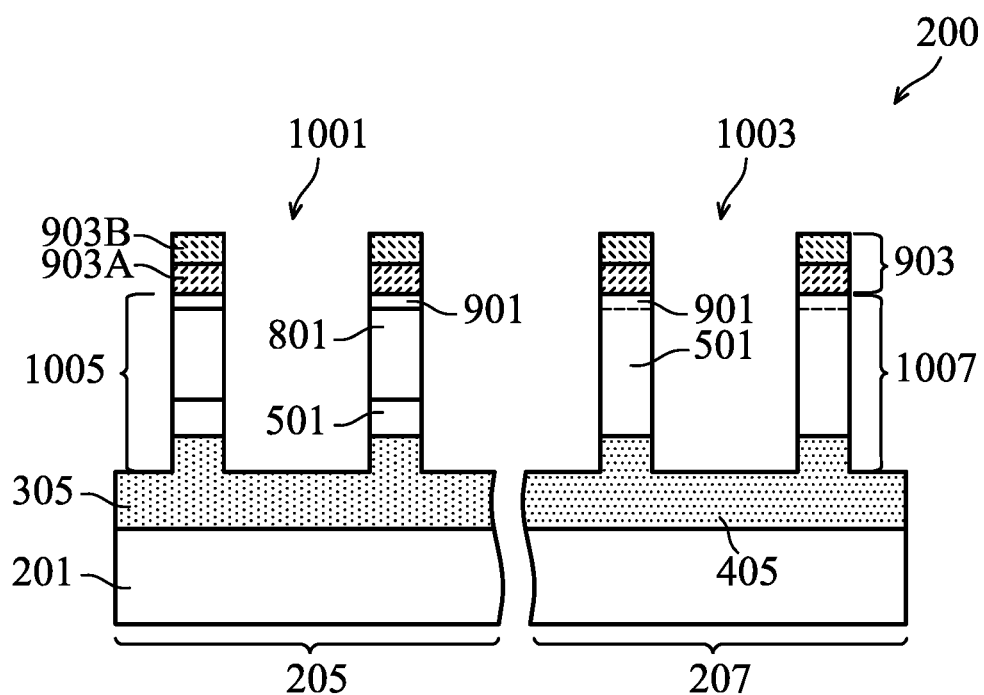

FIG. 10A illustrates the formation of semiconductor strips 1005 in the PMOS region 205 and semiconductor strips 1007 in the NMOS region 207. First, the mask layers 903A and 903B are patterned, where openings in mask layers 903A and 903B expose areas of the semiconductor layers 501, 801 and 901, where trenches 1001 and 1003, respectively, are to be formed. Next, a patterning process may be performed, where the patterning process creates the trenches 1001 in the PMOS region 205 and the trenches 1003 in the NMOS region 207 through the openings in the mask 903. The remaining portions of the substrate 201 and the semiconductor layers 501, 801 and 901 underlying the patterned mask 903 form the semiconductor strips 1005 in the PMOS region 205. The remaining portions of the substrate 201 and the semiconductor layers 501 and 901 underlying the patterned mask 903 form the semiconductor strips 1007 in the NMOS region 207. The patterning process may be one or more acceptable etch processes, such as a reactive ion etch (RIE), neutral beam etch (NBE), a combination thereof, or the like. In some embodiments, the patterning process comprises a first etch process performed on the PMOS region 205 while the NMOS region 207 is protected by a mask (not shown), followed by a second etch process performed on the NMOS region 207 while the PMOS region 205 is protected by a mask (not shown), with the first etch process being different from the second etch process. In other embodiments, the second etch process may be performed before the first etch process.

Figure 11A:
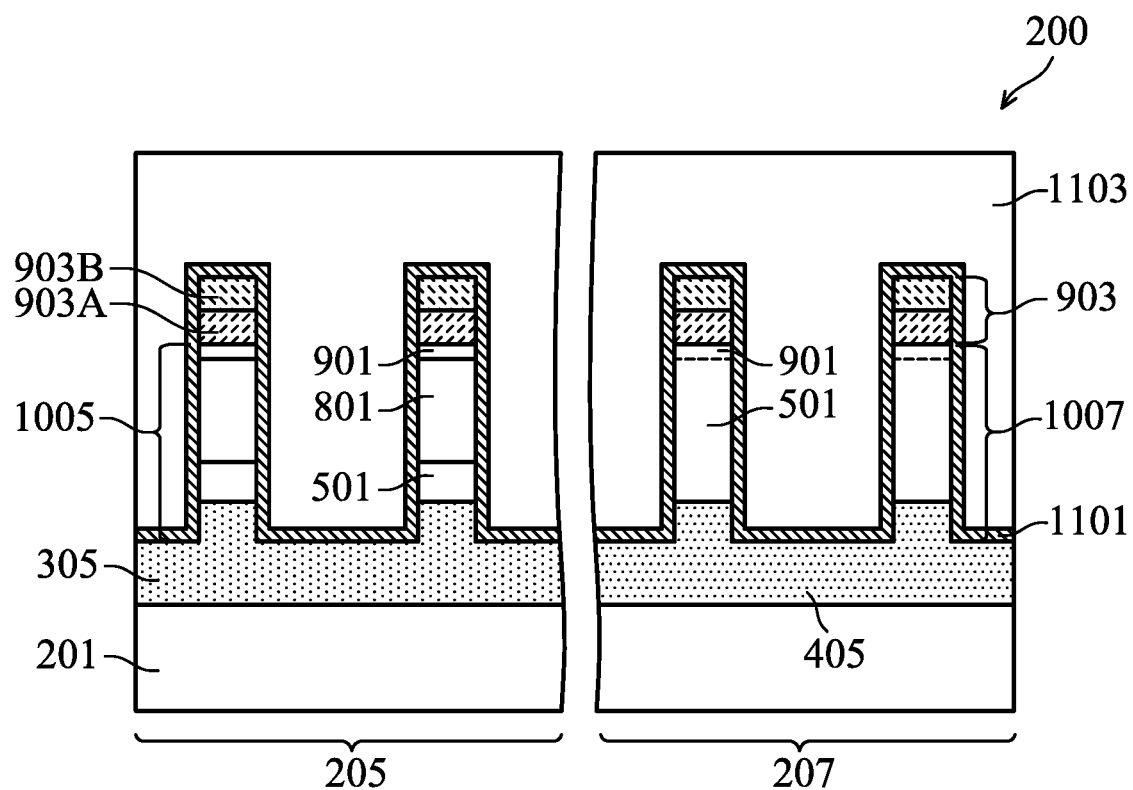

Referring to FIG. 11A, a conformal liner 1101 is formed on sidewalls and bottom surfaces of the trenches 1001 and 1003 (see FIG. 10A), which are subsequently filled with an insulation material 1103. In some embodiments, the liner 1101 may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner 1101 may include any suitable method, such as ALD, CVD, high density plasma CVD (HDP-CVD), physical vapor deposition (PVD), a combination thereof, or the like. In some embodiments, the insulation material 1103 may be an oxide, such as silicon oxide, a nitride, such as silicon nitride, a combination thereof, or the like, and may be formed by HDP-CVD, flowable CVD (FCVD) (e.g., a CVD-based material deposition in a remote plasma system and post curing to make it convert to another material, such as an oxide), a combination thereof, or the like. Other insulation materials formed by any acceptable processes may be also used. In some embodiments, after the insulation material 1103 is deposited, an annealing process may be performed on the insulation material 1103. In such embodiments, the liner 1101 may prevent (or at least reduce) the diffusion of the semiconductor material from the semiconductor strips 1005 and 1007 (e.g., Si or Ge) into the insulation material 1103 during the annealing process.

Figure 12A:
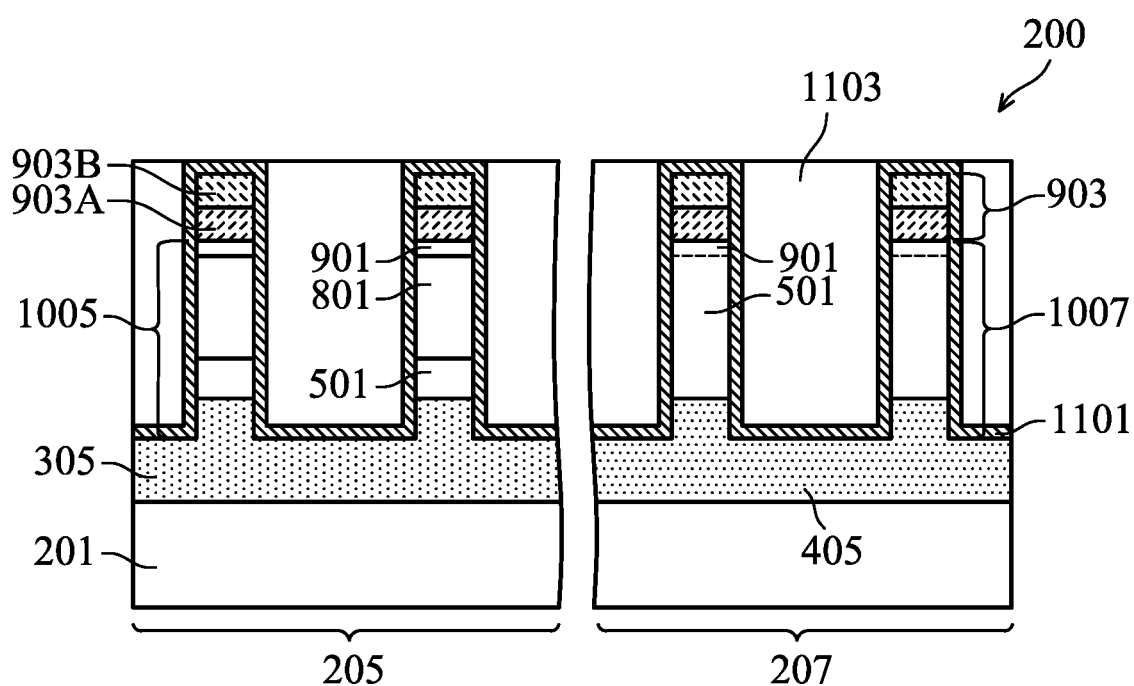

Referring FIG. 12A, a first planarization process, such as a CMP process, is performed to remove excess insulation material 1103, such that top surfaces of remaining portions of the insulation material 1103 are coplanar with top surfaces of the liner 1101.

Figure 13A:
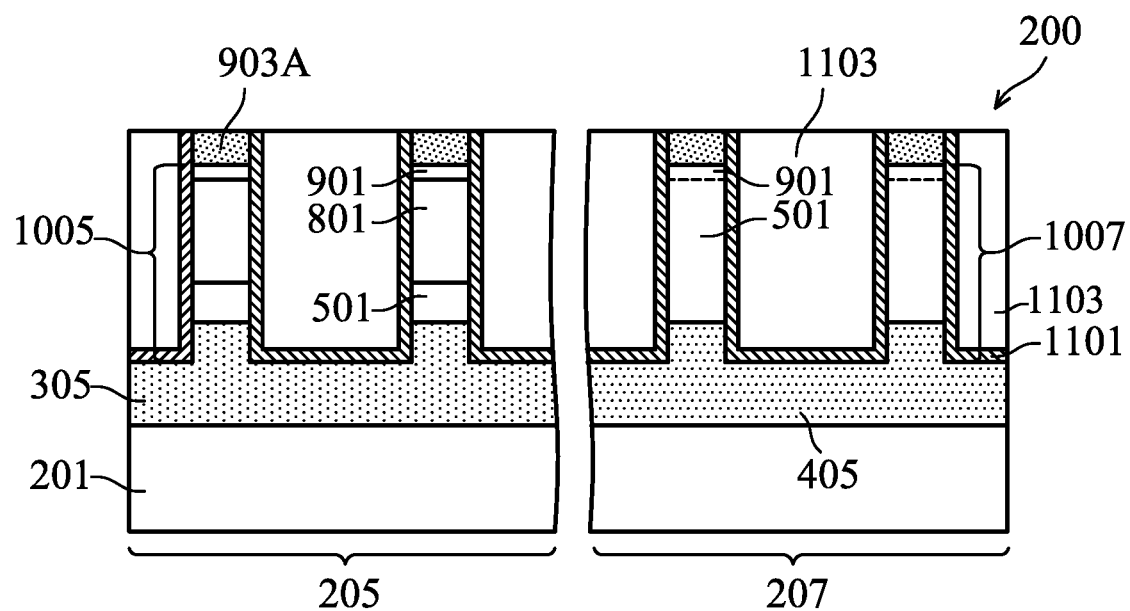

Referring FIG. 13A, a second planarization process, such as a CMP process, is performed to remove excess insulation material 1103, such that top surfaces of remaining portions of the insulation material 1103 are coplanar with a top surface of the mask layer 903A. The second planarization process further removes the mask layer 903B and portions of the liner 1101. In some embodiments, the second planarization process is different from the first planarization process.

Figure 14A:
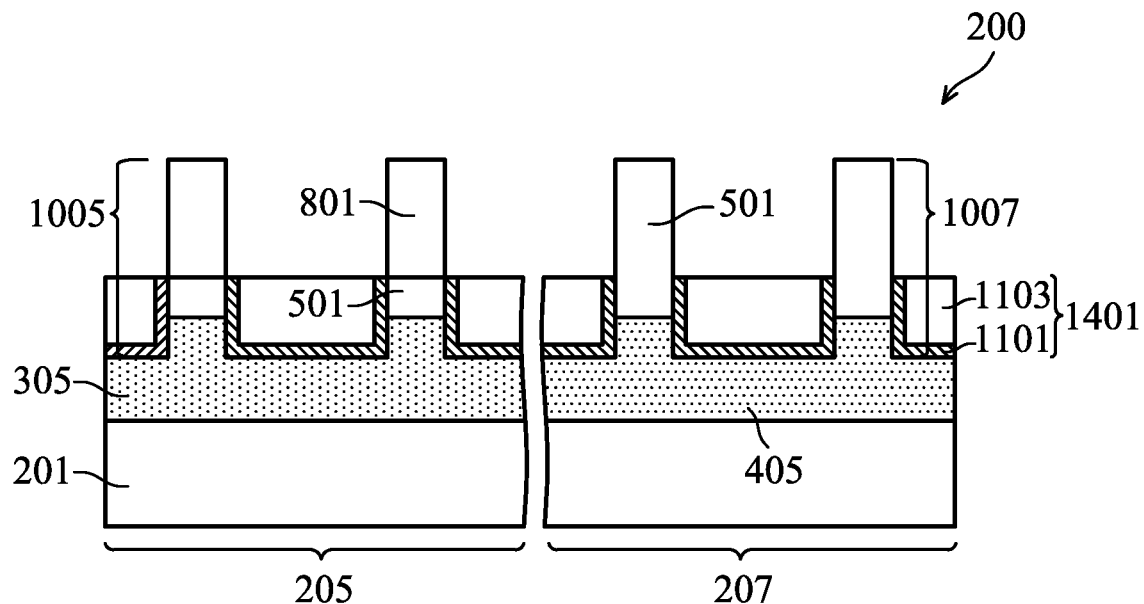

FIG. 14A illustrates the recessing of the insulation material 1103 and the liner 1101. The remaining portions of the insulation material 1103 and the liner 1101 form shallow trench isolation (STI) regions 1401. The insulation material 1103 and the liner 1101 are recessed such that upper portions of the semiconductor strips 1005 and 1007 protrude from between neighboring STI regions 1401. Further, the top surfaces of the STI regions 1401 may have a flat surface as illustrated, a convex surface, a concave surface (such as dishing), or a combination thereof. The top surfaces of the STI regions 1401 may be formed flat, convex, and/or concave by an appropriate etch. The insulation material 1103 and the liner 1101 may be recessed using an acceptable etching process, such as one that is selective to the material of the insulation material 1103 and the liner 1101. In some embodiments, an oxide removal using a CERTAS® etch, an Applied Materials SICONI tool, or dilute hydrofluoric (dHF) acid may be used. In some embodiments, the recessing process further removes portions of the patterned semiconductor layer 901 (see FIG. 13A) from the semiconductor strips 1005 and 1007.

Figure 15A:
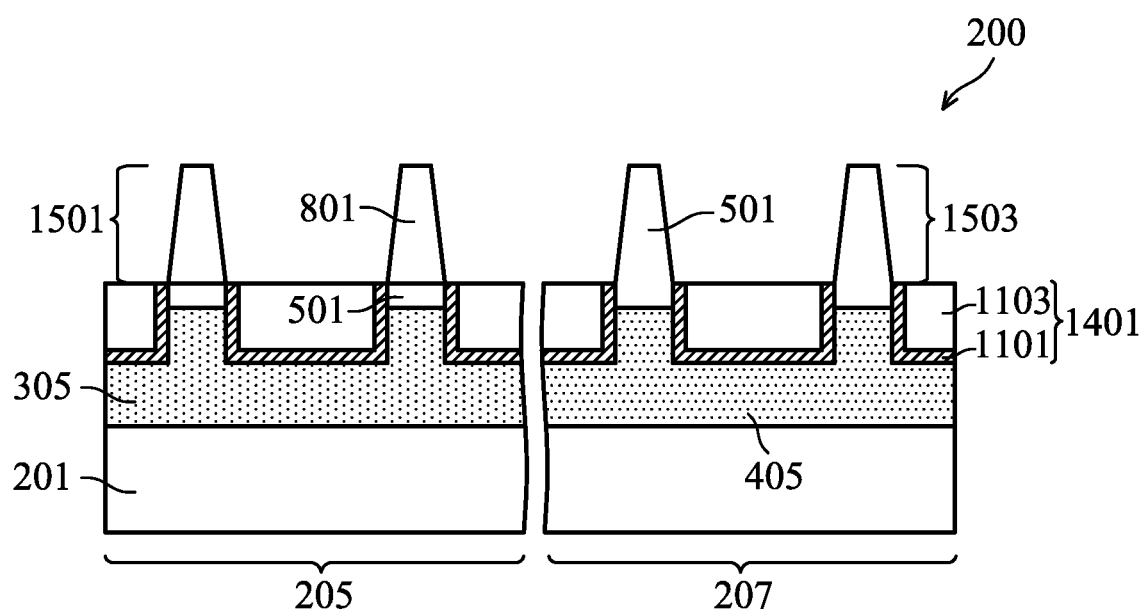

Referring to FIG. 15A, one or more etch processes are performed on exposed portions of the semiconductor strips 1005 and 1007 (see FIG. 14A) to form fins 1501 and 1503, respectively. In some embodiments, a same etch process is performed on the exposed portions of the semiconductor strips 1005 and 1007. In such embodiments, an oxide layer such as, for example, a silicon oxide layer (not shown) may be formed over the exposed portions of the semiconductor strips 1007 to compensated the etch rate difference between the semiconductor strips 1005 and 1007. In other embodiments, two different etch processes are performed on the exposed portions of the semiconductor strips 1005 and 1007. In some embodiments, one or more etch processes may comprise an anisotropic etch process, such as a reactive ion etch (RIE), or the like. In some embodiments, etch chemistry and other parameters of the RIE process may be tuned to tune etch rates of the RIE process. In some embodiments, an etch rate along a crystallographic direction <100>, $R_{100}$, is greater than an etch rate along a crystallographic direction <110>, $R_{110}$, which is greater than an etch rate along a crystallographic direction <111>, $R_{111}$. In some embodiments, $R_{100}:R_{110}:R_{111}$ is equal to 600:400:1. In some embodiments where top surfaces of the semiconductor layers 501 and 801 are crystallographic planes (100), the RIE process changes slopes of sidewalls of the exposed portions of the semiconductor strips 1005 and 1007, such that widths of the fins 1501 and 1503 decrease as the fins 1501 and 1503 extend away from the respective adjacent STI regions 1401. Reshaping the semiconductor strips 1005 and 1007 into fins 1501 and 1503, respectively, as described above with reference to FIGS. 14A and 15A allows for controlling strain in channels of the FinFET device 200 at fin bottoms and reducing or eliminating fin wiggle/bend effect, and allows for the FinFET device 200 having a uniform threshold voltage (Vt) along fin heights.

Figure 16A:
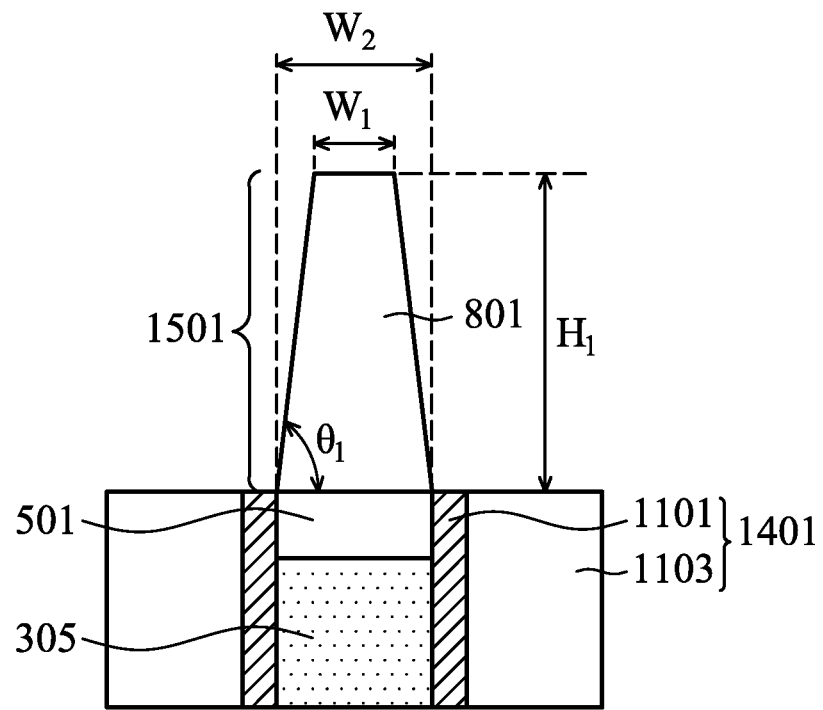

FIG. 16A illustrates a magnified view of a fin 1501 shown in FIG. 15A. In some embodiments, the fin 1501 has a height $H_1$ between about 30 nm and about 60 nm. In some embodiments, a width of the fin 1501 decreases as the fin 1501 extends away from the adjacent STI regions 1401. In some embodiments, a portion of the fin 1501 farthest away from the adjacent STI regions 1401 has a width $W_1$ between about 2 nm and about 10 nm. In some embodiments, a portion of the fin 1501 nearest the adjacent STI regions 1401 has a width $W_2$ between about 4 nm and about 14 nm. In some embodiments, the width $W_2$ is greater than the width $W_1$. In some embodiments where the fin 1501 comprises SiGe, the fin 1501 has a uniform Ge concentration. In such embodiments, the uniform Ge concentration is between about 15 atomic % and about 40 atomic %. In other embodiments where the fin 1501 comprises SiGe, the fin 1501 has a non-uniform Ge concentration, with the Ge concentration increasing as the fin 1501 extends away from the adjacent STI regions 1401. In some embodiments, a Ge concentration of a portion of the fin 1501 nearest the adjacent STI regions 1401 is between about 10 atomic % and about 20 atomic %. In some embodiments, a Ge concentration of a portion of the fin 1501 farthest from the adjacent STI regions 1401 is between about 25 atomic % and about 35 atomic %. In some embodiments, sidewalls of the fin 1501 form an angle $\theta_1$ with topmost surfaces of adjacent STI regions 1401. In some embodiments, the angle $\theta_1$ is between about 80 degrees and about 90 degrees. In some embodiments, the fins 1503 (see FIG. 15A) may have similar shapes and sizes as the fins 1501 and the description is not repeated herein.

Figure 17A:
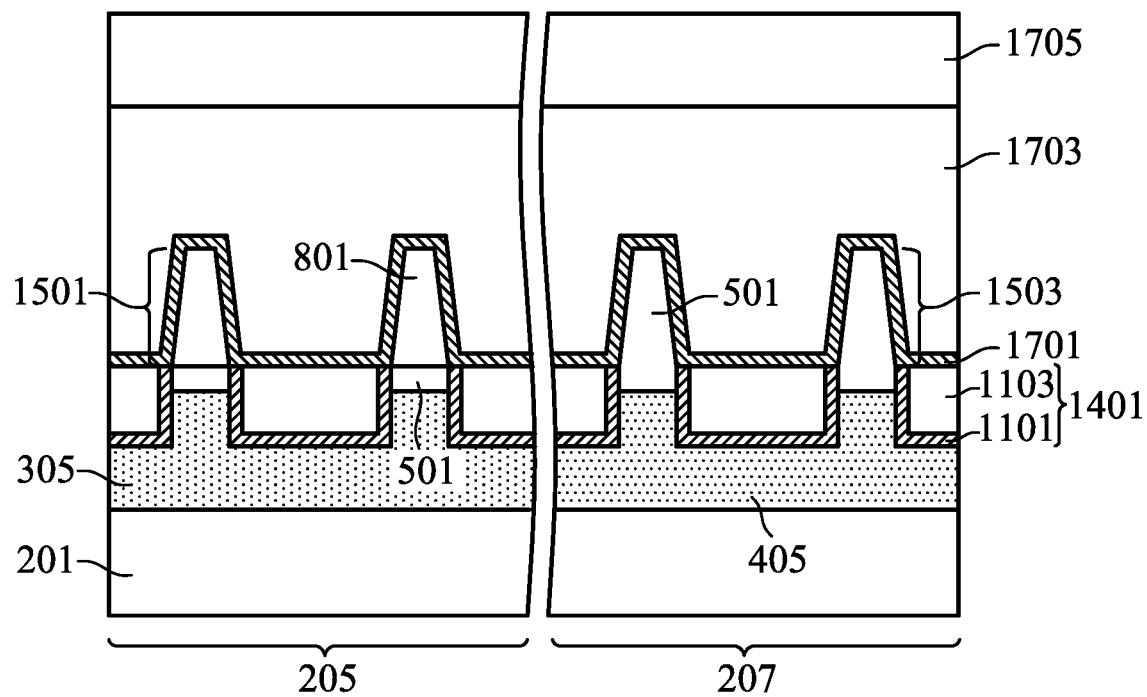
FIGS. 17A and 17B are cross-sectional views of an intermediate stage in the manufacture of a FinFET device in accordance with some embodiments.
Figure 17B:
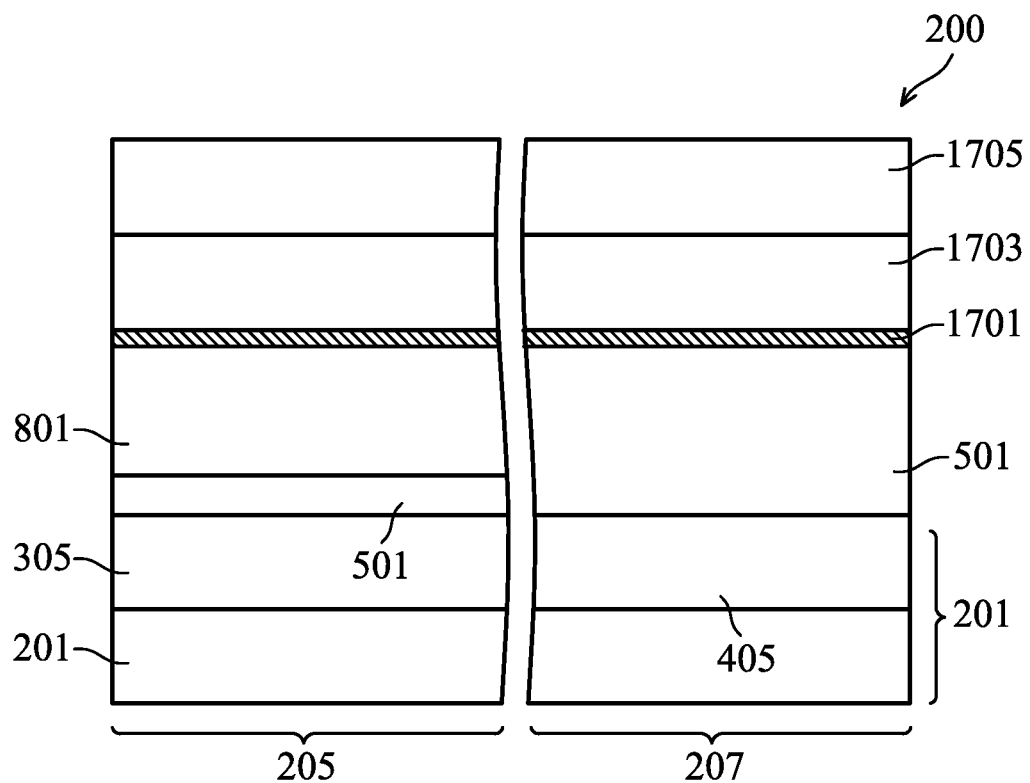

Referring to FIGS. 17A and 17B, a dielectric layer 1701 is formed on sidewalls and top surfaces of the fins 1501 and 1503. In some embodiments, the dielectric layer 1701 may be also formed over the STI regions 1401. In other embodiments, top surfaces of the STI regions 1401 may be free from the dielectric layer 1701. The dielectric layer 1701 may comprise an oxide, such as silicon oxide, or the like, and may be deposited (using, for example, ALD, CVD, PVD, a combination thereof, or the like) or thermally grown (for example, using thermal oxidation, or the like) according to acceptable techniques. A gate electrode layer 1703 is formed over the dielectric layer 1701, and a mask 1705 is formed over the gate electrode layer 1703. In some embodiments, the gate electrode layer 1703 may be deposited over the dielectric layer 1701 and then planarized using, for example, a CMP process. Subsequently, the mask 1705 may be deposited over the gate electrode layer 1703. The gate electrode layer 1703 may be made of, for example, polysilicon, although other materials that have a high etching selectivity with respect to the material of the STI regions 1401 may also be used. The mask 1705 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like. In the illustrated embodiment, a single dielectric layer 1701, a single gate electrode layer 1703, and a single mask 1705 are formed across the PMOS region 205 and the NMOS region 207. In other embodiments, different dielectric layers, different gate electrode layers, and different masks may be separately formed in the PMOS region 205 and the NMOS region 207.

Figure 18A:
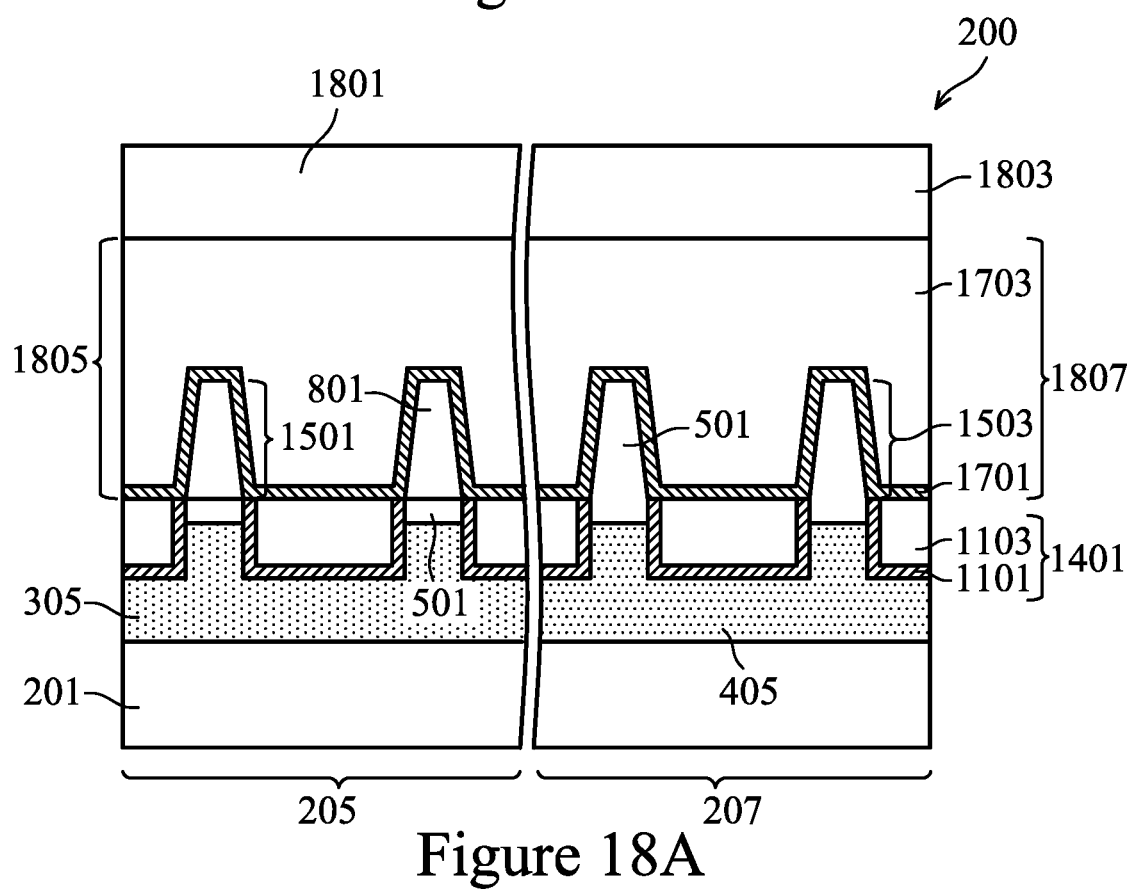
FIGS. 18A, 18B and 18C are cross-sectional views of an intermediate stage in the manufacture of a FinFET device in accordance with some embodiments.
Figure 18B:
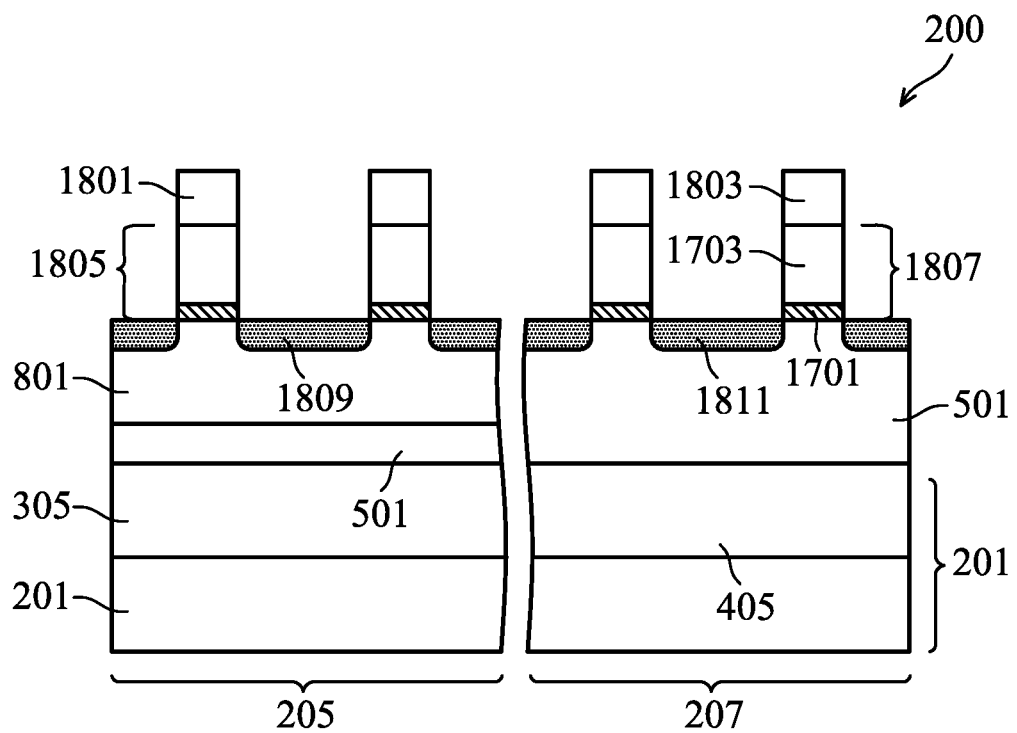
Figure 18C:
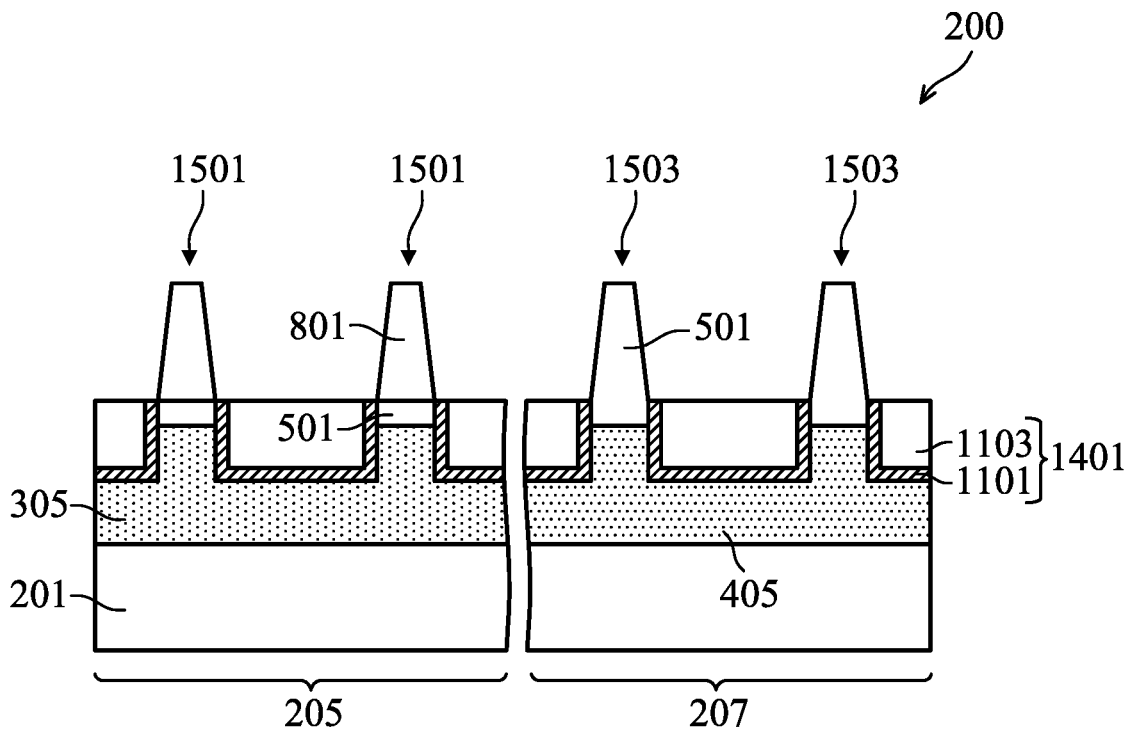

Referring to FIGS. 18A, 18B, and 18C, the mask 1705 (see FIGS. 17A and 17B) may be patterned using acceptable photolithography and etching techniques to form a patterned mask 1801 in the PMOS region 205 and a patterned mask 1803 in the NMOS region 207. The pattern of the masks 1801 and 1803 then are transferred to the gate electrode layer 1703 and the dielectric layer 1701 by an acceptable etching technique to form gates 1805 in the PMOS region 205 and gates 1807 in the NMOS region 207. The pattern of the gates 1805 and 1807 cover channel regions of the fins 1501 and 1503 while exposing source/drain regions of the fins 1501 and 1503, respectively. The gates 1805 and 1807 may also have a lengthwise direction substantially perpendicular to the lengthwise direction of fins 1501 and 1503, respectively. A size of the gates 1805 and 1807, and a pitch between gates 1805 and 1807, may depend on a region of a die in which the gates 1805 and 1807 are formed. In some embodiments, the gates 1805 and 1807 may have a larger size and a larger pitch when located in an input/output region of a die (e.g., where input/output circuitry is disposed) than when located in a logic region of a die (e.g., where logic circuitry is disposed). As described below in greater detail, in some embodiments, the gates 1805 and 1807 are sacrificial gates and are subsequently replaced by replacement gates. In such embodiments, the gates 1805 and 1807 may also be referred to as sacrificial gates. In other embodiments, the gates 1805 and 1807 are not replaced and are present in the final FinFET device 200.

Referring further to FIGS. 18A, 18B, and 18C, lightly doped source/drain (LDD) regions 1809 are formed in the fins 1501 in the PMOS region 205 and LDD regions 1811 are formed in the fins 1503 in the NMOS region 207. Similar to the implantation processes discussed above with reference to FIGS. 3A and 4A, a mask (not shown), such as a photoresist, is formed over the NMOS region 207, while exposing the PMOS region 205, and p-type impurities are implanted into the exposed fins 1501 to form the LDD regions 1809 in the PMOS region 205. The p-type impurities may be any of the p-type impurities discussed above with reference to FIG. 4A. During the implantation of the LDD regions 1809, the gates 1805 and the patterned mask 1801 act as a combined mask to prevent (or at least reduce) dopants from implanting into channel regions of the exposed fins 1501. Thus, the LDD regions 1809 may be formed substantially in source/drain regions of the exposed fins 1501. The mask then is removed using a suitable removal method. In some embodiments when the mask comprises a photoresist, the mask may be removed using, for example, an ashing process followed by a wet clean process. After the implantation process, an annealing process may be performed to activate the implanted impurities. Subsequently, a second mask (not shown), such as a photoresist, is formed over the PMOS region 205, while exposing the NMOS region 207, and n-type impurities are implanted into the exposed fins 1503 to form the LDD regions 1811 in the NMOS region 207. During the implantation of the LDD regions 1811, the gates 1807 and the patterned mask 1803 act as a combined mask to prevent (or at least reduce) dopants from implanting into channel regions of the exposed fins 1503. Thus, the LDD regions 1811 are formed substantially in source/drain regions of the exposed fins 1503. The second mask then is removed using a suitable removal method. In some embodiments when the second mask comprises a photoresist, the second mask may be removed using, for example, an ashing process followed by a wet clean process. The n-type impurities may be any of the n-type impurities discussed above with reference to FIG. 3A. After the implantation process, an annealing process may be performed to activate the implanted impurities.

Figure 19A:
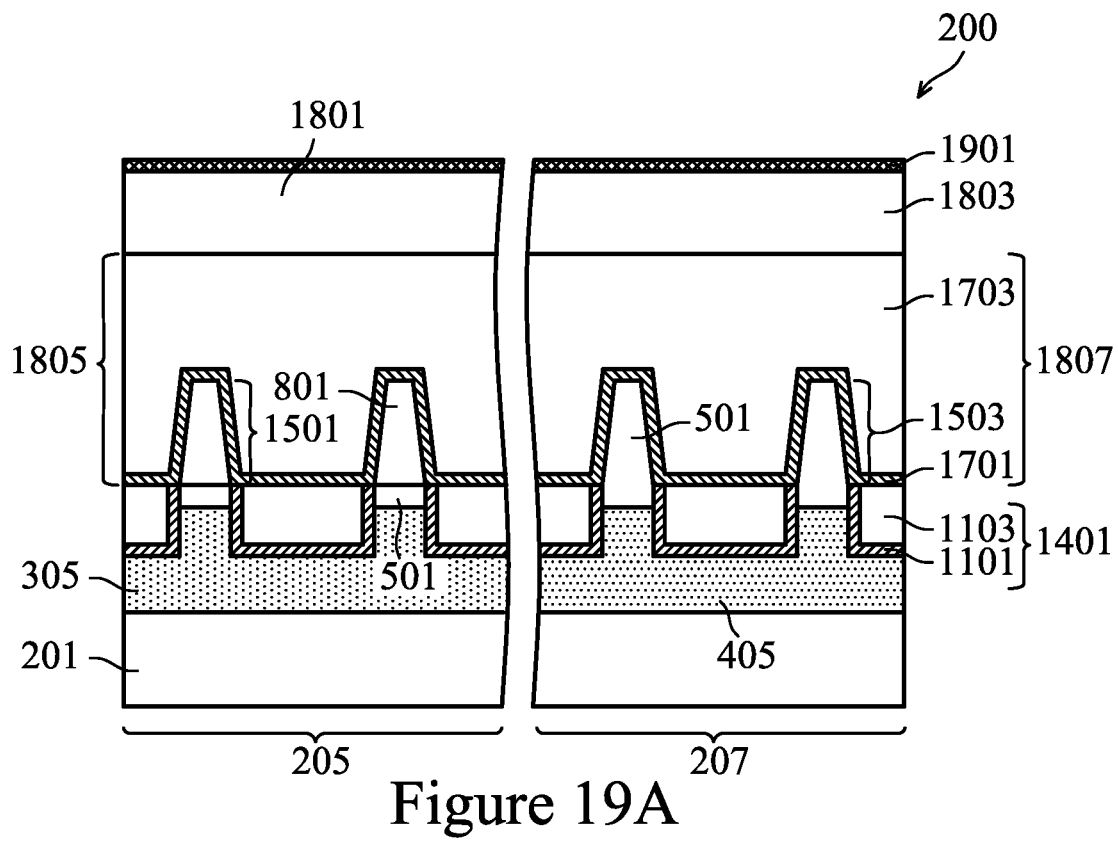
FIGS. 19A, 19B and 19C are cross-sectional views of an intermediate stage in the manufacture of a FinFET device in accordance with some embodiments.
Figure 19B:
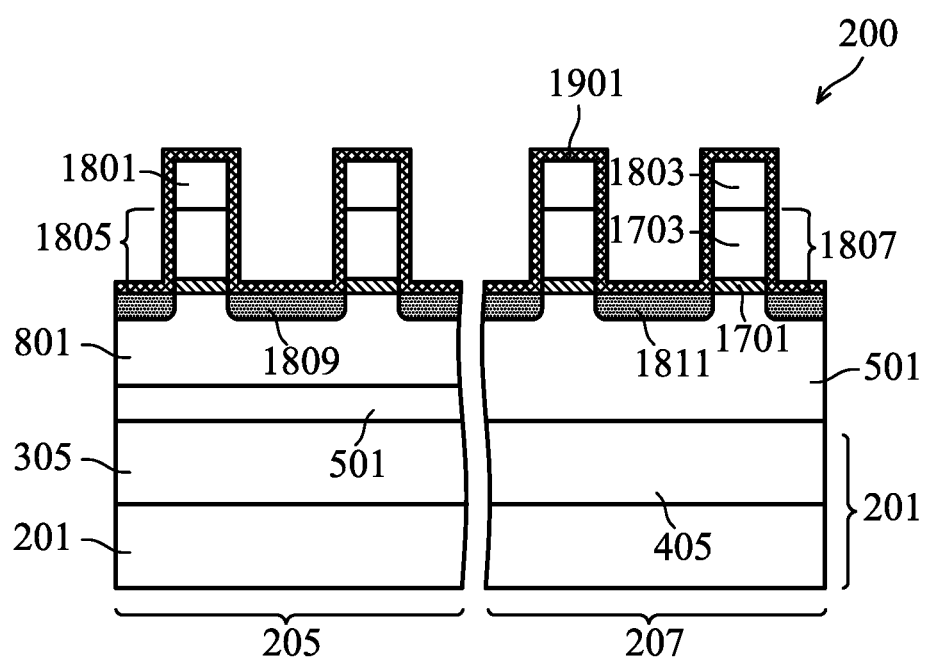
Figure 19C:
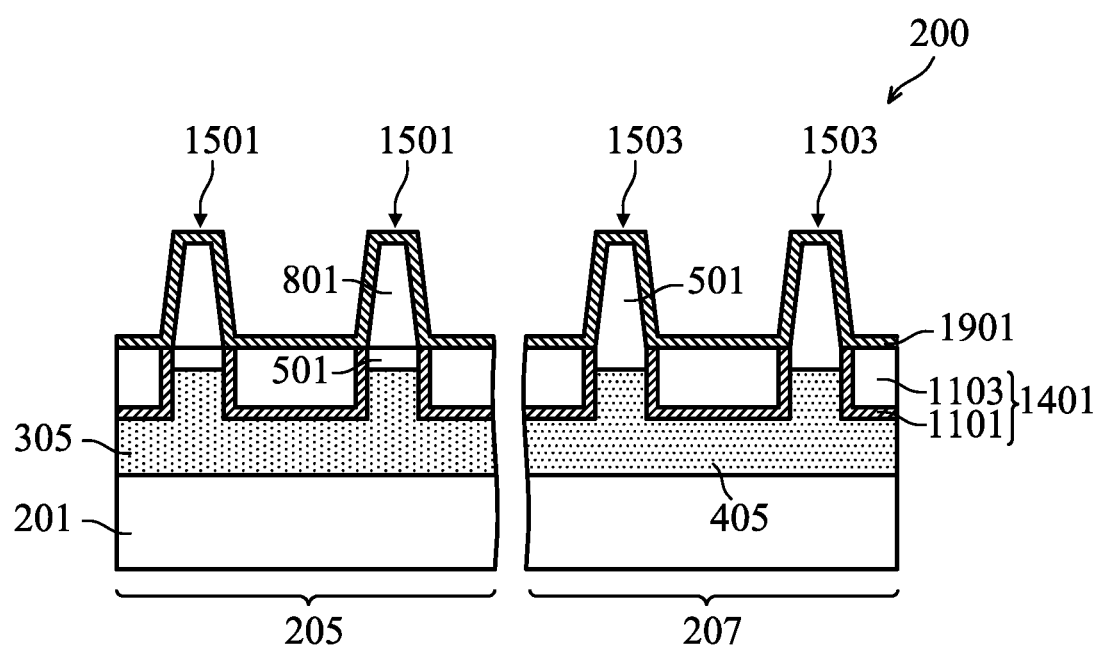

FIGS. 19A-19C and 20A-20C illustrate the formation of spacers 2001 on sidewalls of the gates 1805 in accordance with some embodiments. Referring first to FIGS. 19A-19C, a dielectric layer 1901 is blanket formed on exposed surfaces of the gates 1805 and 1807, the patterned masks 1801 and 1803, the fins 1501 and 1503, and the STI regions 1401. In some embodiments, the dielectric layer 1901 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like.

Figure 20A:
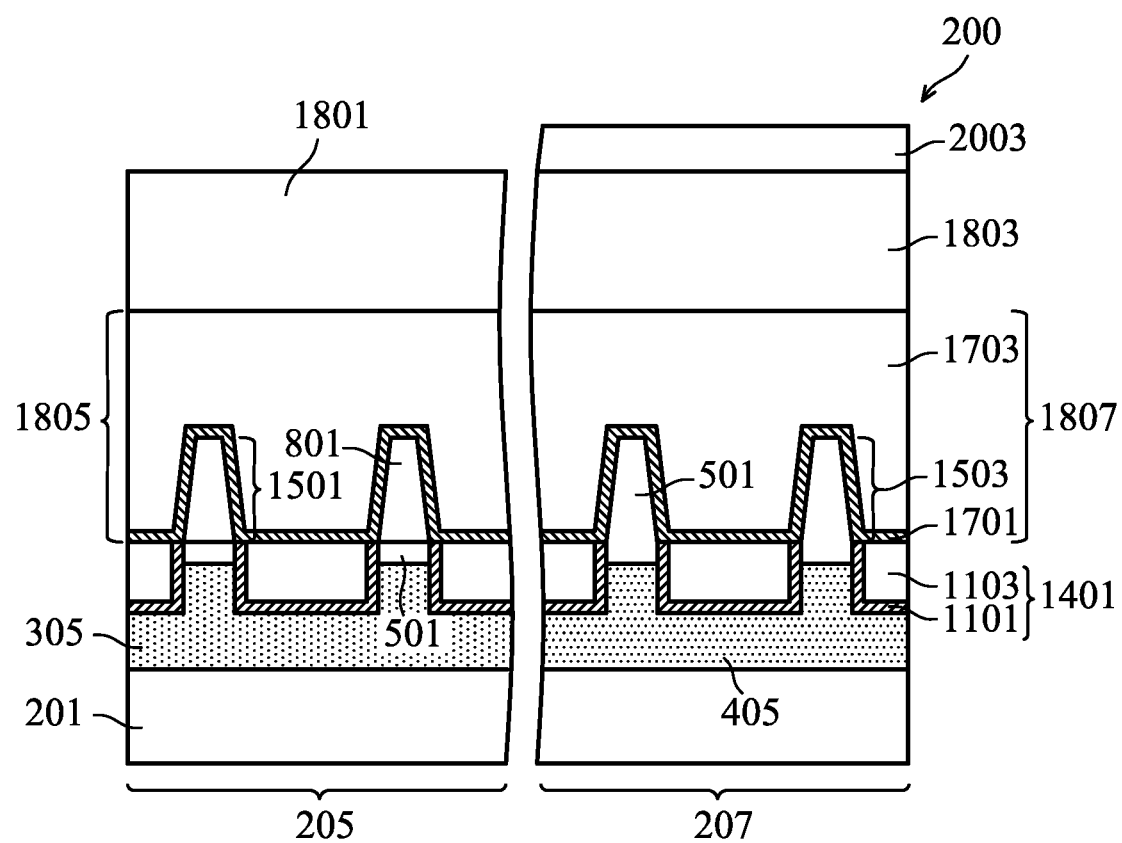
FIGS. 20A, 20B and 20C are cross-sectional views of an intermediate stage in the manufacture of a FinFET device in accordance with some embodiments.
Figure 20B:
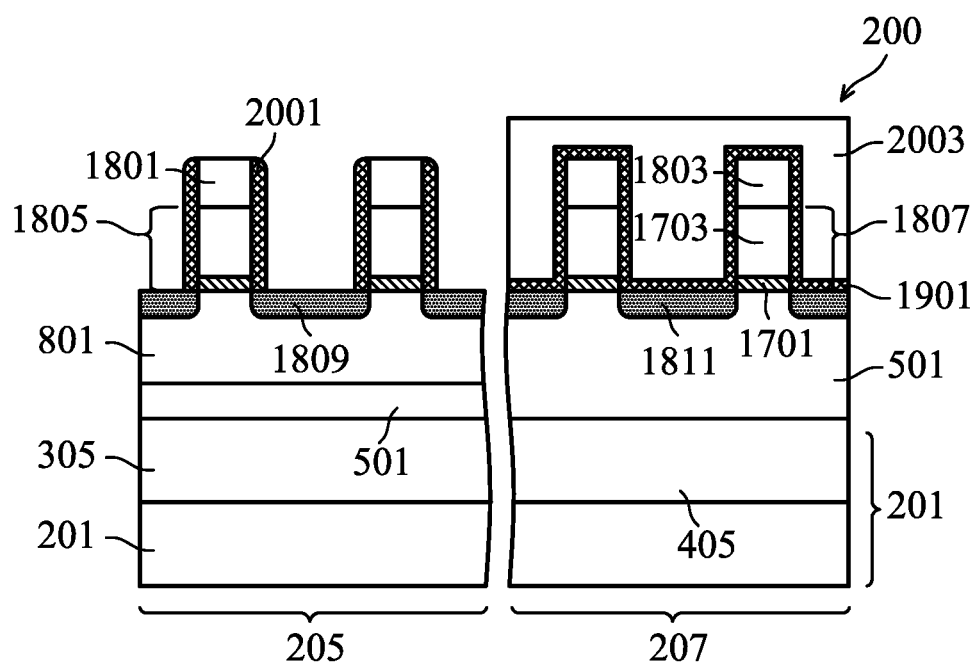
Figure 20C:
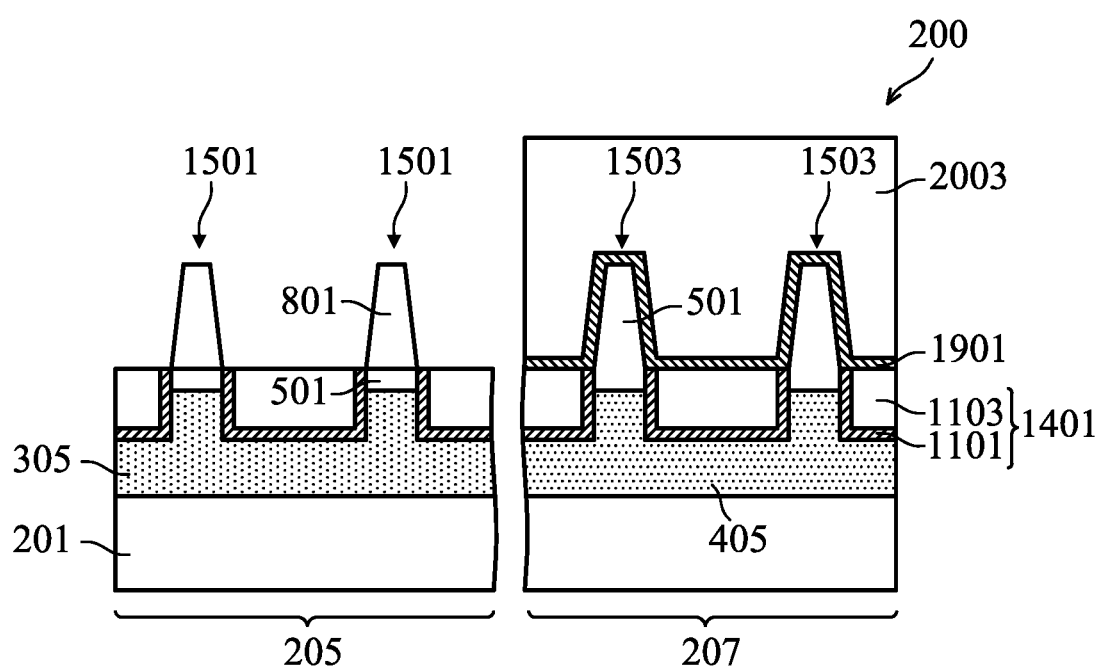

Referring to FIGS. 20A-20C, a patterning process is performed to remove excess portions of the dielectric layer 1901 in the PMOS region 205 to form the spacers 2001 on the sidewalls of the gates 1805. In some embodiments, a mask 2003 is formed over the dielectric layer 1901 in the NMOS region 207 while exposing the PMOS region 205. In some embodiments, the mask 2003 may comprise, for example, a photoresist, or the like, and may be formed using spin-on coating, or the like. Subsequently, an etch process is performed on the dielectric layer 1901 using the mask 2003 as an etch mask. The etch process may be anisotropic. The etch process removes lateral portions of the dielectric layer 1901, such that remaining vertical portions of the dielectric layer 1901 form the spacers 2001 on the sidewalls of the gates 1805. In the illustrated embodiment, the etch process completely removes the dielectric layer 1901 from the fins 1501. In other embodiments, portions of the dielectric layer 1901 remain on the sidewalls of the fins 1501 and form spacers (not shown) on the sidewalls of the fins 1501.

Figure 21A:
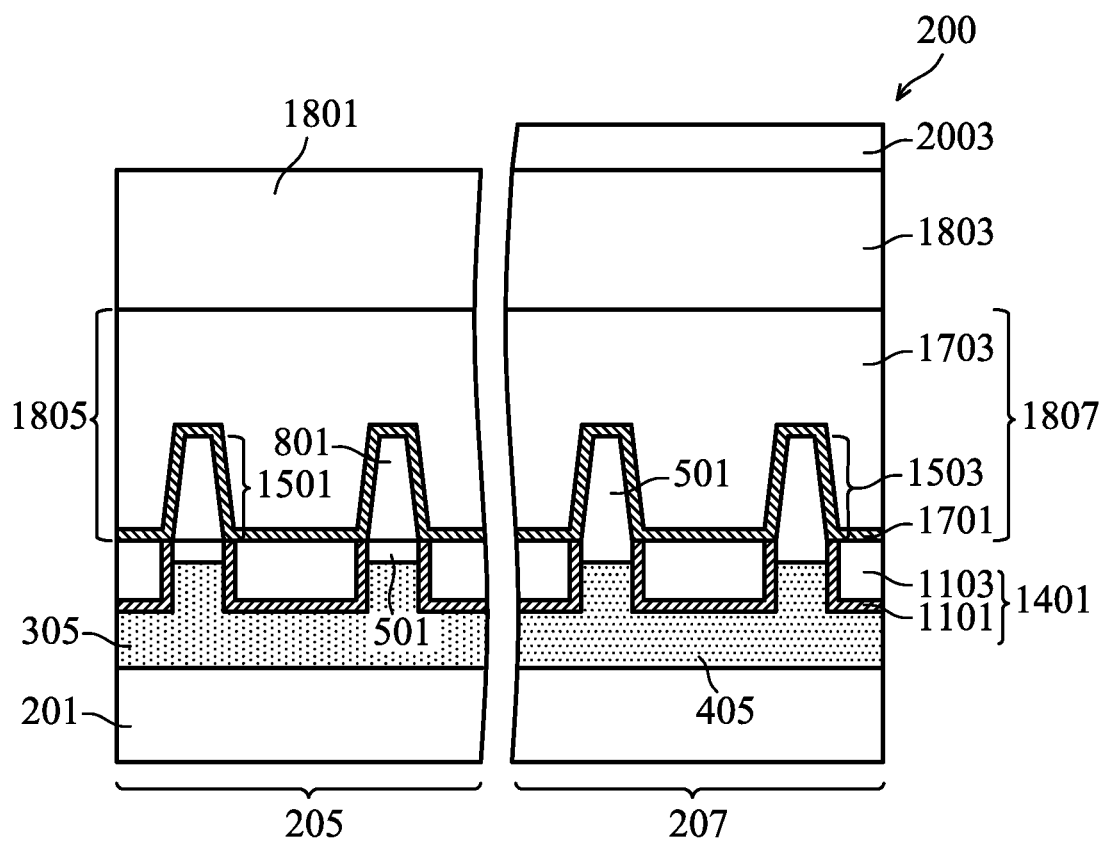
FIGS. 21A, 21B and 21C are cross-sectional views of an intermediate stage in the manufacture of a FinFET device in accordance with some embodiments.
Figure 21B:
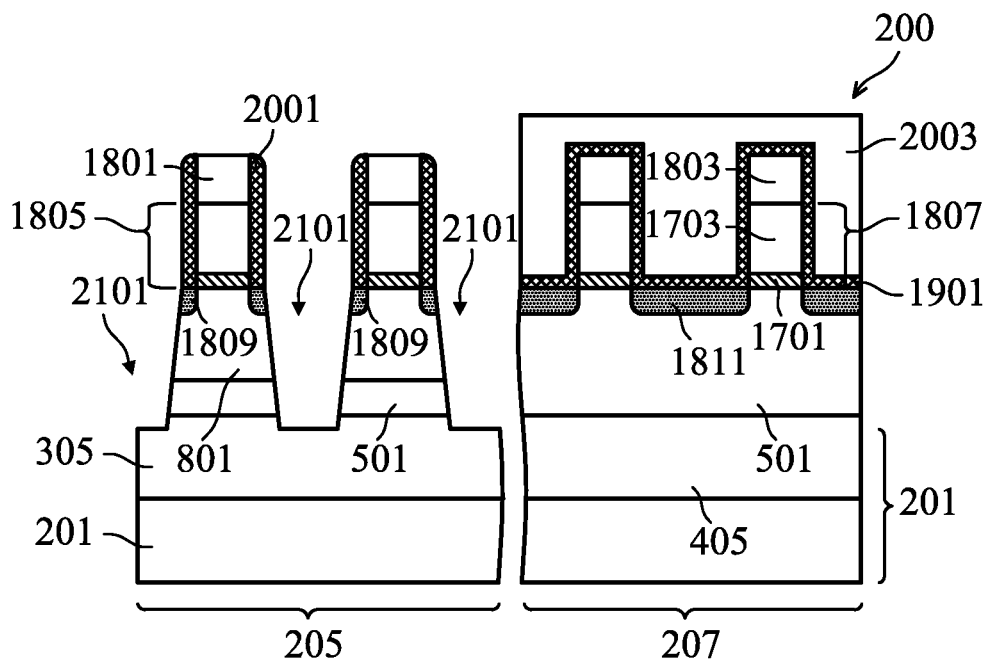
Figure 21C:
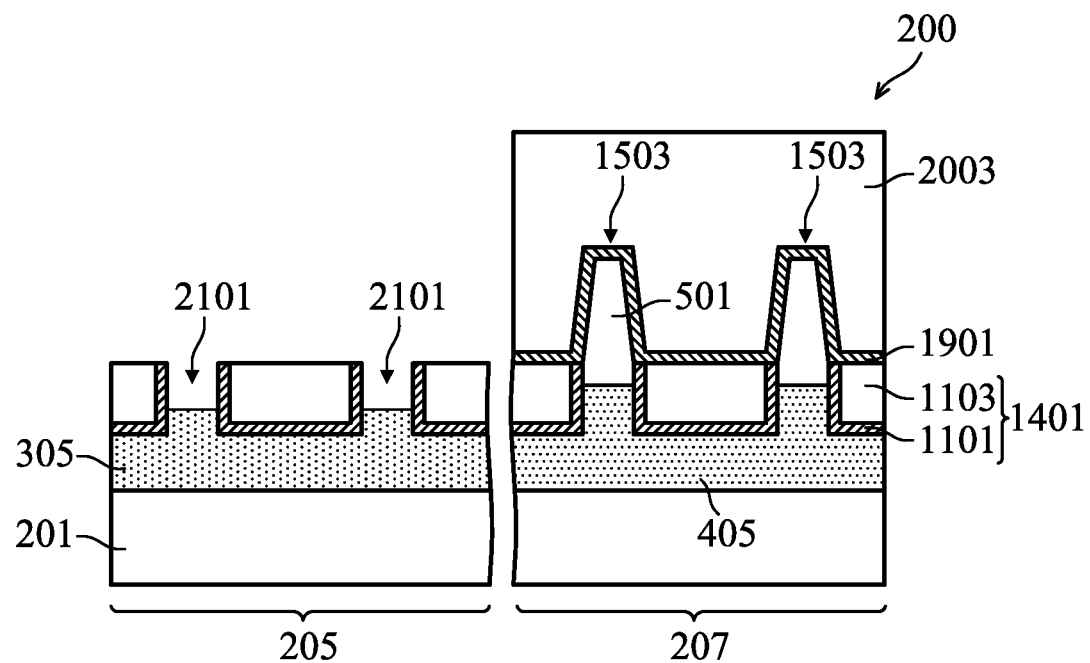

FIGS. 21A-21C and 22A-22C illustrate the formation of epitaxial source/drain regions 2201 in the PMOS region 205. Referring to FIGS. 21A-21C, after forming the spacers 2001, a patterning process is performed on the fins 1501 in the PMOS region 205 to form recesses 2101 in the source/drain regions of the fins 1501, while the NMOS region 207 is protected by the mask 2003. In some embodiments, the patterning process may include a suitable anisotropic dry etch process, while using the patterned mask 1801, the gates 1805, the spacers 2001, the mask 2003, and/or the STI regions 1401 as a combined mask. The suitable anisotropic dry etch process may include a reactive ion etch (RIE), a neutral beam etch (NBE), a combination thereof, or the like.

Figure 22A:
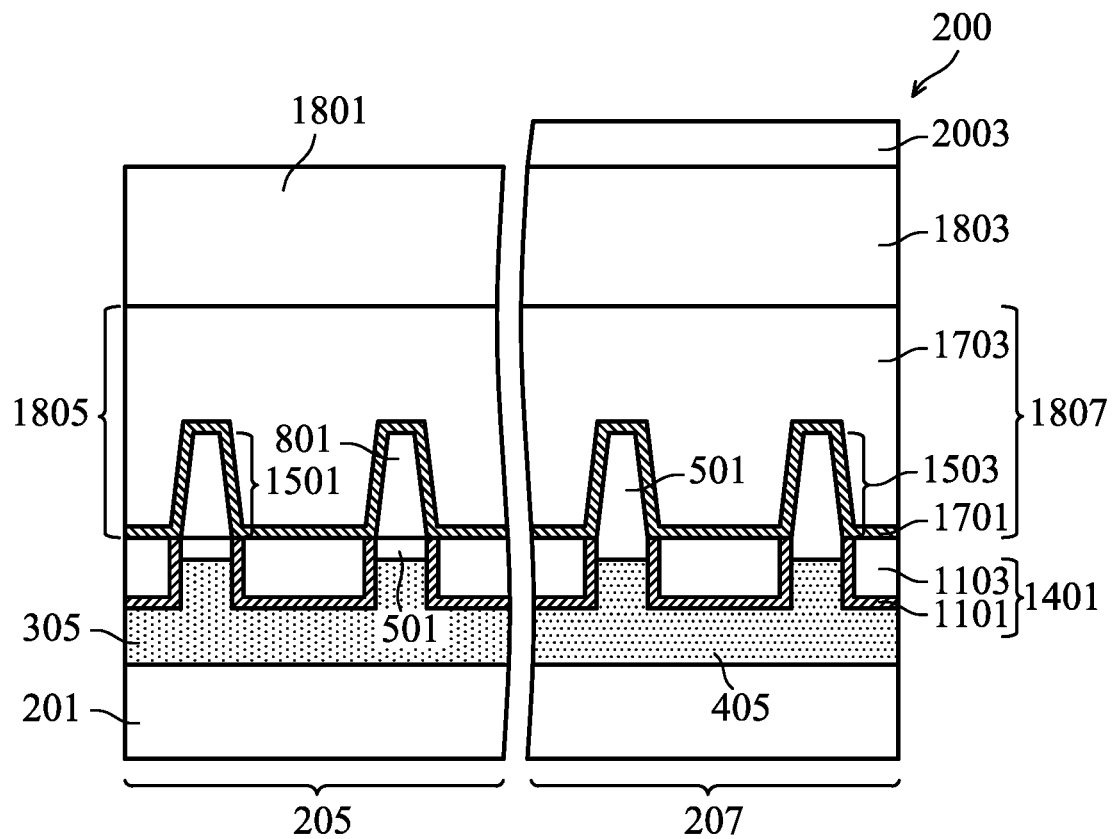
FIGS. 22A, 22B and 22C are cross-sectional views of an intermediate stage in the manufacture of a FinFET device in accordance with some embodiments.
Figure 22B:
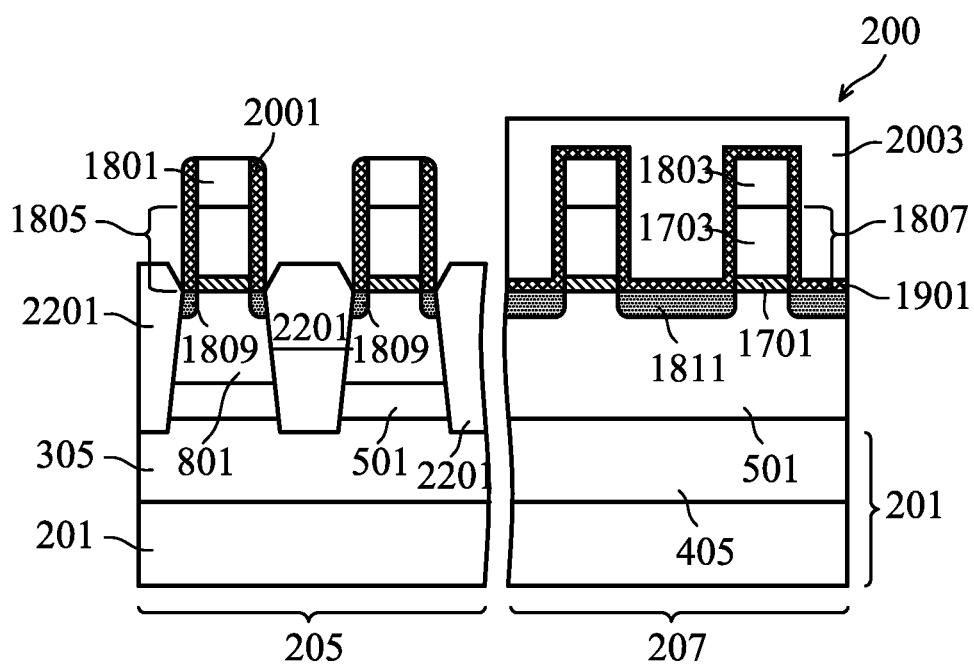
Figure 22C:
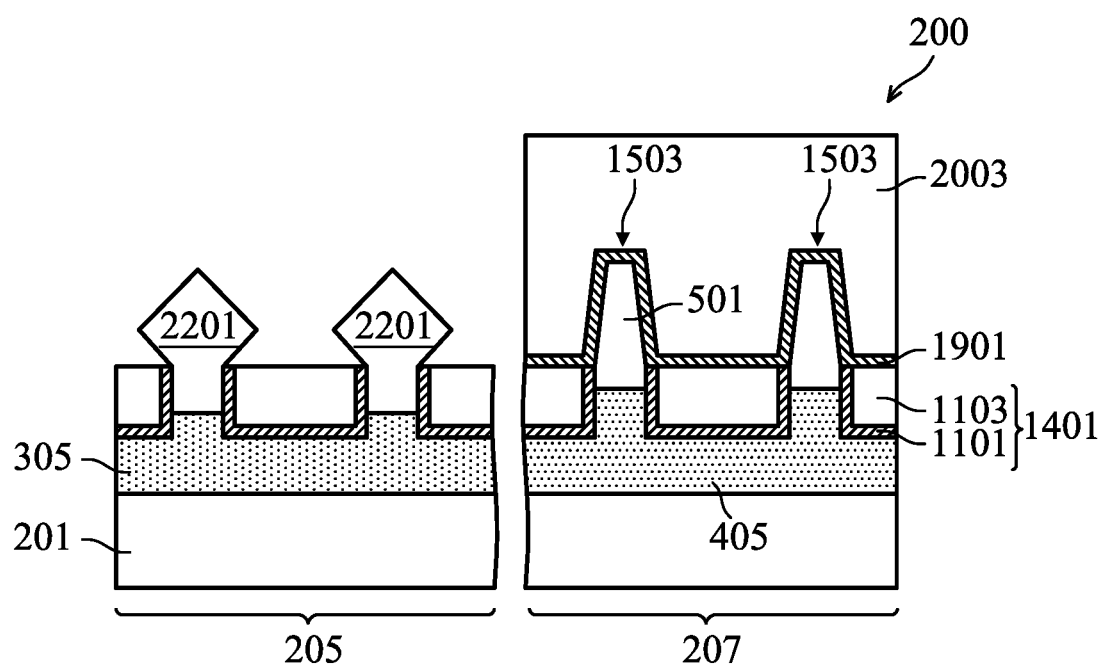

Referring to FIGS. 22A, 22B, and 22C, epitaxial source/drain regions 2201 are formed in the recesses 2101 (see FIGS. 21A, 21B, and 21C). In some embodiments, the epitaxial source/drain regions 2201 are epitaxially grown in the recesses 2101 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiment where the fins 1501 comprise SiGe, the epitaxial source/drain regions 2201 may include SiGe:B, or the like. The epitaxial source/drain regions 2201 may have surfaces raised from respective surfaces of the fins 1501 and may have facets. In some embodiments, the epitaxial source/drain regions 2201 may extend below the fins 1501. In some embodiments, the material of the epitaxial source/drain regions 2201 may be implanted with suitable dopants, such as p-type dopants. In some embodiments, the implantation process is similar to the process used for forming the well 405 as described above with reference to FIG. 4A and the description is not repeated herein. In other embodiments, the material of the epitaxial source/drain regions 2201 may be in situ doped during growth. After forming the epitaxial source/drain regions 2201, the mask 2003 is removed using a suitable mask removal process. In some embodiments where the mask 2003 comprises the photoresist, the mask 2003 may be removed using an ashing process followed by a wet clean process, or other suitable photoresist removal processes.

Figure 23C:
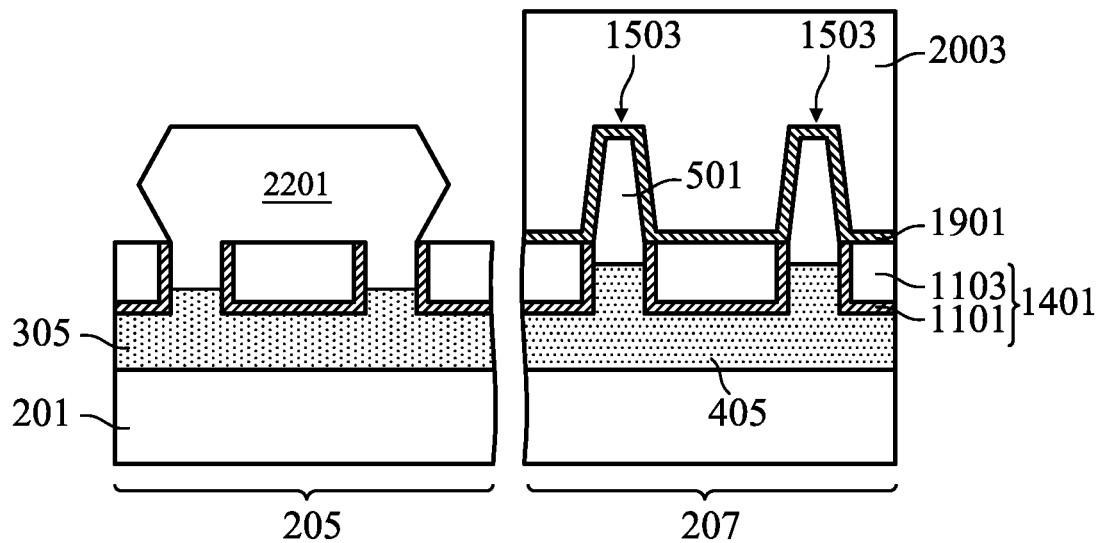
FIG. 23C is a cross-sectional view of an intermediate stage in the manufacture of a FinFET device in accordance with some embodiments.

Referring further to FIGS. 22A, 22B, and 22C, in the illustrated embodiment, each of the epitaxial source/drain regions 2201 are physically separated from other epitaxial source/drain regions 2201. In other embodiments, adjacent epitaxial source/drain regions 2201 may be merged. Such embodiment is depicted in FIG. 23C, where adjacent epitaxial source/drain regions 2201 are merged to form a common epitaxial source/drain region 2201.

Figure 24A:
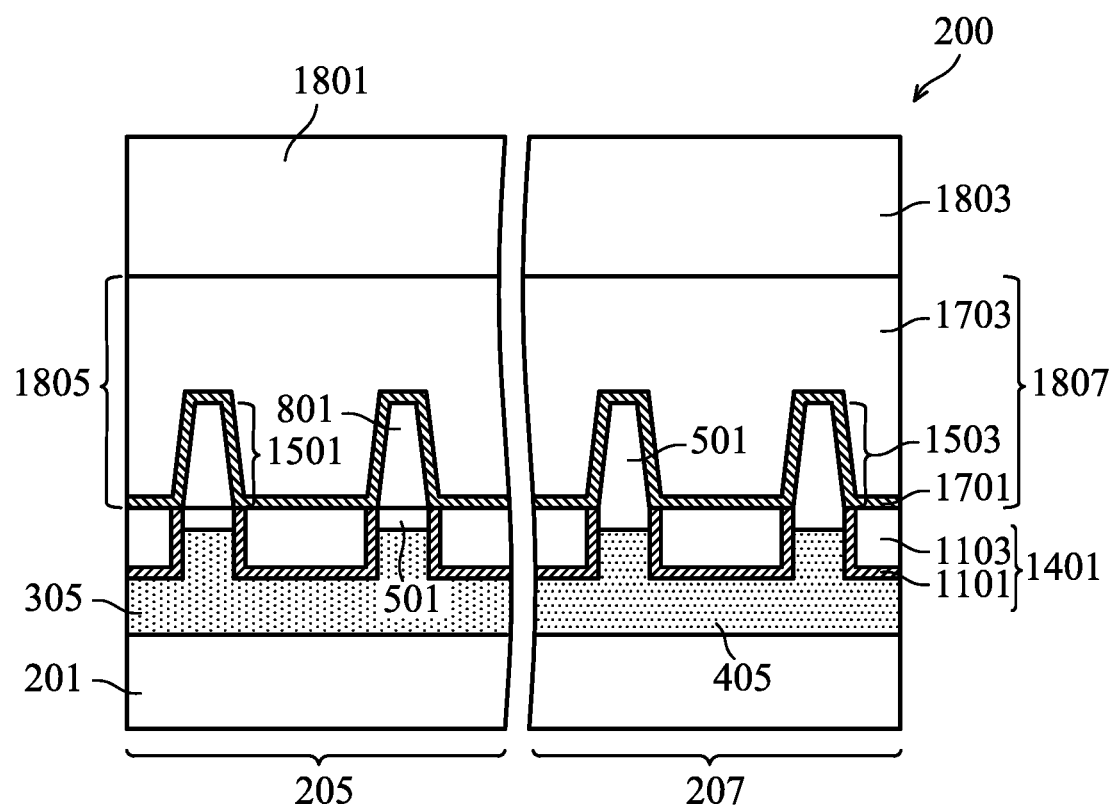
FIGS. 24A, 24B and 24C are cross-sectional views of an intermediate stage in the manufacture of a FinFET device in accordance with some embodiments.
Figure 24B:
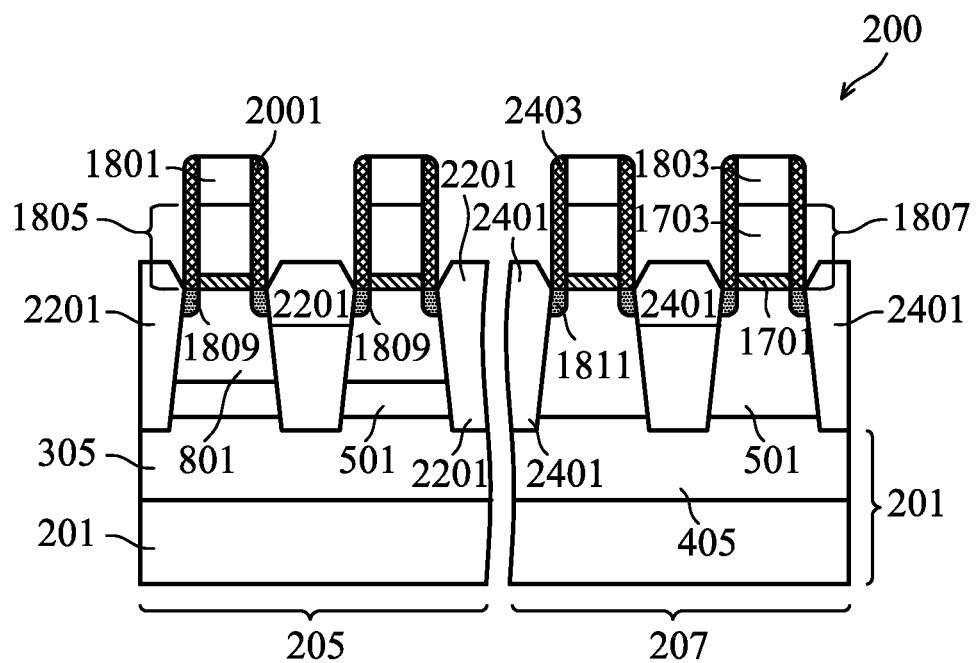
Figure 24C:
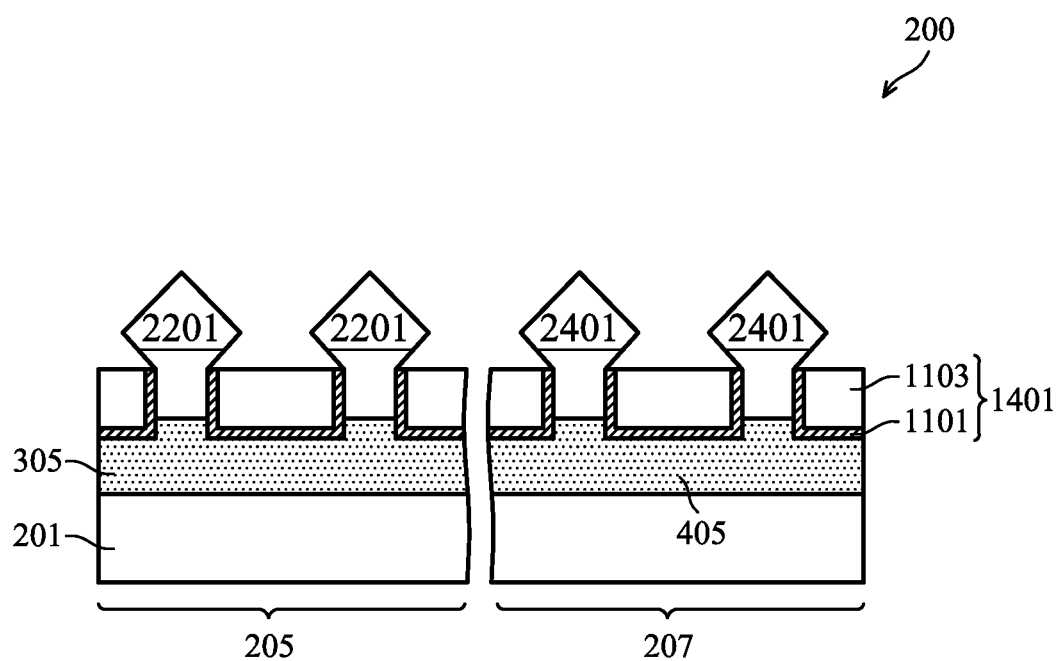

Referring to FIGS. 24A, 24B, and 24C, after forming the epitaxial source/drain regions 2201 in the PMOS region 205, the epitaxial source/drain regions 2401 are formed in the NMOS region 207. In some embodiments, the epitaxial source/drain regions 2401 are formed in the NMOS region 207 using similar methods as the epitaxial source/drain regions 2201 described above with reference to FIGS. 21A, 21B, 21C, 22A, 22B, and 22C and the description is not repeated herein. In some embodiments, during the formation of the epitaxial source/drain regions 2401 in the NMOS region 207, the PMOS region 205 is protected by a mask (not shown). In some embodiments, the dielectric layer 1901 in the NMOS region 207 is patterned to form spacers 2403 along sidewalls of the gates 1807. The dielectric layer 1901 in the NMOS region 207 may be patterned using similar methods as the dielectric layer 1901 in the PMOS region 205 described above with reference to FIGS. 20A, 20B, and 20C, and the description is not repeated herein. Subsequently, the source/drain regions of the fins 1503 in the NMOS region 207 are etched to form recesses (shown as filled with the epitaxial source/drain regions 2401 in FIGS. 24B and 24C) similar to the recesses 2101 (see FIGS. 21B and 21C). The recesses in the source/drain regions of the fins 1503 may be formed using similar method as the recesses 2101 described above with reference to FIGS. 21A, 21B, and 21C, and the description is not repeated herein.

Referring further to FIGS. 24A, 24B, and 24C, the epitaxial source/drain regions 2401 are epitaxially grown in the recesses in the NMOS region 207 using MOCVD, MBE, LPE, VPE, SEG, a combination thereof, or the like. In some embodiments where the fins 1503 are formed of silicon, the epitaxial source/drain regions 2401 may include silicon, SiC, SiC:P, Si:P, SiAs:P, or the like. In some embodiments, the material of the epitaxial source/drain regions 2401 may be implanted with suitable dopants, such as n-type dopants. In some embodiments, the implantation process is similar to the process used for forming the well 305 as described above with reference to FIG. 3A and the description is not repeated herein. In other embodiments, the material of the epitaxial source/drain regions 2401 may be in situ doped during growth. After forming the epitaxial source/drain regions 2401, the mask protecting the PMOS region 205 is removed using a suitable mask removal process. In some embodiments where the mask comprises the photoresist, the mask may be removed using an ashing process followed by a wet clean process, or other suitable photoresist removal processes. In some embodiments, the epitaxial source/drain regions 2201 in the PMOS region 205 are formed before forming the epitaxial source/drain regions 2401 in the NMOS region 207. In other embodiments, the epitaxial source/drain regions 2401 in the NMOS region 207 are formed before forming the epitaxial source/drain regions 2201 in the PMOS region 205. In the illustrated embodiment, each of the epitaxial source/drain regions 2401 are physically separated from other epitaxial source/drain regions 2401. In other embodiments, adjacent epitaxial source/drain regions 2401 may be merged similar to the common epitaxial source/drain region 2201 illustrated in FIG. 23C.

Figure 25A:
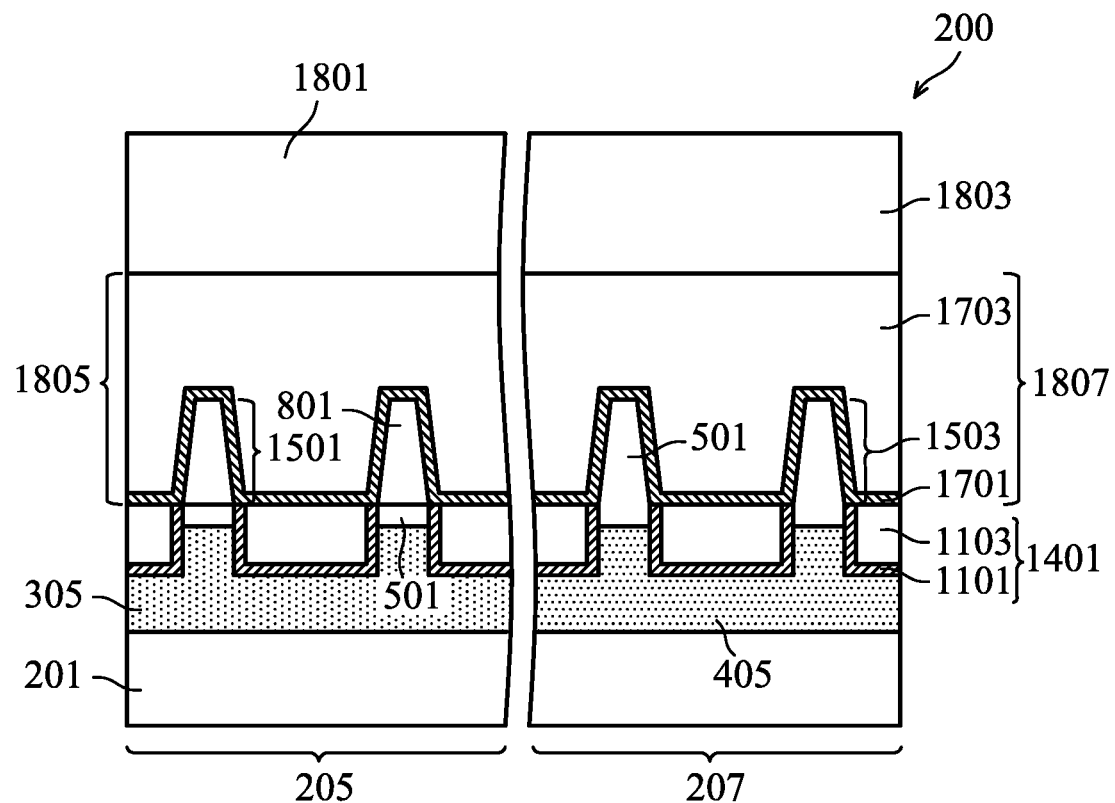
FIGS. 25A, 25B and 25C are cross-sectional views of an intermediate stage in the manufacture of a FinFET device in accordance with some embodiments.
Figure 25B:
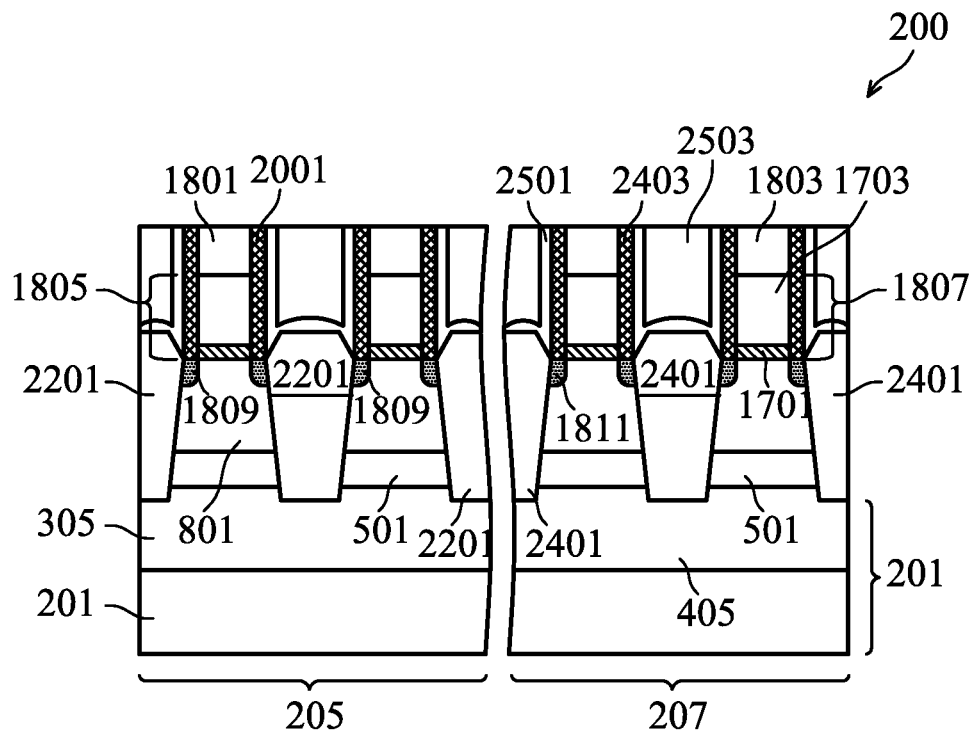
Figure 25C:
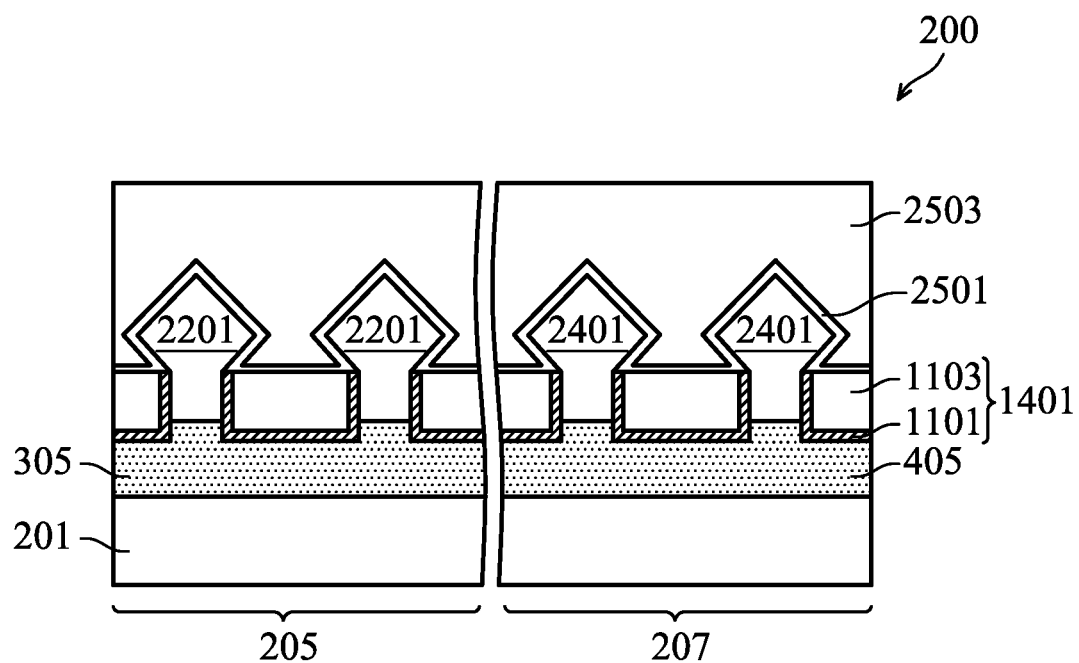

Referring to FIGS. 25A, 25B, and 25C, an etch stop layer (ESL) 2501 and an interlayer dielectric (ILD) 2503 are deposited over the gates 1805 and 1807, and over the epitaxial source/drain regions 2201 and 2401. In some embodiments, the ILD 2503 is a flowable film formed by a flowable CVD. In some embodiments, the ILD 2503 is formed of a dielectric material such as silicon oxide, SiOC, $ZrO_2$, $HfO_2$, Phospho-Silicate Glass (PSG), Boro-Silicate Glass (BSG), Boron-Doped Phospho-Silicate Glass (BPSG), undoped Silicate Glass (USG), low-k dielectric materials, extremely low-k dielectric materials, high-k dielectric materials, a combination thereof, or the like, and may be deposited by any suitable method, such as CVD, PECVD, a spin-on-glass process, a combination thereof, or the like. In some embodiments, the ESL 2501 is used as a stop layer while patterning the ILD 2503 to form openings for subsequently formed contact plugs. Accordingly, a material for the ESL 2501 may be chosen such that the material of the ESL 2501 has a lower etch rate than the material of the ILD 2503. In some embodiments, the ESL 2501 may comprise silicon nitride (SiN), silicon oxynitride (SiON), silicon oxycarbide (SiOC), silicon carbonitride (SiCN), silicon carboxynitride (SiOCN), a combination thereof, or the like, and may formed using CVD, ALD, a combination thereof, or the like. In some embodiments, a planarization process, such as a CMP process, may be performed to level the top surface of ILD 2503 with the top surfaces of the patterned masks 1801 and 1803. In other embodiments, the planarization may also remove the masks 1801 and 1803, or portions thereof, from the gates 1805 and 1807, respectively.

Figure 26A:
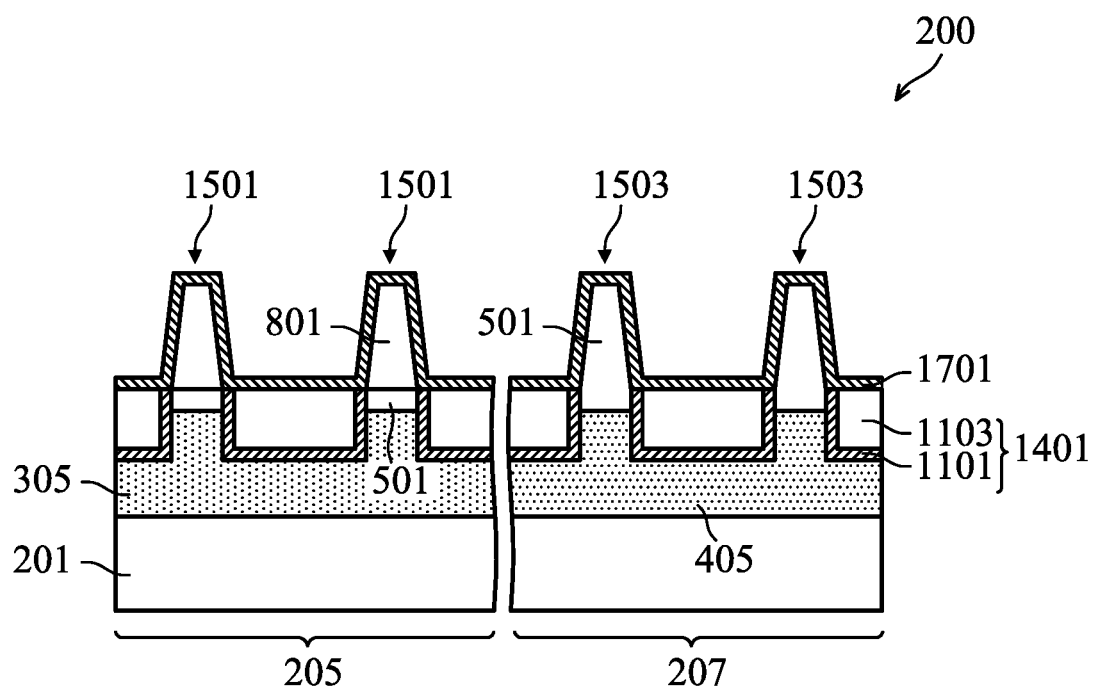
FIGS. 26A, 26B and 26C are cross-sectional views of an intermediate stage in the manufacture of a FinFET device in accordance with some embodiments.
Figure 26B:
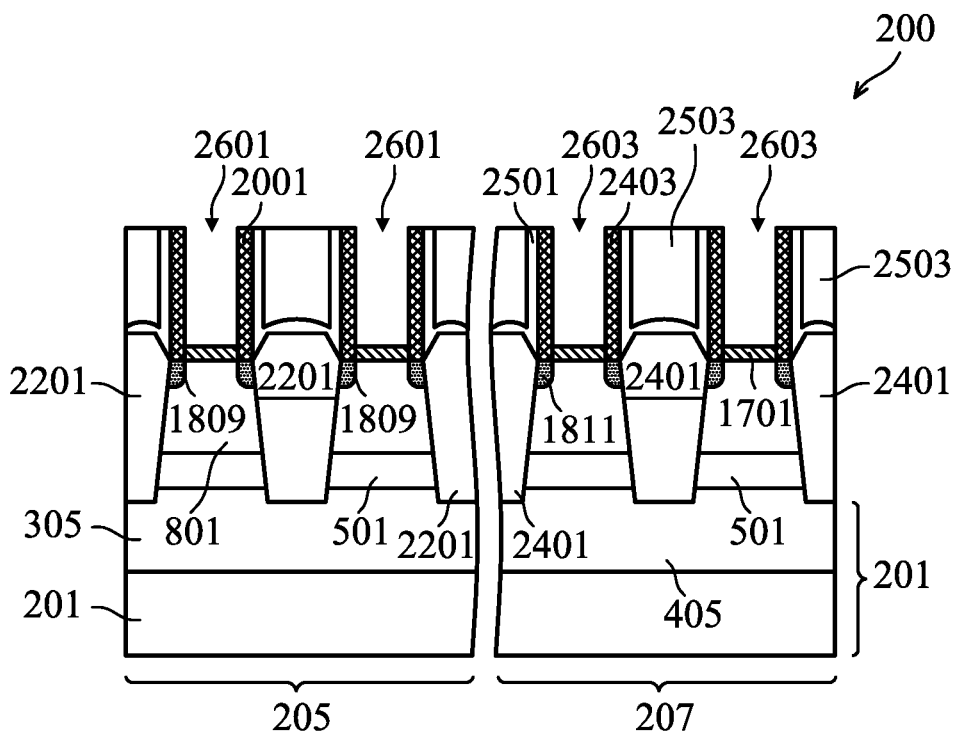
Figure 26C:
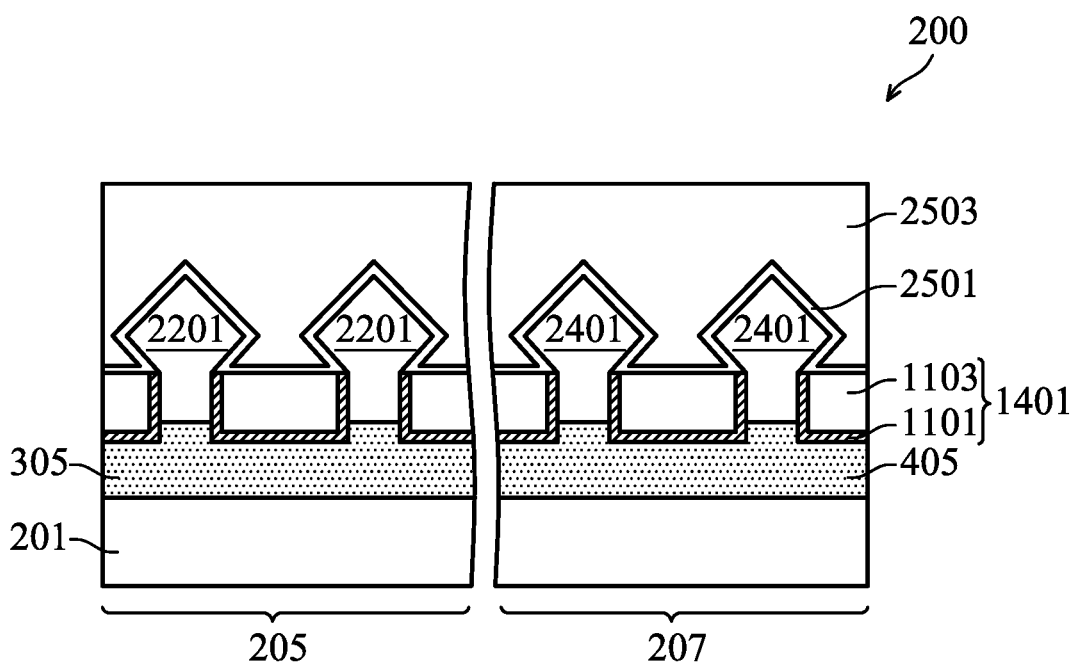

Referring to FIGS. 26A, 26B, and 26C, in some embodiments, the patterned masks 1801 and 1803, and the gate electrode layers 1703 of the gates 1805 and 1807 are removed using one or more suitable etching processes to form recesses 2601 in the PMOS region 205 and recesses 2603 in the NMOS region 207. Each of the recesses 2601 exposes a channel region of a respective fin 1501 in the PMOS region 205. Each of the recesses 2603 exposes a channel region of a respective fin 1503 in the NMOS region 207. In the illustrated embodiment, the dielectric layers 1701 remain over the channel regions of the fins 1501 and 1503. In other embodiments, the dielectric layers 1701 may also be removed during the formation of the recesses 2601 and 2603.

Figure 27A:
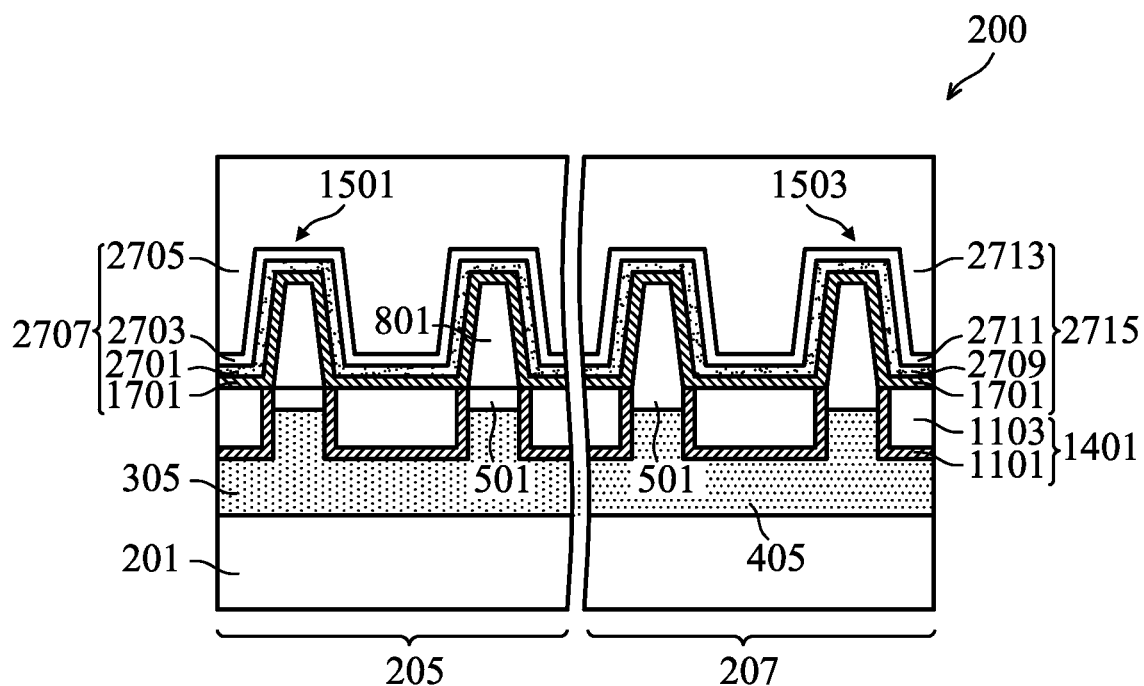
FIGS. 27A, 27B and 27C are cross-sectional views of an intermediate stage in the manufacture of a FinFET device in accordance with some embodiments.
Figure 27B:
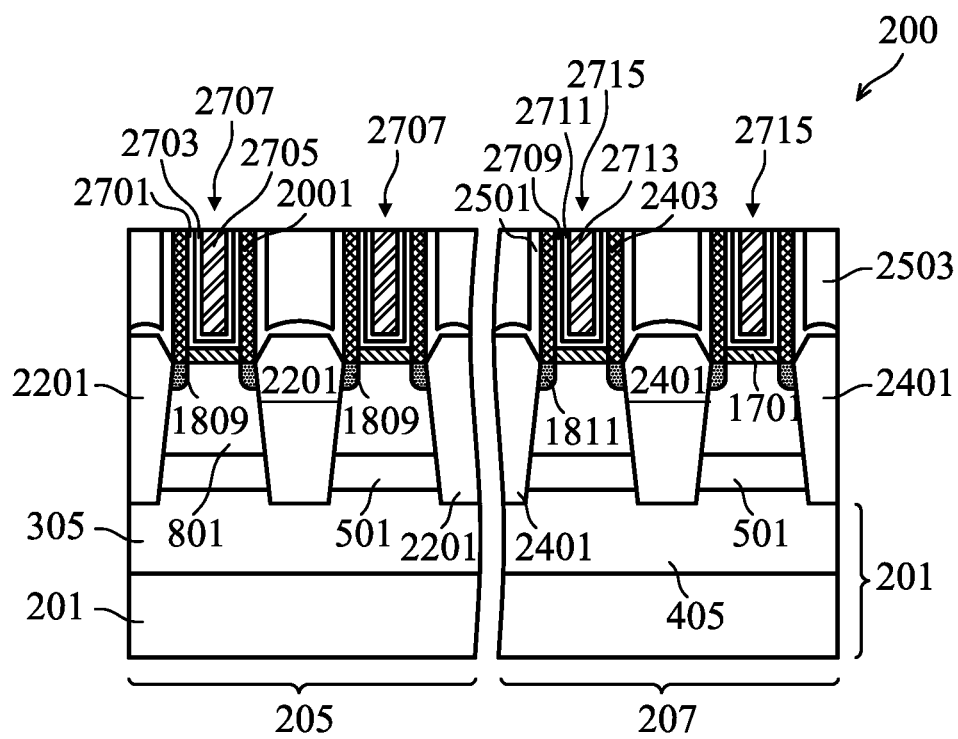
Figure 27C:
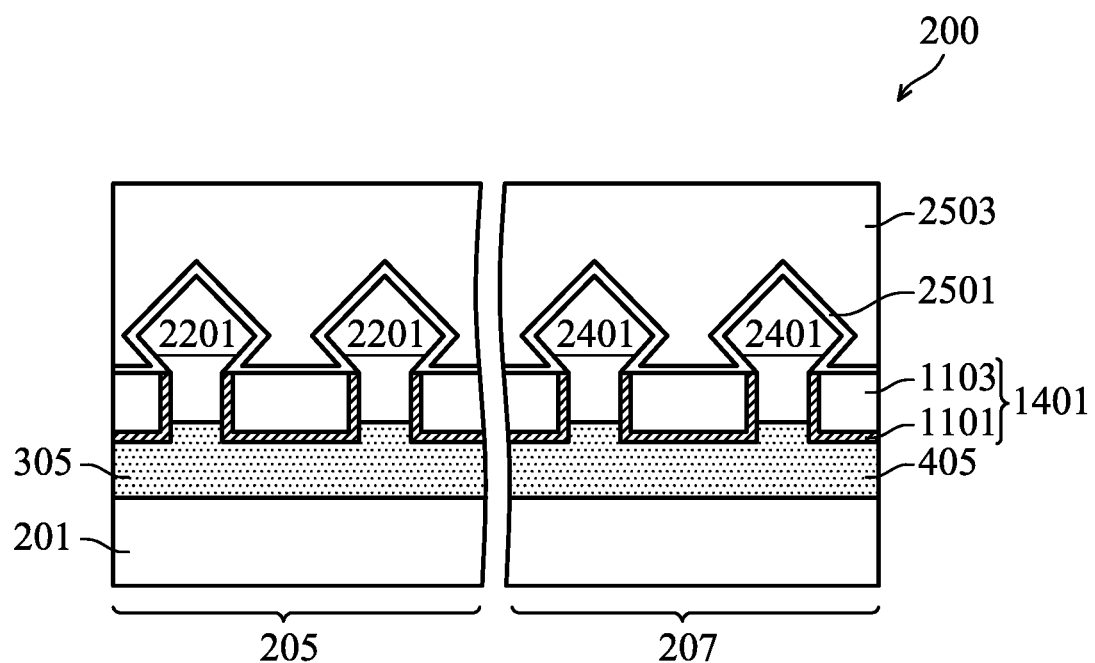

Referring further to FIGS. 27A, 27B, and 27C, a gate dielectric layer 2701, a work function layer 2703, and a gate electrode layer 2705 are formed in the recesses 2601 (see FIG. 26B) in the PMOS region 205 while the NMOS region is protected by a mask (not shown). In some embodiments, the gate dielectric layer 2701 is conformally deposited in the recesses 2601. In some embodiments, the gate dielectric layer 2701 comprises silicon oxide, silicon nitride, or multilayers thereof. In other embodiments, the gate dielectric layer 2701 includes a high-k dielectric material, and in these embodiments, the gate dielectric layer 2701 may have a k value greater than about 7.0, and may include a metal oxide or a silicate of Hf, Al, Zr, La, Mg, Ba, Ti, Pb, and combinations thereof. The formation methods of the gate dielectric layer 2701 may include Molecular-Beam Deposition (MBD), ALD, PECVD, a combination thereof, or the like.

In some embodiments where the dielectric layers 1701 are not removed over the channel regions of the fins 1501 while forming the recesses 2601, the dielectric layers 1701 may act as interfacial layers between the gate dielectric layer 2701 and the channel regions of the fins 1501. In some embodiments where the dielectric layers 1701 are removed over the channel regions of the fins 1501 while forming the recesses 2601, one or more interfacial layers may be formed over the channel regions of the fins 1501 prior to forming the gate dielectric layer 2701, and the gate dielectric layer 2701 is formed over the one or more interfacial layers. The interfacial layers help to buffer the subsequently formed high-k dielectric layer from the underlying semiconductor material. In some embodiments, the interfacial layers comprise a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for forming the interfacial layers.

After forming the gate dielectric layer 2701, the work function layer 2703 is formed over the gate dielectric layer.

In some embodiments, the work function layer 2703 comprises TiN, WN, TaN, Ru, Co, a combination thereof, or the like, and may be formed using ALD, CVD, PVD, combinations thereof, or the like. After forming the work function layer 2703, remaining portions of the recesses 2601 (see FIG. 26B) are filled with a gate electrode layer 2705. In some embodiments, the gate electrode layer 2705 comprises Co, Ru, Al, Ag, Au, W, Ni, Ti, Cu, Mn, Pd, Re, Ir, Pt, Zr, alloys thereof, combinations thereof, or the like, and may be formed using ALD, CVD, PVD, plating, combinations thereof, or the like. After filling the recesses 2601 with the gate electrode layer 2705, a planarization process, such as a CMP process, may be performed to remove the excess portions of the gate dielectric layer 2701, the work function layer 2703, and the gate electrode layer 2705, which excess portions are over the top surface of the ILD 2503. The portions of the gate dielectric layer 2701, the work function layer 2703, and the gate electrode layer 2705 remaining in the recesses 2601 in combination with respective dielectric layers 1701 form gates 2707 in the PMOS region 205. The gates 2707 may also be referred to as replacement gates.

Referring further to FIGS. 27A, 27B, and 27C, a gate dielectric layer 2709, a work function layer 2711, and a gate electrode layer 2713 are formed in the recesses 2603 (see FIG. 26B) in the NMOS region 207 while the PMOS region 205 is protected by a mask (not shown). In some embodiments, the gate dielectric layer 2709 is conformally deposited in the recesses 2603. In some embodiments, the gate dielectric layer 2709 may be formed using similar material and methods as the gate dielectric layer 2701 and the description is not repeated herein. In some embodiments where the dielectric layers 1701 are not removed over the channel regions of the fins 1503 while forming the recesses 2603, the dielectric layers 1701 may act as interfacial layers between the gate dielectric layer 2709 and the channel regions of the fins 1503. In some embodiments where the dielectric layers 1701 are removed over the channel regions of the fins 1503 while forming the recesses 2603, one or more interfacial layers may be formed over the channel regions of the fins 1503 prior to forming the gate dielectric layer 2709, and the gate dielectric layer 2709 is formed over the one or more interfacial layers.

After forming the gate dielectric layer 2709, the work function layer 2711 is formed over the gate dielectric layer. In some embodiments, the work function layer 2711 comprises Ti, Ag, Al, TiAl, TiAlN, TiAlC, TaC, TaCN, TaSiN, TaAlC, Mn, Zr, a combination thereof, or the like, and may be formed using ALD, CVD, PVD, combinations thereof, or the like. After forming the work function layer 2711, remaining portions of the recesses 2603 (see FIG. 26B) are filled with a gate electrode layer 2713. In some embodiments, the gate electrode layer 2713 may be formed using similar materials and methods as the gate electrode layer 2705 and the description is not repeated herein. After filling the recesses 2603 with the gate electrode layer 2713, a planarization process, such as a CMP process, may be performed to remove the excess portions of the gate dielectric layer 2709, the work function layer 2711, and the gate electrode layer 2713, which excess portions are over the top surface of the ILD 2503. The portions of the gate dielectric layer 2709, the work function layer 2711, and the gate electrode layer 2713 remaining in the recesses 2603 in combination with respective dielectric layers 1701 form gates 2715 in the NMOS region 207. The gates 2715 may also be referred to as replacement gates.

Referring further to FIGS. 27A, 27B, and 27C, in the illustrated embodiment, the gates 2707 are formed in the PMOS region 205 before forming the gates 2715 in the NMOS region 207. In other embodiments, the gates 2715 are formed in the NMOS region 207 before forming the gates 2707 in the PMOS region 205.

Figure 28A:
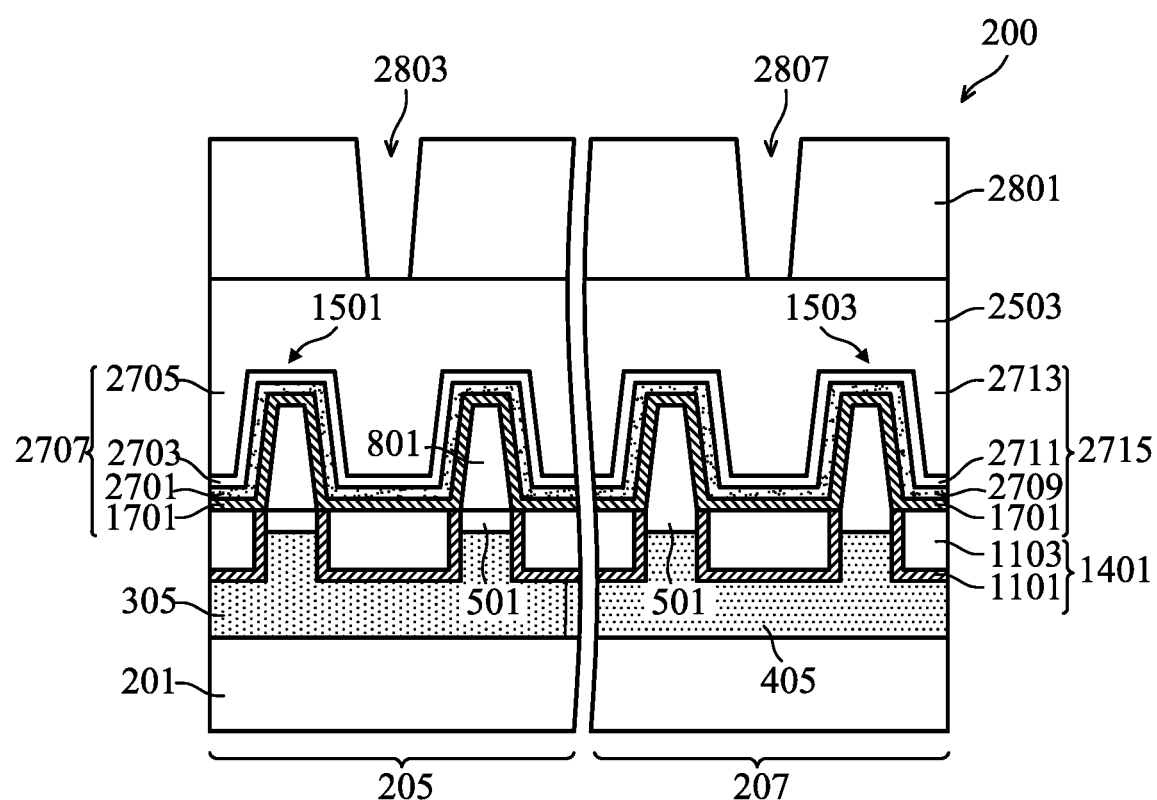
FIGS. 28A, 28B and 28C are cross-sectional views of an intermediate stage in the manufacture of a FinFET device in accordance with some embodiments.
Figure 28B:
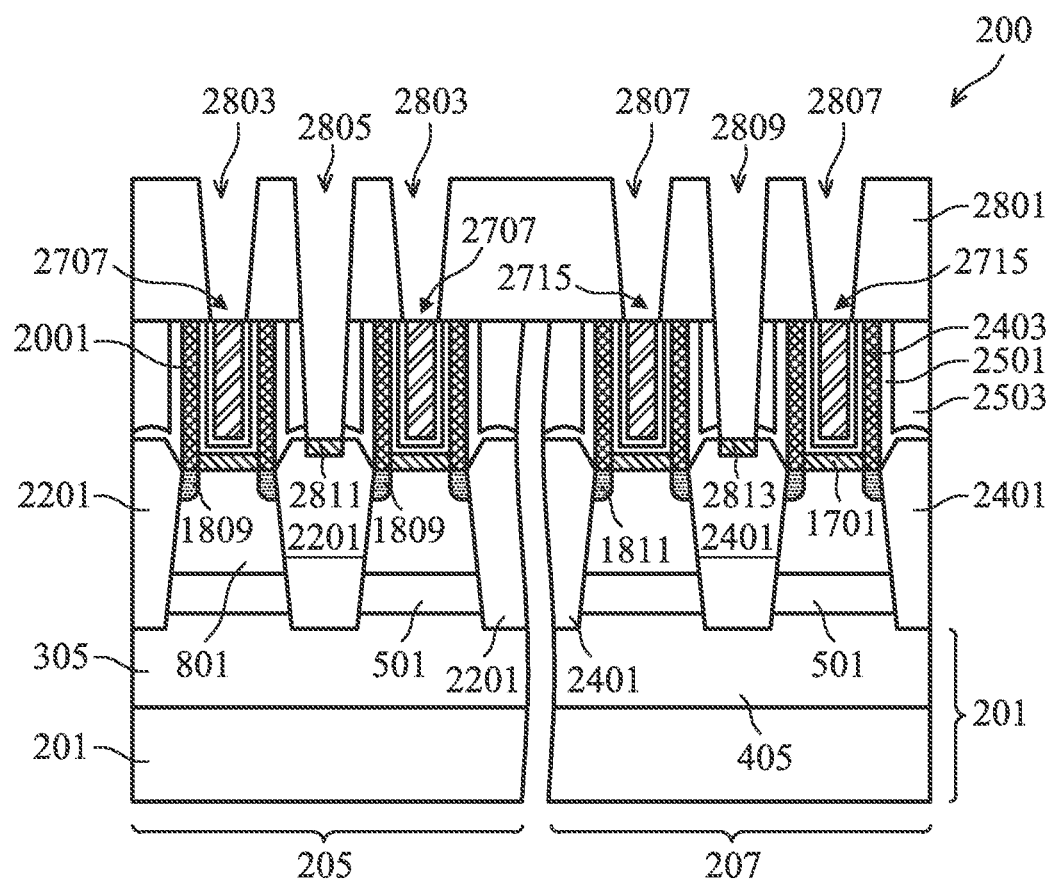
Figure 28C:
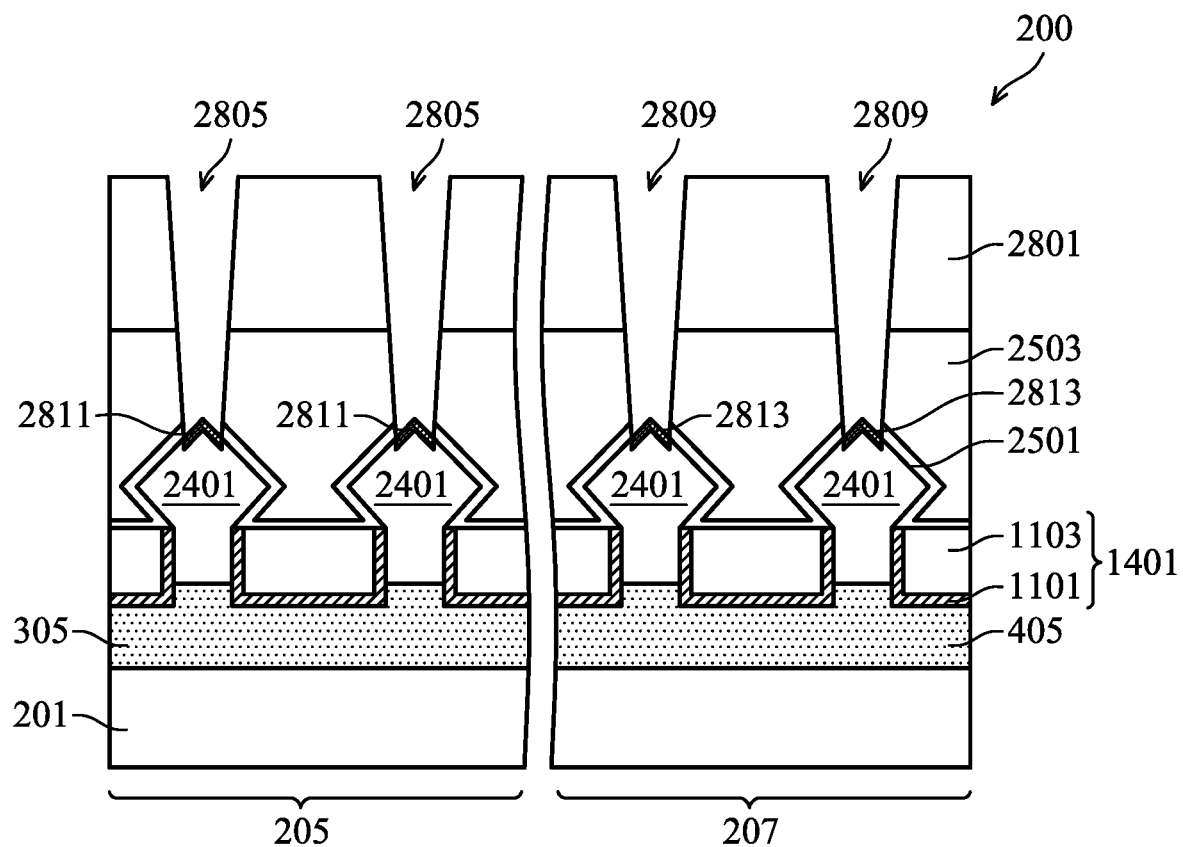

Referring to FIGS. 28A, 28B, and 28C, an ILD 2801 is deposited over the ILD 2503. In some embodiments, the ILD 2801 may be formed using similar materials and methods as the ILD 2503 described above with reference to FIGS. 25A, 25B and 25C, and the description is not repeated herein. In some embodiments, the ILD 2801 and the ILD 2503 are formed of a same material. In other embodiments, the ILD 2801 and the ILD 2503 are formed of different materials. The ESL 2501 and the ILDs 2503 and 2801 are patterned to form openings 2803 and 2805 in the PMOS region 205, and openings 2807 and 2809 in the NMOS region 207. In some embodiments, the ESL 2501 and the ILDs 2503 and 2801 may be patterned using acceptable photolithography and etching techniques. The openings 2803 expose the respective gates 2707 in the PMOS region 205. The openings 2805 expose the respective epitaxial source/drain regions 2201 in the PMOS region 205. The openings 2807 expose the respective gates 2715 in the NMOS region 207. The openings 2809 expose the respective epitaxial source/drain regions 2401 in the NMOS region 207. As described below in greater detail, the openings 2803, 2805, 2807, and 2809 are filled with one or more conductive materials to form contact plugs that provide electrical connections to the epitaxial source/drain regions 2201 and 2401, and the gates 2707 and 2715.

Referring further to FIGS. 28A, 28B, and 28C, self-aligned layers 2811 and 2813 are formed through the openings 2805 and 2809, respectively. In some embodiments, a metallic material is deposited in the openings 2805 and 2809. The metallic material may comprise Ti, Co, Ni, NiCo, Pt, NiPt, Ir, PtIr, Er, Yb, Pd, Rh, Nb, a combination thereof, or the like, and may be formed using PVD, sputtering, or the like. Subsequently, an annealing process is performed to form the self-aligned layers 2811 and 2813. In some embodiments, the annealing process causes the metallic material to react with semiconductor materials of the epitaxial source/drain regions 2201 and 2401 to form the self-aligned layers 2811 and 2813, respectively.

Figure 29A:
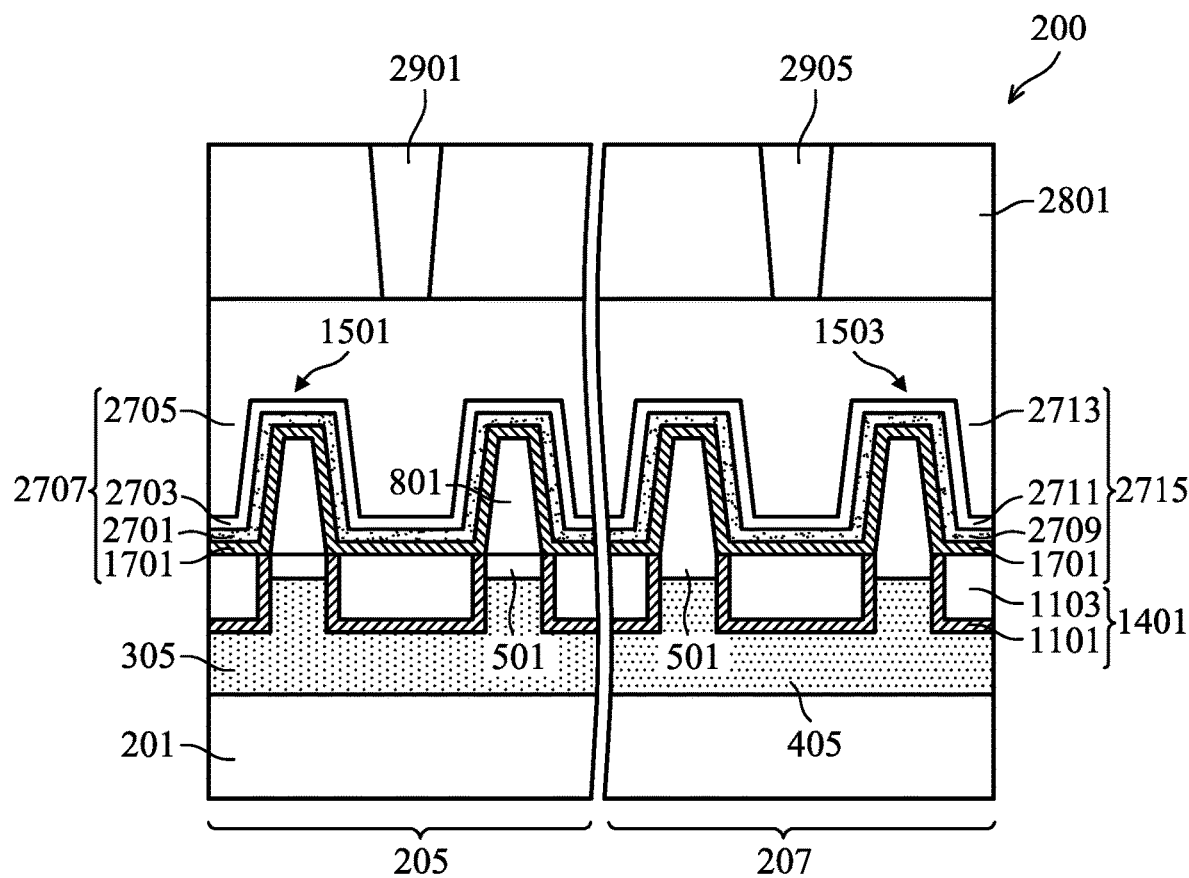
FIGS. 29A, 29B and 29C are cross-sectional views of an intermediate stage in the manufacture of a FinFET device in accordance with some embodiments.
Figure 29B:
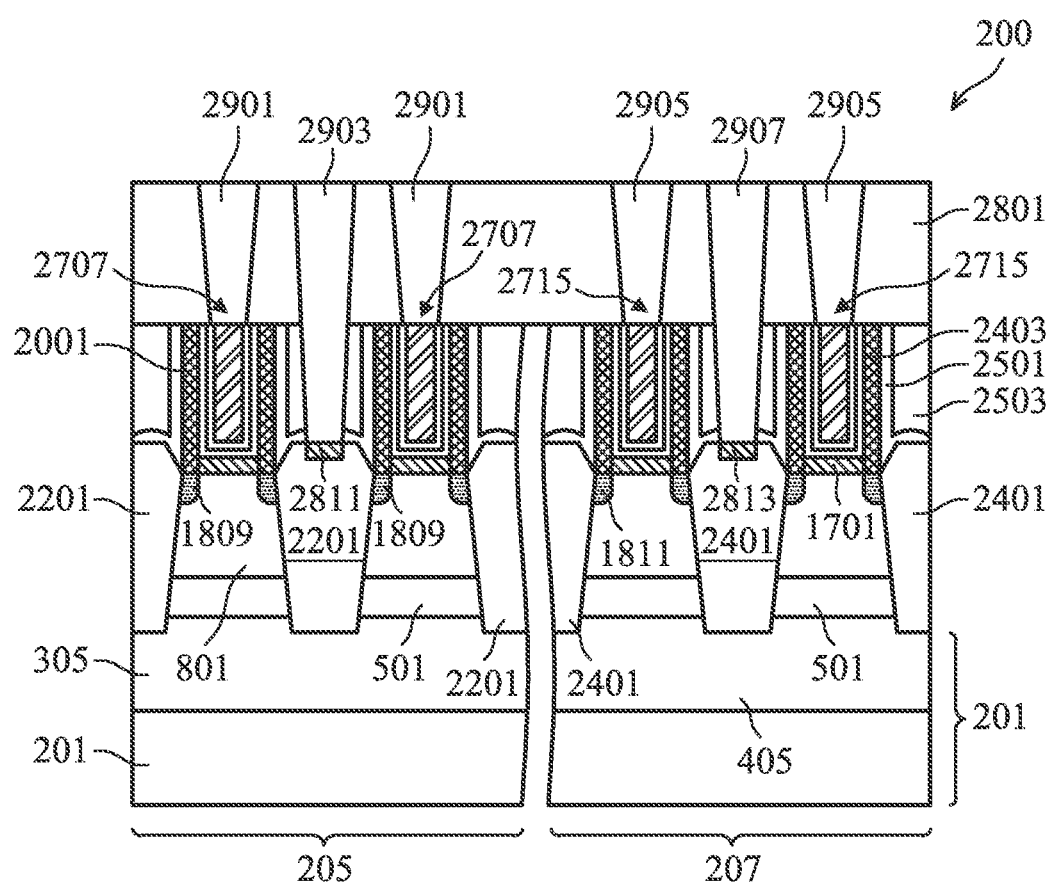
Figure 29C:
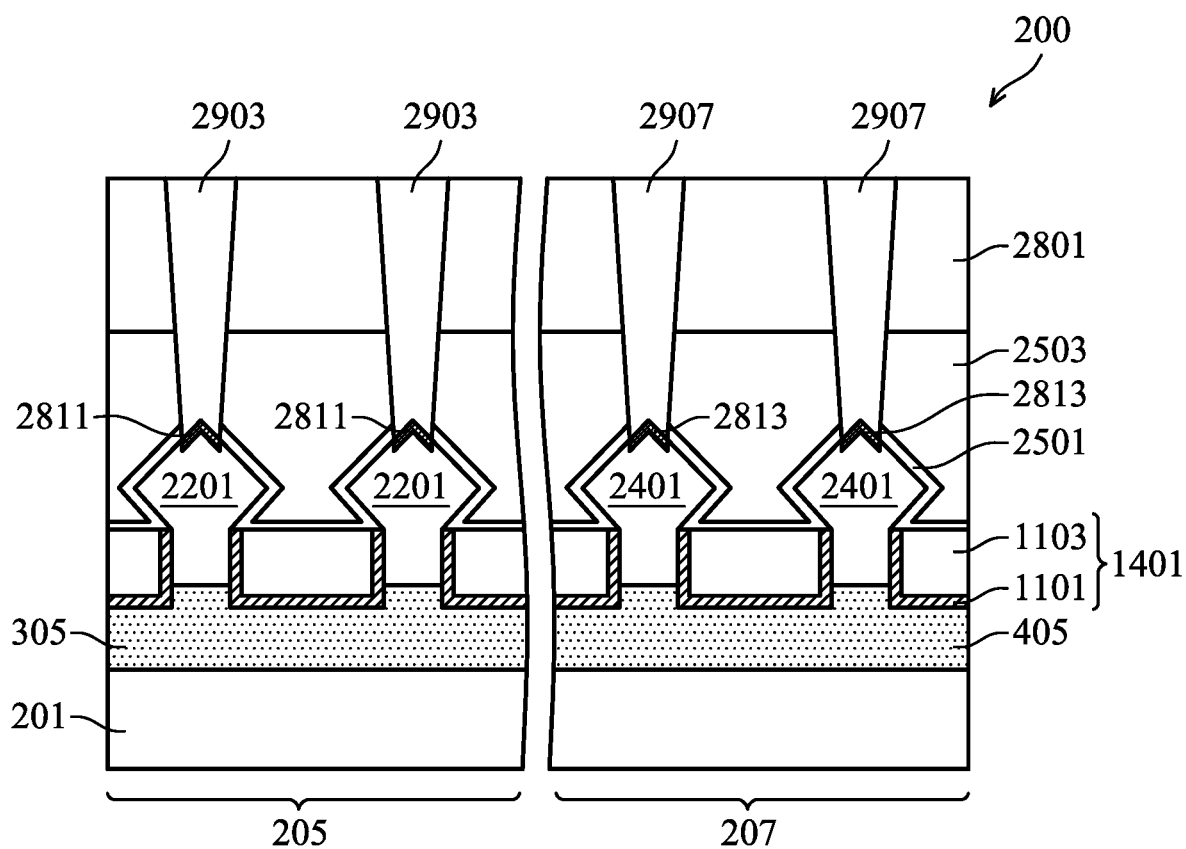

Referring to FIGS. 29A, 29B, and 29C, the openings 2803, 2805, 2807, and 2809 (see FIGS. 28A, 28B, and 28C) are filled with one or more conductive materials to form contact plugs 2901, 2903, 2905, and 2907, respectively. In some embodiments, a liner (not shown), such as a diffusion barrier layer, an adhesion layer, or the like, and a conductive material are formed in the openings 2803, 2805, 2807, and 2809. The liner may include titanium, titanium nitride, tantalum, tantalum nitride, a combination thereof, or the like, and may be formed using CVD, PVD, ALD, a combination thereof, or the like. The conductive material may be copper, a copper alloy, silver, gold, tungsten, aluminum, nickel, a combination thereof, or the like, and may be formed using CVD, PVD, ALD, an electrochemical plating process, an electroless plating process, a combination thereof, or the like. A planarization process, such as a CMP process, may be performed to remove excess portions of the liner and the conductive material from a top surface of the ILD 2801. The remaining portions of the liner and the conductive material form contact plugs 2901, 2903, 2905, and 2907 in the openings 2803, 2805, 2807, and 2809, respectively. The contact plugs 2901 and 2905 are physically and electrically coupled to the gates 2707 and 2715, respectively. The contact plugs 2903 and 2907 are physically coupled to the self-aligned layers 2811 and 2813, respectively. The contact plugs 2903 and 2907 are electrically coupled to the epitaxial source/drain regions 2201 and 2401 through the self-aligned layers 2811 and 2813, respectively.

FIGS. 30A, 31A, 31B, and 31C are cross-sectional views of intermediate stages in the manufacturing of a FinFET device 3000 in accordance with some embodiments. In FIGS. 30A, 31A, 31B, and 31C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3000 may be similar to the process steps for forming the FinFET device 200 described above with reference to FIGS. 2A-22A, 24A-29A, 17B-22B, 24B-29B, and 18C-29C, with like features labeled by like numerical references, and their description is not repeated herein.

Figure 30A:
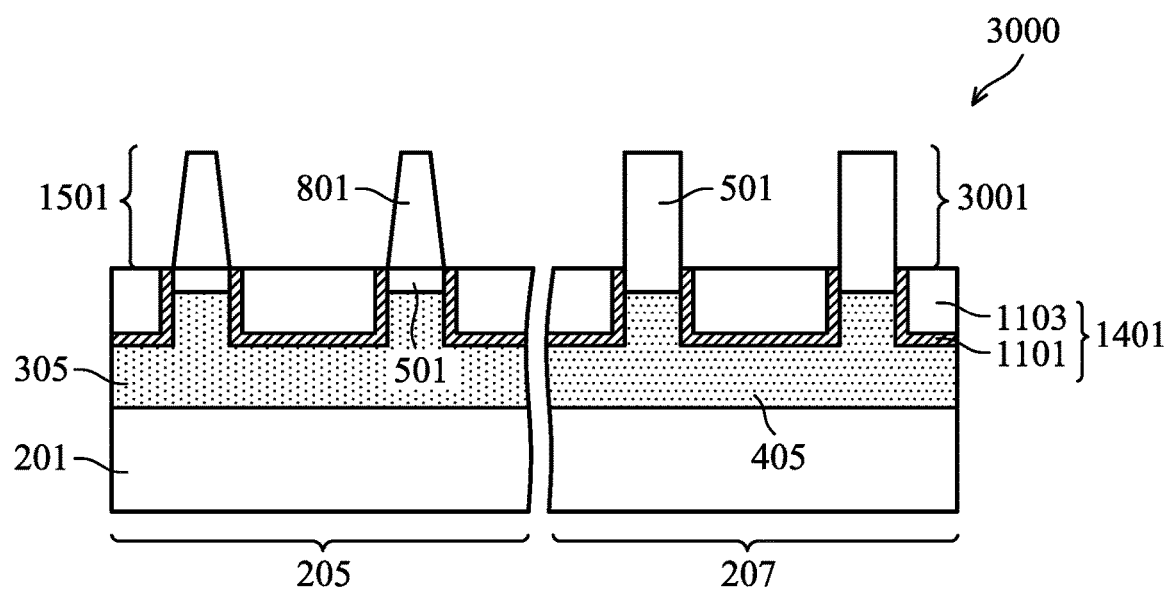
FIG. 30A is a cross-sectional view of an intermediate stage in the manufacture of a FinFET device in accordance with some embodiments.
Figure 31A:
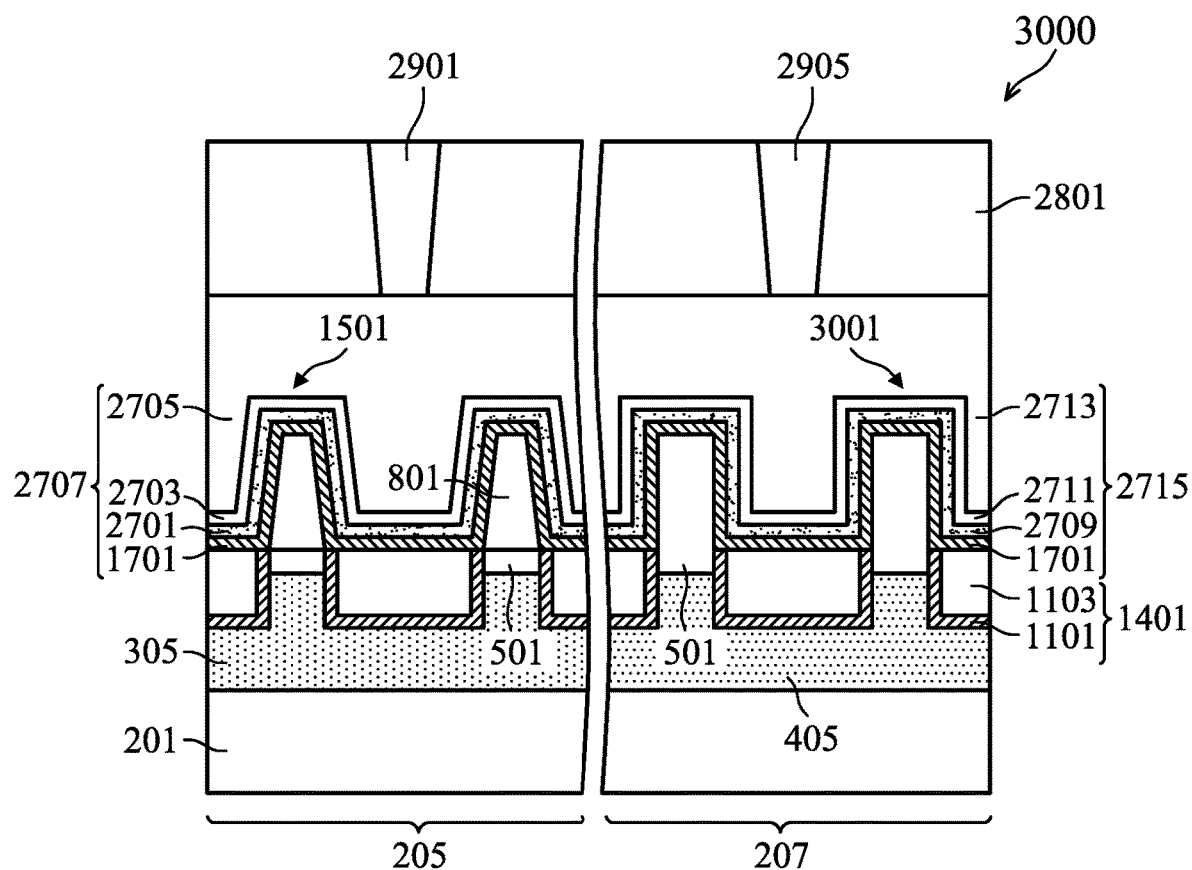
FIGS. 31A, 31B and 31C are cross-sectional views of an intermediate stage in the manufacture of a FinFET device in accordance with some embodiments.
Figure 31B:
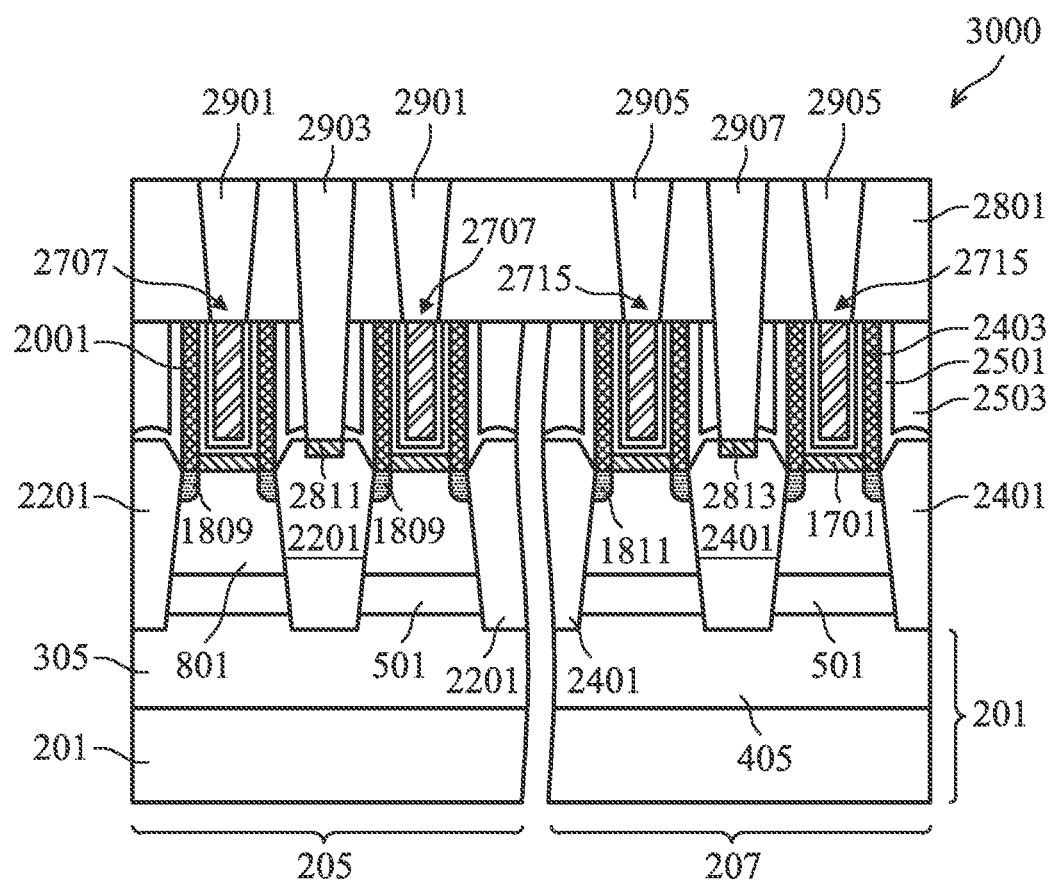
Figure 31C:
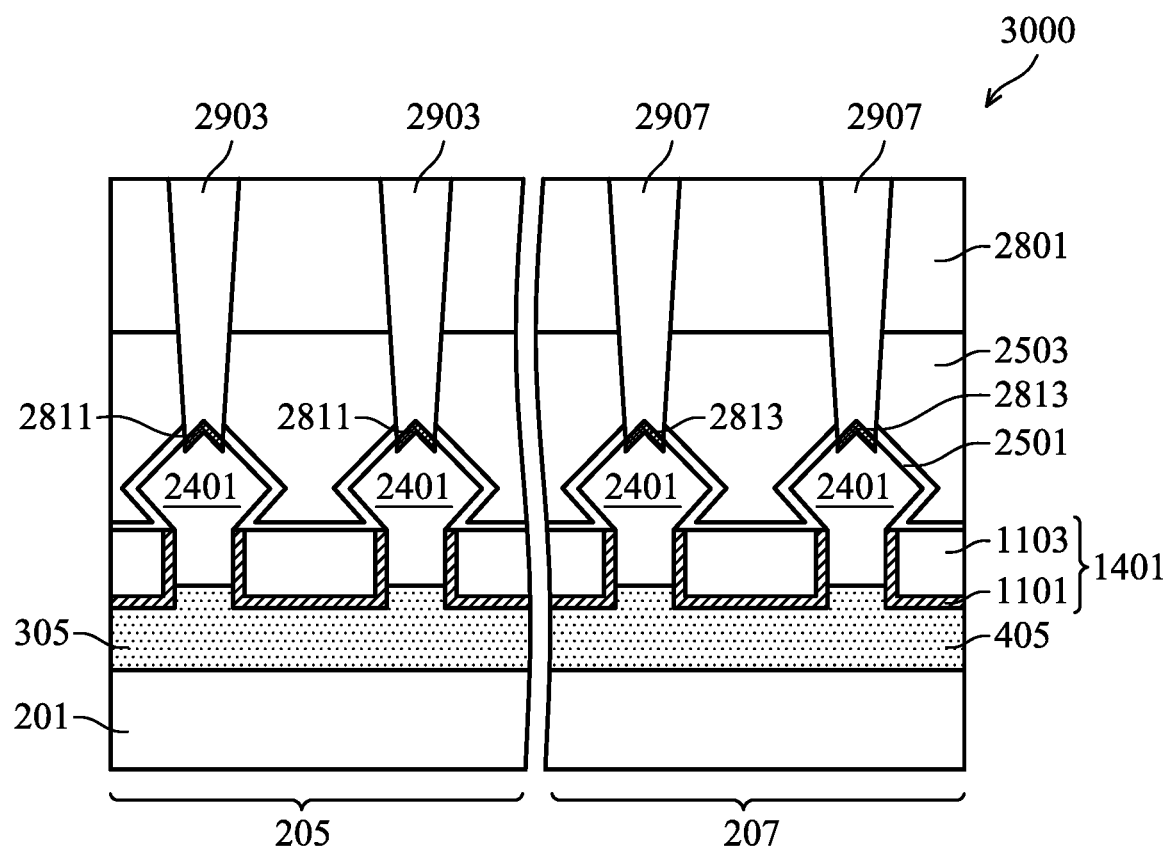

Referring to FIG. 30A, the process of forming the FinFET device 3000 starts with forming a structure illustrated in FIG. 14A. In some embodiments, one or more etch processes described above with reference to FIG. 15A is performed on exposed portions of the semiconductor strips 1005 (see FIG. 14A) in the PMOS region 205 to form fins 1501, while protecting exposed portions of the semiconductor strips 1007 (see FIG. 14A) in the NMOS region 207 with a mask (not shown). In such embodiments, the exposed portions of the semiconductor strips 1007 form fins 3001 in the NMOS region 207. Referring to FIGS. 31A, 31B, and 31C, the process steps described above with reference to FIGS. 17A-22A, 24A-29A, 17B-22B, 24B-29B, and 18C-29C are performed on the structure of FIG. 30A to form the FinFET device 3000 and the description is not repeated herein.

FIGS. 32A-35A, 35B, and 35C are cross-sectional views of intermediate stages in the manufacturing of a FinFET device 3200 in accordance with some embodiments. In FIGS. 32A-35A, 35B, and 35C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3200 may be similar to the process steps for forming the FinFET device 200 described above with reference to FIGS. 2A-22A, 24A-29A, 17B-22B, 24B-29B, and 18C-29C, with like features labeled by like numerical references, and their description is not repeated herein.

Figure 32A:
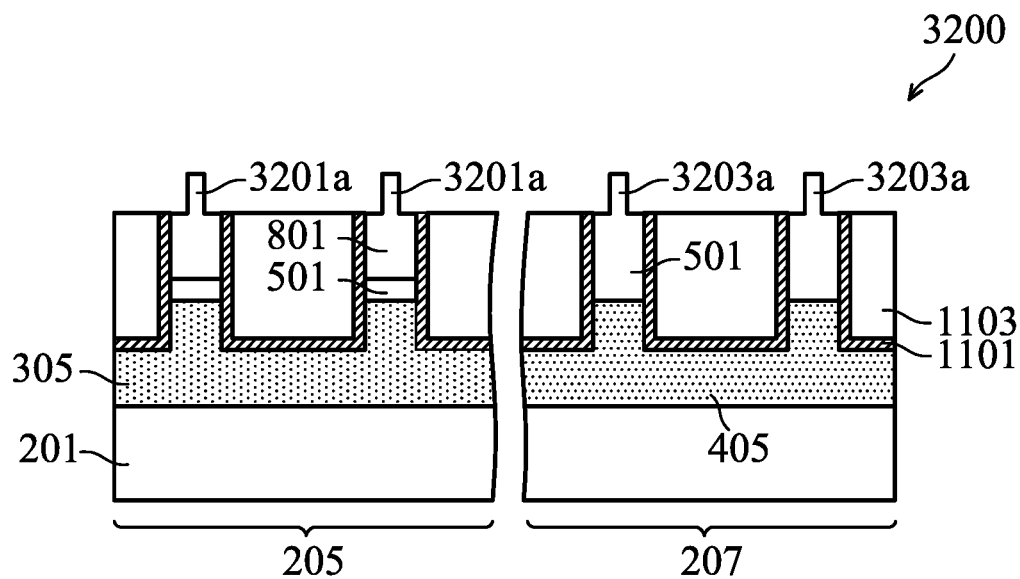
Figure 33A:
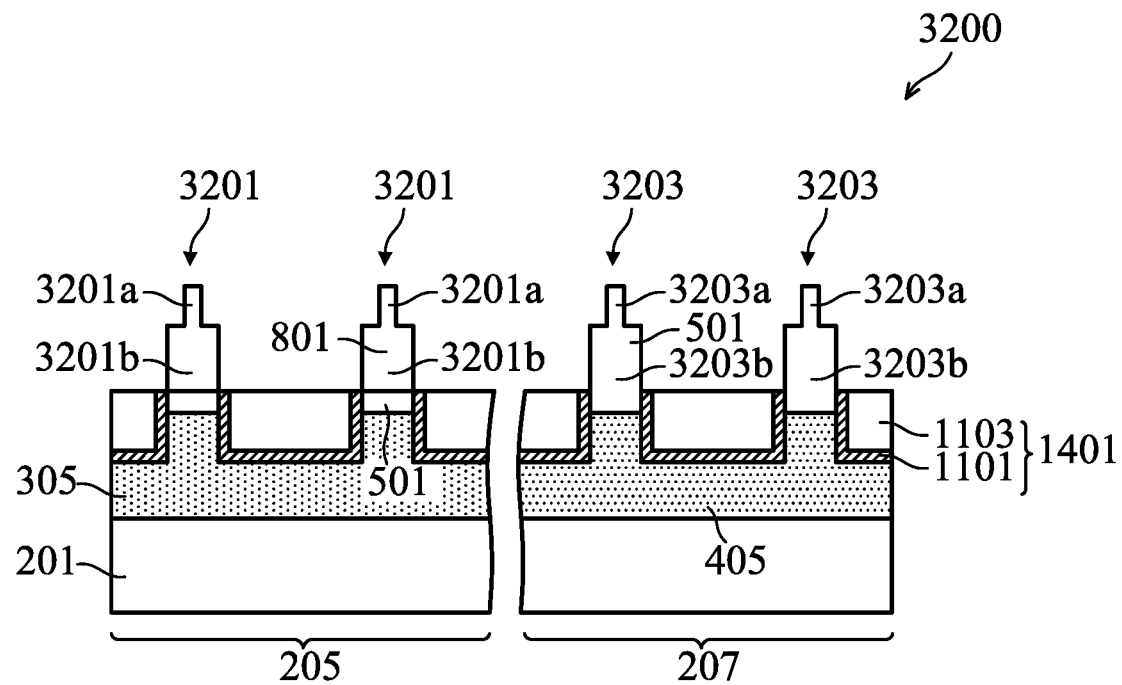

In some embodiments, the process of forming the FinFET device 3200 starts with forming a structure illustrated in FIG. 13A. Referring to FIGS. 32A and 33A, after forming the structure of FIG. 13A, the insulation material 1103 and the liner 1101 are recessed to expose upper portions of the semiconductor strips 1005 in the PMOS region 205 and upper portions of the semiconductor strips 1007 in the NMOS region 207 to form fins 3201 in the PMOS region 205 and fins 3203 in the NMOS region 207, respectively. The remaining portions of the insulation material 1103 and the liner 1101 form STI regions 1401.

Referring first to FIG. 32A, the recess process comprises a first recess process that exposes upper portions 3201a of the fins 3201 and upper portions 3203a of the fins 3203. In some embodiments, the first recess process may comprise an etch process, such as a CERTAS® etch, an Applied Materials SICONI etch, a dilute hydrofluoric (dHF) acid etch, or the like. In some embodiments, the etch process of the first recess process is chosen such that the etch process also etches the semiconductor strips 1005 and 1007 (see FIG. 13A) and narrows widths of the upper portions of the semiconductor strips 1005 and 1007. In such embodiments, widths of the upper portions 3201a of the fins 3201 are less than widths of the upper portions of the semiconductor strips 1005, and widths of the upper portions 3203a of the fins 3203 are less than widths of the upper portions of the semiconductor strips 1007. In some embodiments, the upper portions 3203a of the fins 3203 have uniform widths.

Referring to FIG. 33A, the recess process further comprises a second recess process that exposes lower portions 3201b of the fins 3201 and lower portions 3203b of the fins 3203. In some embodiments, the second recess process may comprise an etch process, such as a CERTAS® etch, an Applied Materials SICONI etch, a dilute hydrofluoric (dHF) acid etch, or the like. In some embodiments, the second recess process is different from the first recess process. In some embodiments, the etch process of the second recess process is different from the etch process of the first recess process. In some embodiments, the etch process of the second recess process is chosen such that the etch process does not substantially etch the semiconductor strips 1005 and 1007. In such embodiments, widths of the lower portions 3201b of the fins 3201 are substantially equal to widths of the semiconductor strips 1005, and widths of the lower portions 3203b of the fins 3203 are substantially equal to widths of the semiconductor strips 1007. In some embodiments, the lower portions 3203b of the fins 3203 have uniform widths. Reshaping the semiconductor strips 1005 and 1007 into fins 3201 and 3203, respectively, as described above with reference to FIGS. 32A and 33A allows for controlling strain in channels of the FinFET device 3200 at fin bottoms and reducing or eliminating fin wiggle/bend effect, and allows for the FinFET device 3200 having a uniform threshold voltage (Vt) along fin heights.

Figure 34A:
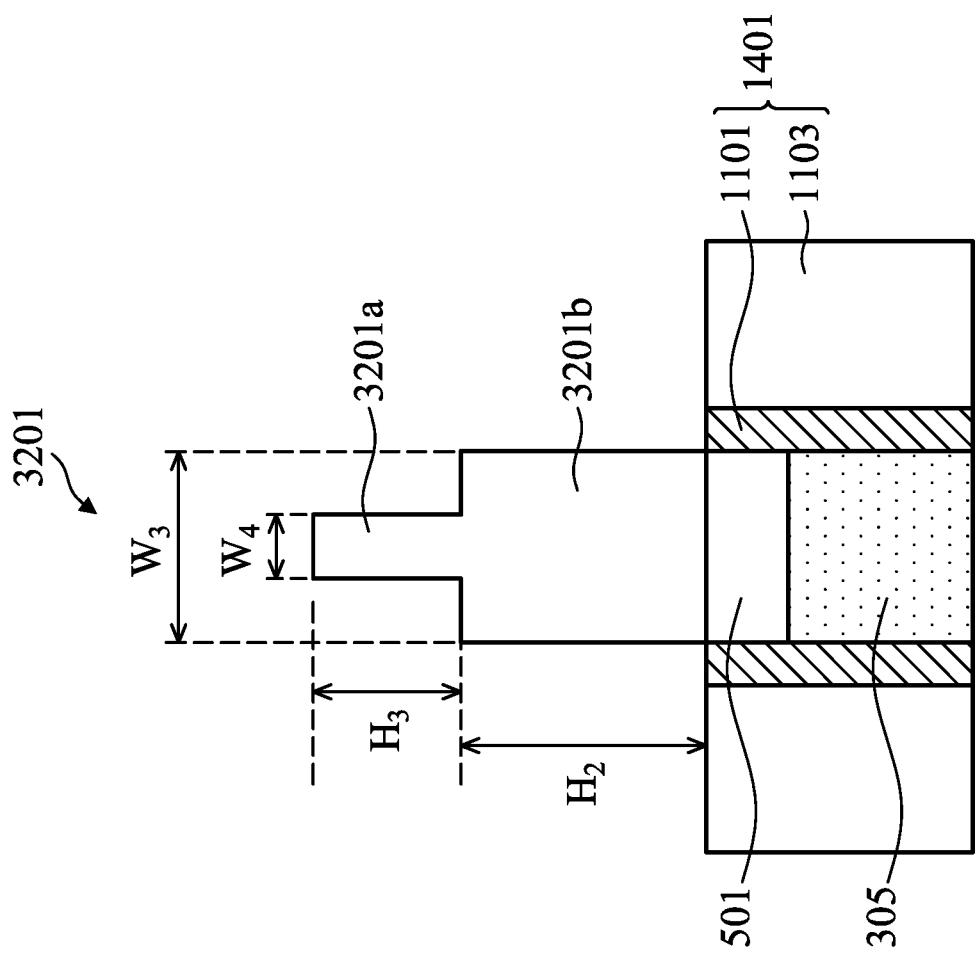

FIG. 34A illustrates a magnified view of a fin 3201 shown in FIG. 33A. In some embodiments, a width $W_3$ of the lower portion 3201b of the fin 3201 is greater than a width $W_4$ of the upper portion 3201a of the fin 3201. In some embodiments, the width $W_3$ is between about 4 nm and about 15 nm. In some embodiments, the width $W_4$ is between about 2 nm and about 10 nm. In some embodiments, the lower portion 3201b of the fin 3201 has a height $H_2$ between about 20 nm and about 40 nm. In some embodiments, the upper portion 3201a of the fin 3201 has a height $H_3$ between about 20 nm and about 40 nm. In some embodiments where the fin 3201 comprises SiGe, the fin 3201 has a uniform Ge concentration. In such embodiments, the height $H_2$ is greater than the height $H_3$. In some embodiments, the uniform Ge concentration in the fin 3201 is between about 15 atomic % and about 40 atomic %. In other embodiments where the fin 3201 comprises SiGe, the fin 3201 has a non-uniform Ge concentration. In such embodiments, the height $H_2$ is less than the height $H_3$. In some embodiments where the fin 3201 has a non-uniform Ge concentration, the Ge concentration increases as the fin 3201 extends away from the adjacent STI regions 1401. In some embodiments, a Ge concentration of a portion of the fin 3201 nearest the adjacent STI regions 1401 is between about 10 atomic % and about 20 atomic %. In some embodiments, a Ge concentration of a portion of the fin 3201 farthest from the adjacent STI regions 1401 is between about 25 atomic % and about 35 atomic %. In other embodiments where the fin 3201 has a non-uniform Ge concentration, the lower portion 3201b of the fin 3201 has a uniform Ge concentration and the upper portion 3201a of the fin 3201 has a non-uniform Ge concentration. In some embodiments, the lower portion 3201b of the fin 3201 has the uniform Ge concentration between about 15 atomic % and about 40 atomic %. In some embodiments, the Ge concentration increases as the upper portion 3201a of the fin 3201 extends away from the lower portion 3201b of the fin 3201. In some embodiments, a Ge concentration of a portion of the upper portion 3201a of the fin 3201 nearest the lower portion 3201b of the fin 3201 is between about 10 atomic % and about 20 atomic %. In some embodiments, a Ge concentration of a portion of the upper portion 3201a of the fin 3201 farthest away from the lower portion 3201b of the fin 3201 is between about 25 atomic % and about 35 atomic %. In some embodiments, the fins 3203 (see FIG. 33A) may have similar shapes and sizes as the fins 3201 and the description is not repeated herein.

Figure 35A:
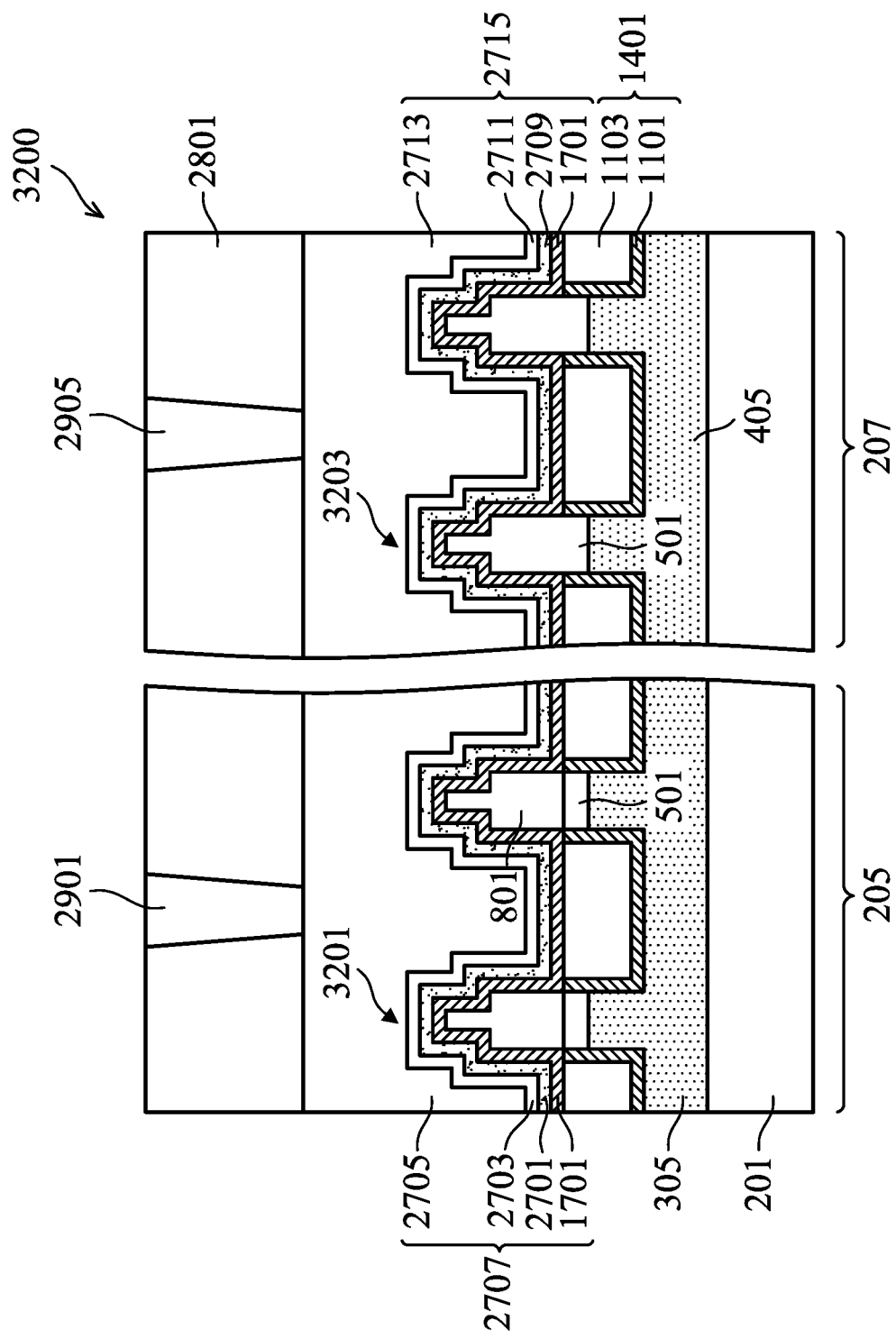
FIGS. 35A, 35B and 35C are cross-sectional views of an intermediate stage in the manufacture of a FinFET device in accordance with some embodiments.
Figure 35B:
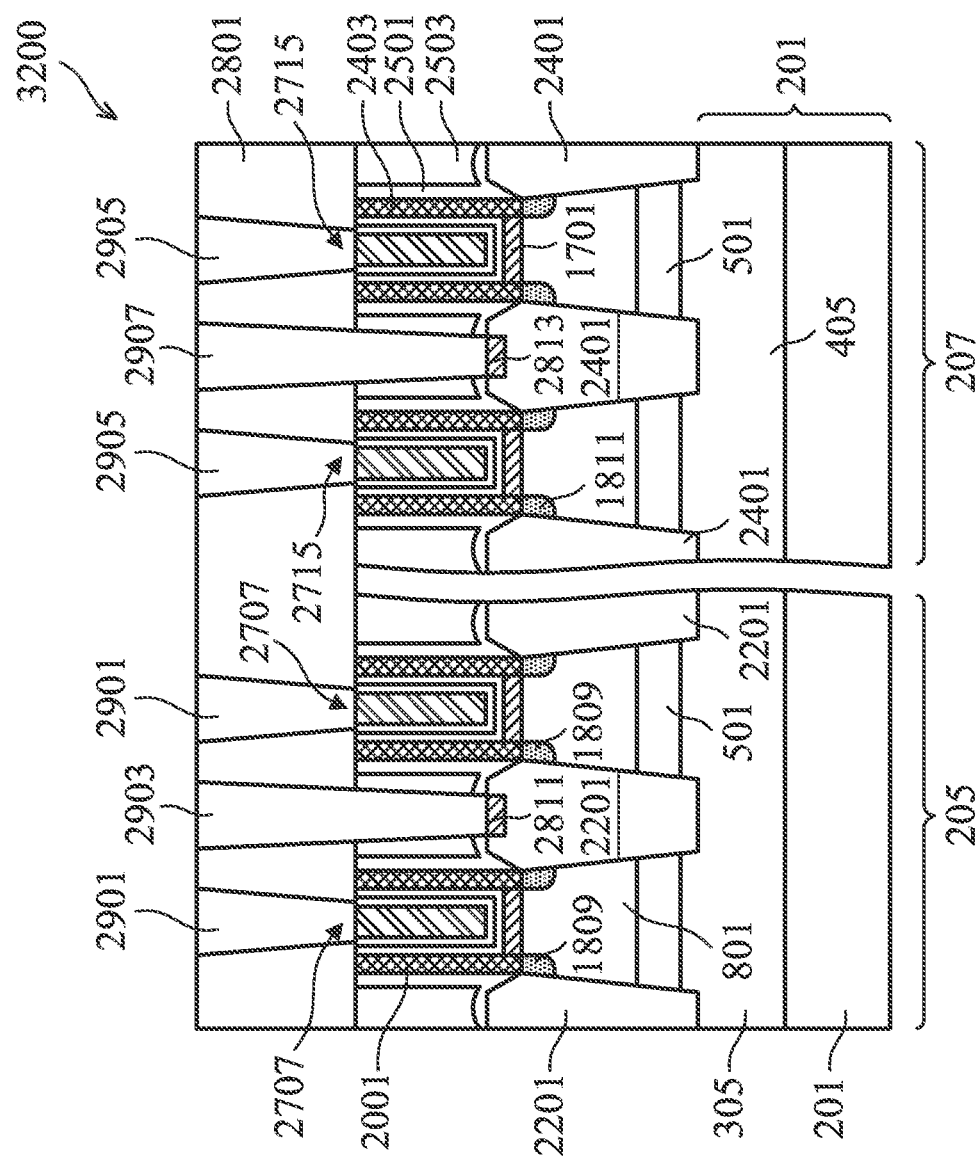
Figure 35C:
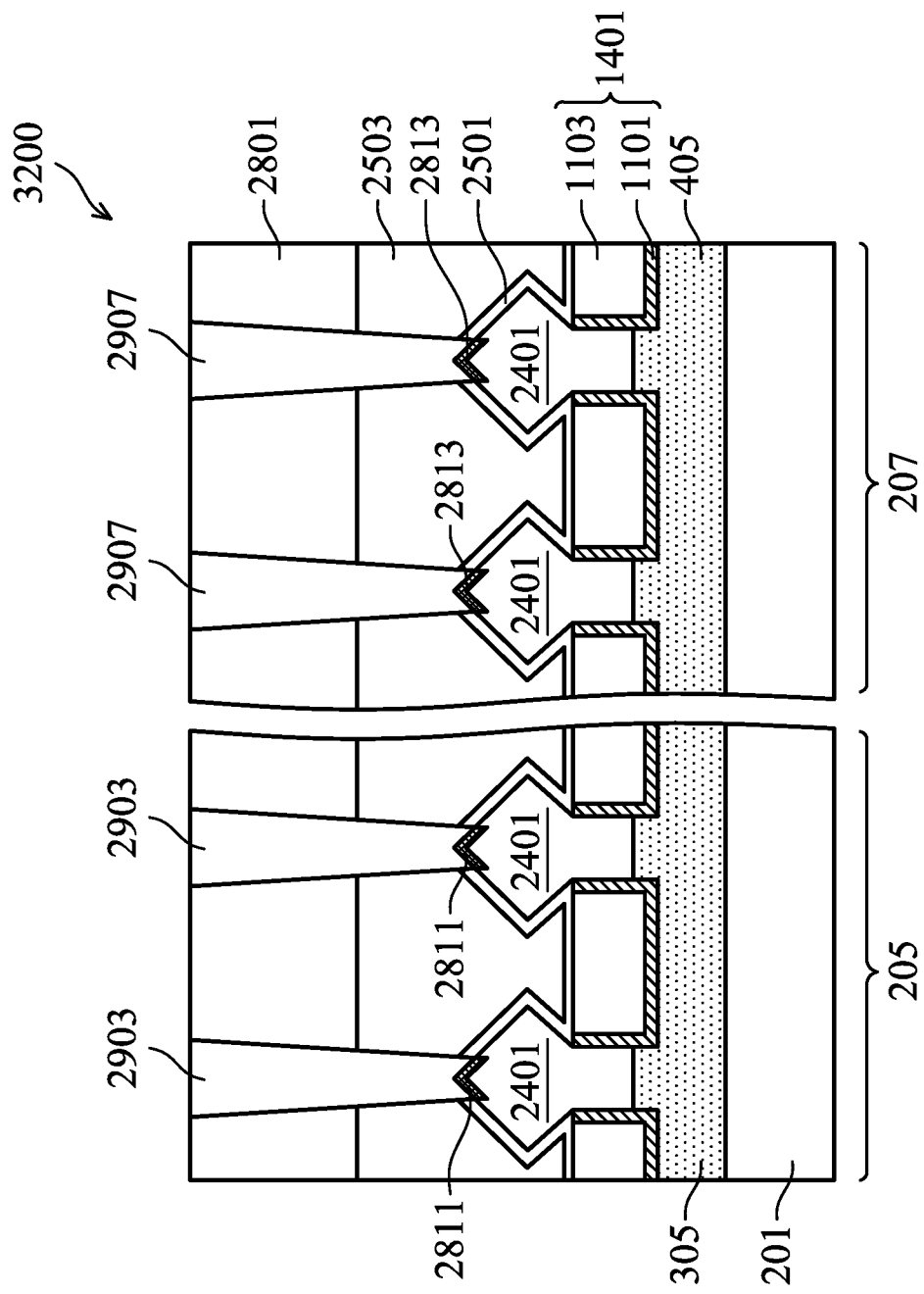

Referring to FIGS. 35A, 35B, and 35C, the process steps described above with reference to FIGS. 17A-22A, 24A-29A, 17B-22B, 24B-29B, and 18C-29C are performed on the structure of FIG. 33A to form the FinFET device 3200 and the description is not repeated herein.

FIGS. 36A, 37A, 37B, and 37C are cross-sectional views of intermediate stages in the manufacturing of a FinFET device 3600 in accordance with some embodiments. In FIGS. 36A, 37A, 37B, and 37C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3600 may be similar to the process steps for forming the FinFET device 3200 described above with reference to FIGS. 32A-35A, 35B, and 35C, with like features labeled by like numerical references, and their description is not repeated herein.

Figure 36A:
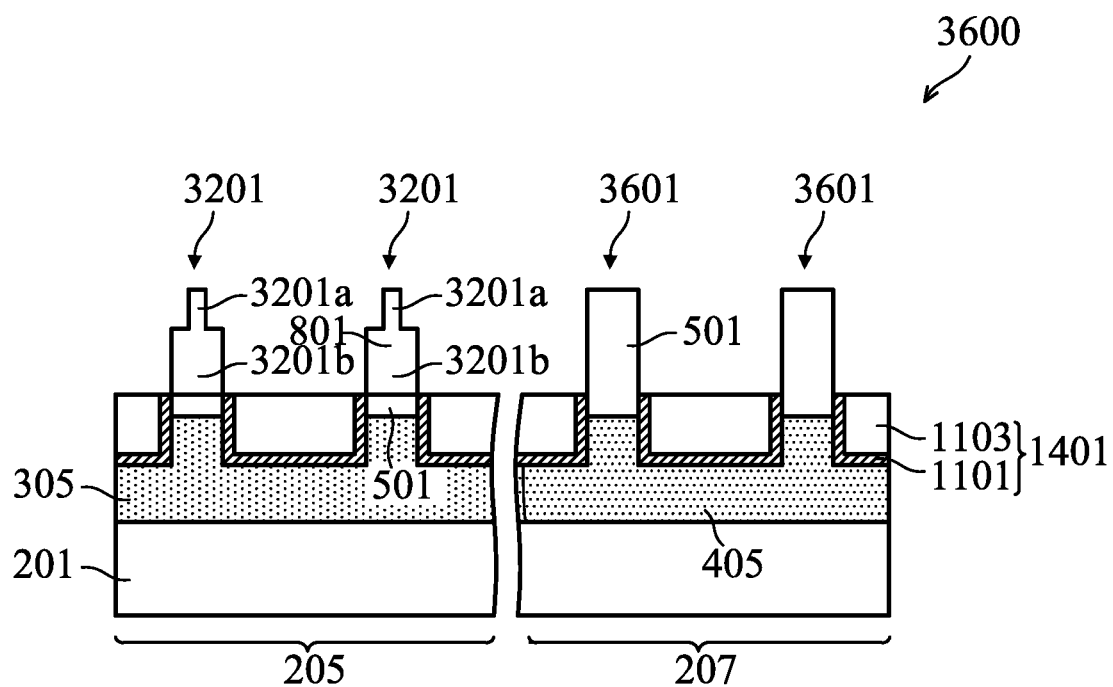
FIG. 36A is a cross-sectional view of an intermediate stage in the manufacture of a FinFET device in accordance with some embodiments.
Figure 37A:
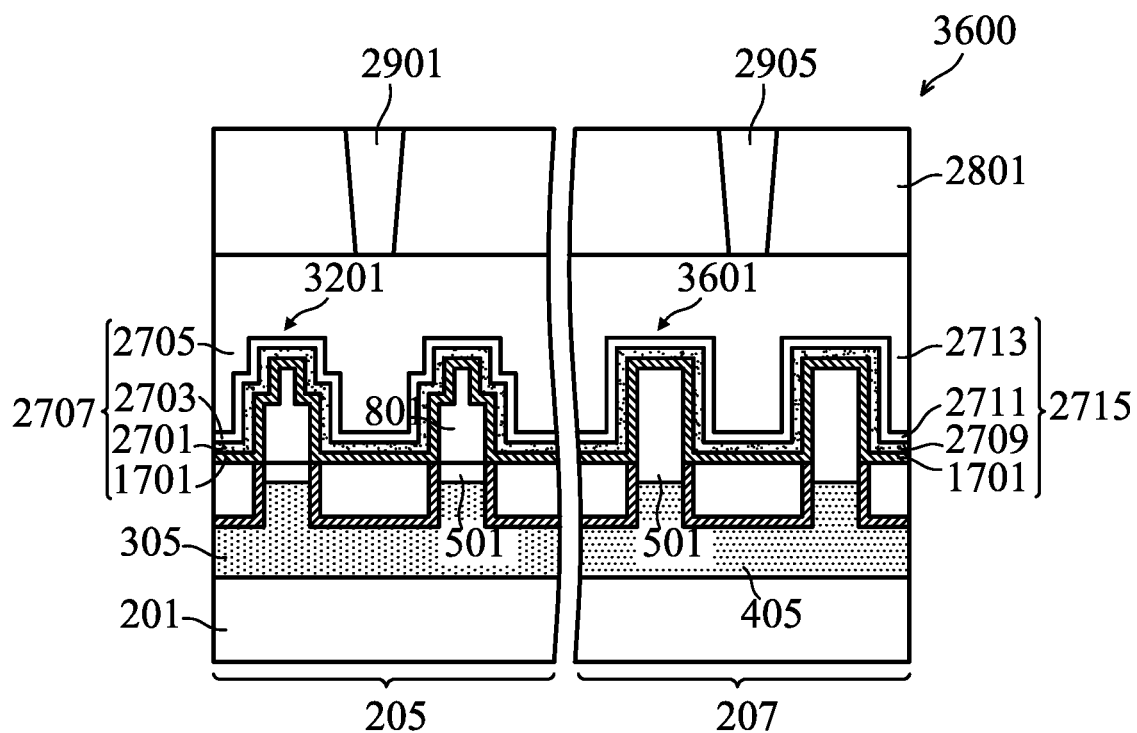
FIGS. 37A, 37B and 37C are cross-sectional views of an intermediate stage in the manufacture of a FinFET device in accordance with some embodiments.
Figure 37B:
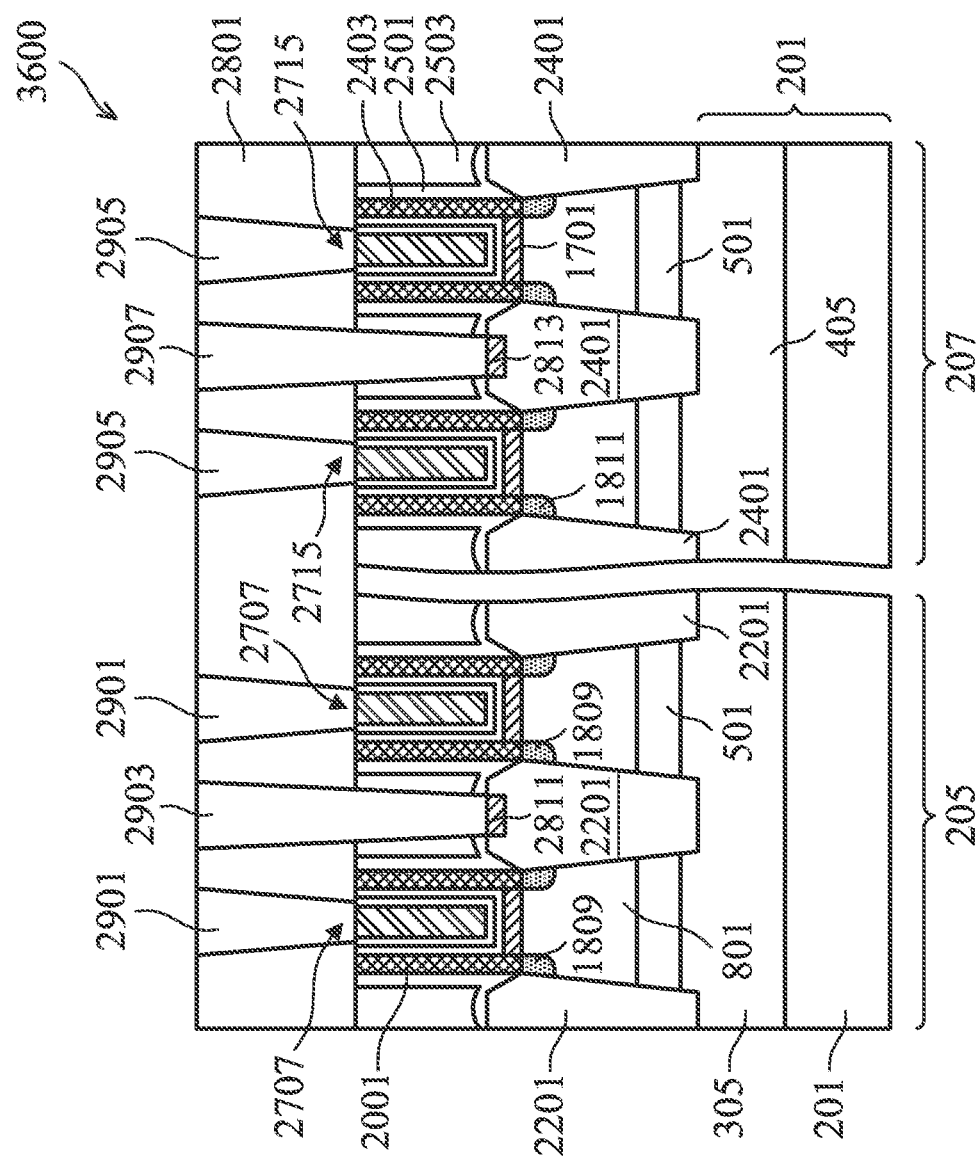
Figure 37C:
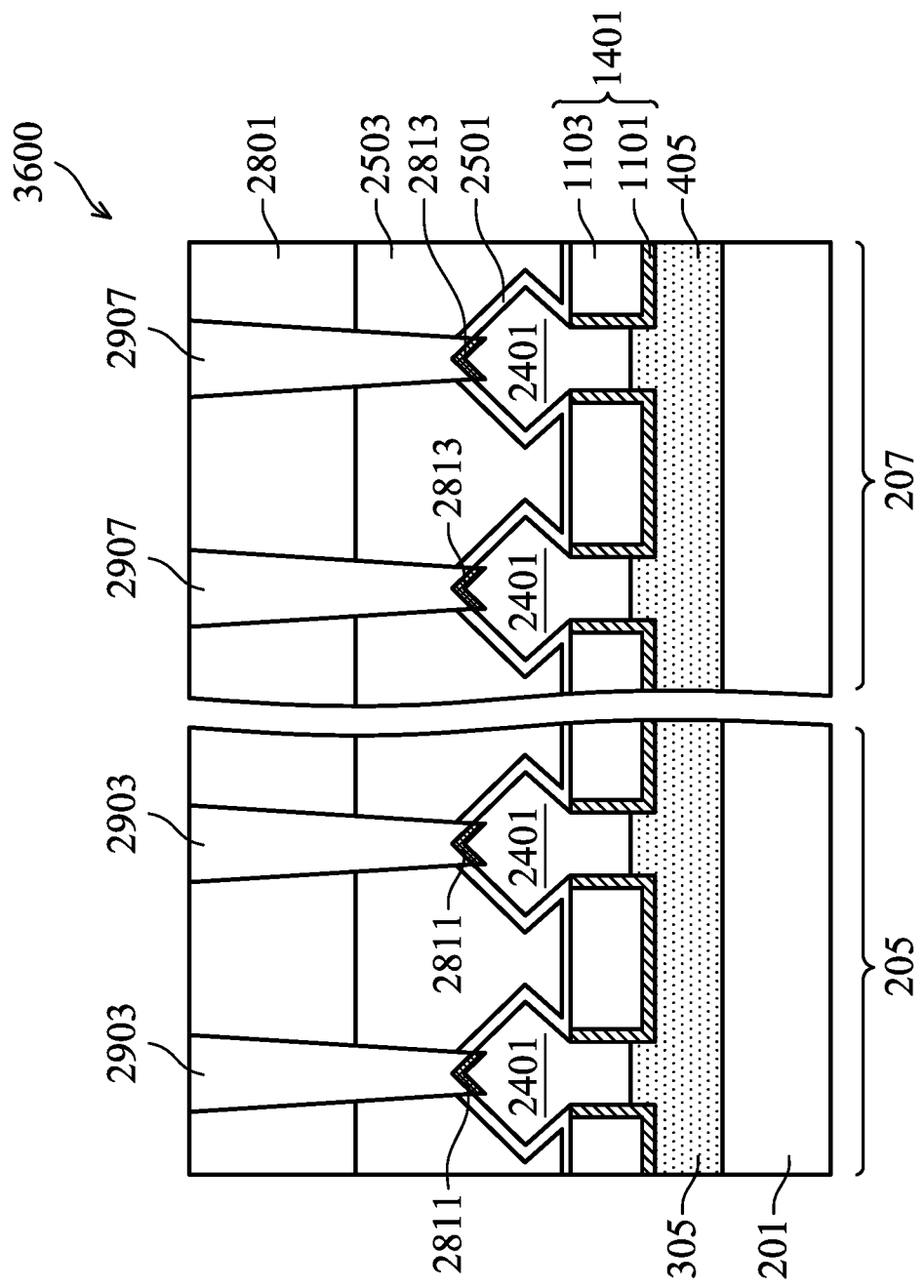

In some embodiments, the process of forming the FinFET device 3600 starts with forming a structure illustrated in FIG. 13A. Referring to FIG. 36A, the recessing process described above with reference to FIGS. 32A and 33A are performed on the PMOS region 205 of the structure of FIG. 13A to form the fins 3201, while protecting the NMOS region 207 of the structure of FIG. 13A with a mask (not shown). Furthermore, the recess process described above with reference to FIG. 14A is performed on the NMOS region 207 of the structure of FIG. 13A to expose portions of the semiconductor strips 1007 in the NMOS region 207, while protecting the PMOS region 205 of the structure of FIG. 13A with a mask (not shown). The exposed portions of the semiconductor strips 1007 form fins 3601 in the NMOS region 207. Referring to FIGS. 37A, 37B, and 37C, the process steps described above with reference to FIGS. 17A-22A, 24A-29A, 17B-22B, 24B-29B, and 18C-29C are performed on the structure of FIG. 36A to form the FinFET device 3600 and the description is not repeated herein.

FIGS. 38A-43A, 43B, and 43C are cross-sectional views of intermediate stages in the manufacturing of a FinFET device 3800 in accordance with some embodiments. In FIGS. 38A-43A, 43B, and 43C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3800 may be similar to the process steps for forming the FinFET device 200 described above with reference to FIGS. 2A-22A, 24A-29A, 17B-22B, 24B-29B, and 18C-29C, with like features labeled by like numerical references, and their description is not repeated herein.

Figure 38A:
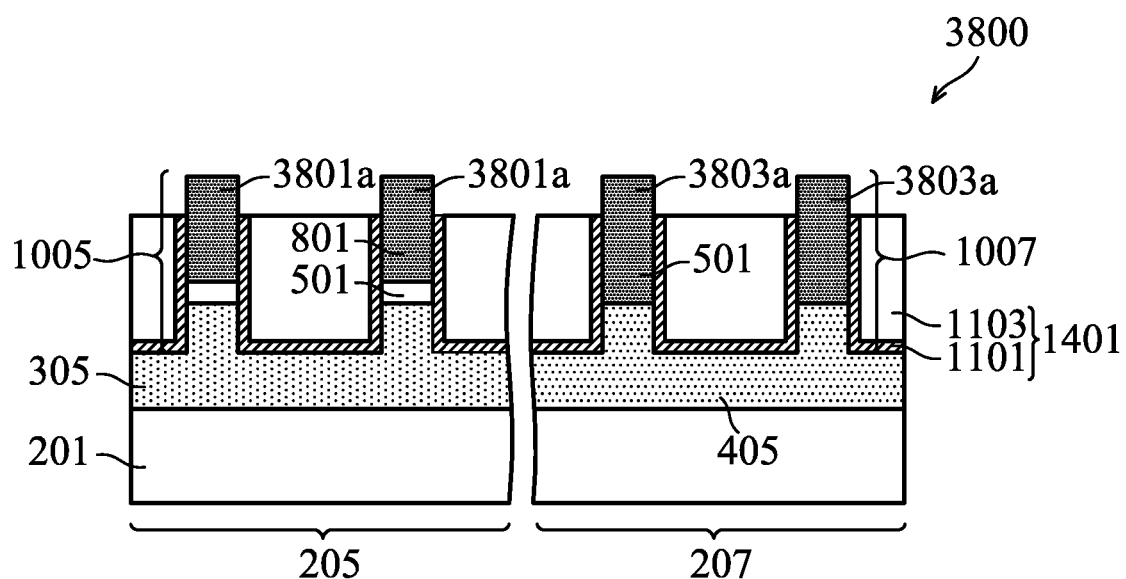

In some embodiments, the process of forming the FinFET device 3800 starts with forming a structure illustrated in FIG. 13A. Referring to FIGS. 38A-41A, after forming the structure of FIG. 13A, various process steps are performed on the structure of FIG. 13A to form fins 3901 in the PMOS region 205 and fins 3903 in the NMOS region 207. Referring to FIG. 38A, a first recess process is performed on the insulation material 1103 and the liner 1101 to expose first portions 3801a of the semiconductor strips 1005 in the PMOS region 205 and first portions 3803a of the semiconductor strips 1007 in the NMOS region 207. In some embodiments, the first recess process may comprise a first etch process, such as a CERTAS® etch, an Applied Materials SICONI etch, a dilute hydrofluoric (dHF) acid etch, or the like. In some embodiments, the first etch process of the first recess process is chosen such that the first etch process does not substantially etch the semiconductor strips 1005 and 1007. In such embodiments, widths of the first portions 3801a of the semiconductor strips 1005 are substantially equal to widths of the semiconductor strips 1005, and widths of the first portions 3803a of the semiconductor strips 1007 are substantially equal to widths of the semiconductor strips 1007.

Figure 39A:
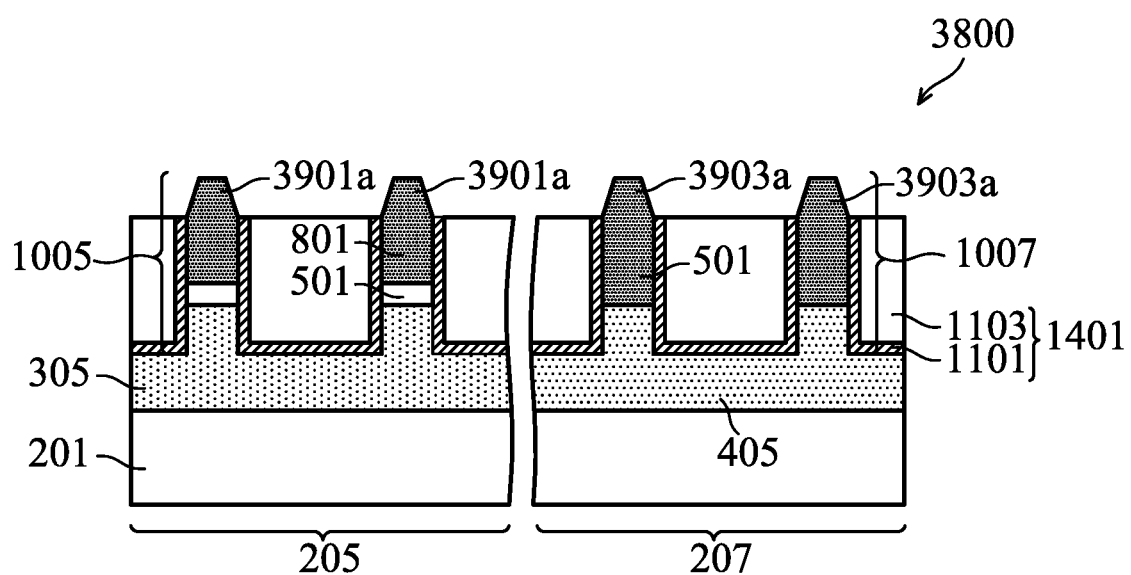

Referring to FIG. 39A, the first portions 3801a of the semiconductor strips 1005 are reshaped to form upper portions 3901a of the fins 3901 in the PMOS region 205, and the first portions 3803a of the semiconductor strips 1007 are reshaped to form upper portions 3903a of the fins 3903 in the NMOS region 207. In some embodiments, the first portions 3801a of the semiconductor strips 1005 and the first portions 3803a of the semiconductor strips 1007 are reshaped using one or more etch processes. In some embodiments, a same etch process is performed on the first portions 3801a of the semiconductor strips 1005 and the first portions 3803a of the semiconductor strips 1007. In such embodiments, an oxide layer such as, for example, a silicon oxide layer (not shown) may be formed over the first portions 3803a of the semiconductor strips 1007 to compensated the etch rate difference between the semiconductor strips 1005 and 1007. In other embodiments, two different etch processes are performed on the first portions 3801a of the semiconductor strips 1005 and the first portions 3803a of the semiconductor strips 1007. In some embodiments, the one or more etch processes may comprise an anisotropic etch process, such as a reactive ion etch (RIE), or the like. In some embodiments, etch chemistry and other parameters of the RIE process may be tuned to tune etch rates of the RIE process. In some embodiments, an etch rate along a crystallographic direction <100>, $R_{100}$, is greater than an etch rate along a crystallographic direction <110>, $R_{110}$, which is greater than an etch rate along a crystallographic direction <111>, $R_{111}$. In some embodiments, $R_{100}:R_{110}:R_{111}$ is equal to 600:400:1. In some embodiments where top surfaces of the semiconductor layers 501 and 801 are crystallographic planes (100), the RIE process changes slopes of sidewalls of the first portions 3801a of the semiconductor strips 1005 and slopes of sidewalls of the first portions 3803a of the semiconductor strips 1007, such that widths of the upper portions 3901a of the fins 3901 decrease as the upper portions 3901a of the fins 3901 extend away from a top surface of the insulation material 1103 and widths of the upper portions 3903a of the fins 3903 decrease as the upper portions 3903a of the fins 3903 extend away from a top surface of the insulation material 1103.

Figure 40A:
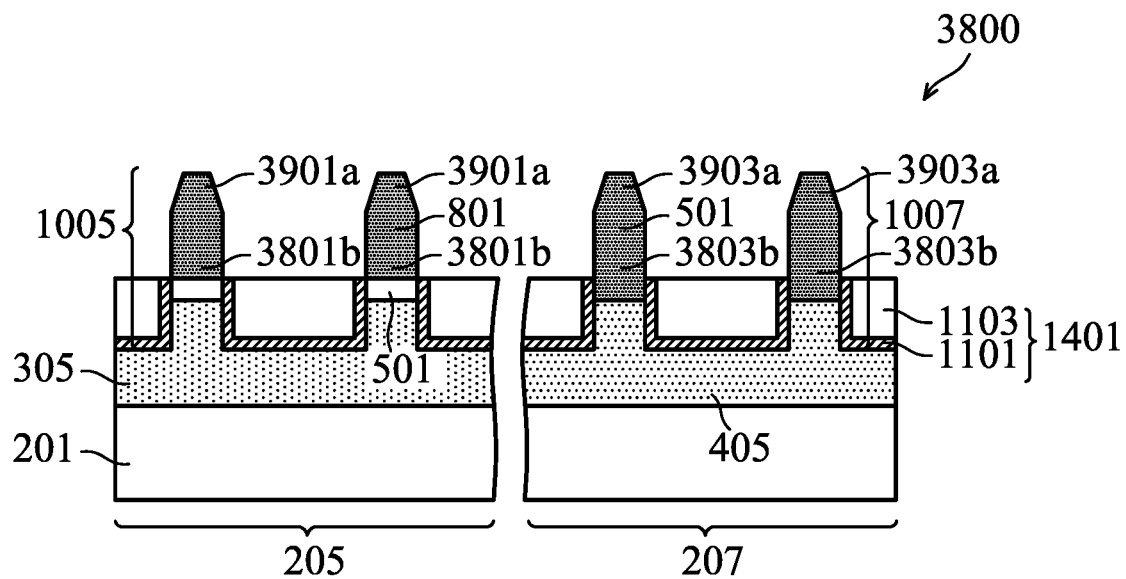

Referring to FIG. 40A, after forming the upper portions 3901a of the fins 3901 in the PMOS region 205 and the upper portions 3903a of the fins 3903 in the NMOS region 207, a second recess process is performed on the insulation material 1103 and the liner 1101 to expose second portions 3801b of the semiconductor strips 1005 in the PMOS region 205 and second portions 3803b of the semiconductor strips 1007 in the NMOS region 207. In some embodiments, the second recess process is similar to the first recess process described above with reference to FIG. 38A and the description is not repeated herein. In some embodiments, an etch process of the second recess process is chosen such that the etch process does not substantially etch the semiconductor strips 1005 and 1007. In such embodiments, widths of the second portions 3801b of the semiconductor strips 1005 are substantially equal to widths of the semiconductor strips 1005, and widths of the second portions 3803b of the semiconductor strips 1007 are substantially equal to widths of the semiconductor strips 1007. In some embodiments, the etch process of the second recess process is same as the etch process of the first recess process. After performing the first recess process and the second recess process, remaining portions of the insulation material 1103 and the liner 1101 form STI regions 1401.

Figure 41A:
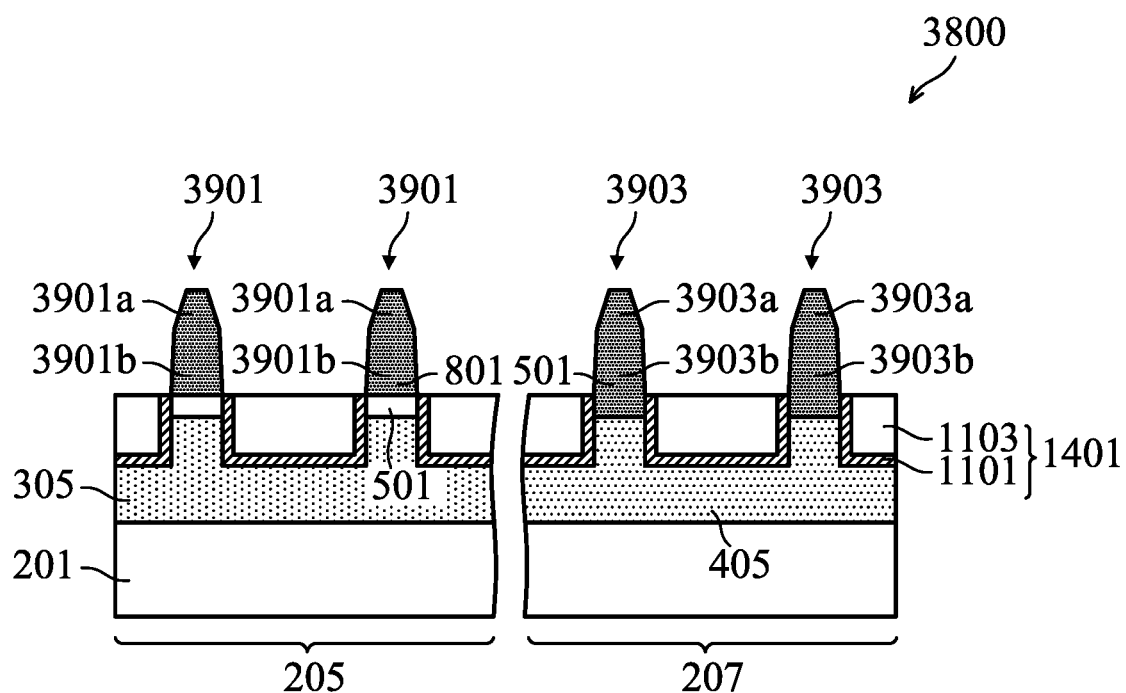

Referring to FIG. 41A, after performing the second recess process, the second portions 3801b of the semiconductor strips 1005 are reshaped to form lower portions 3901b of the fins 3901 in the PMOS region 205, and the second portions 3803b of the semiconductor strips 1007 are reshaped to form lower portions 3903b of the fins 3903 in the NMOS region 207. In some embodiments, the second portions 3801b of the semiconductor strips 1005 and the second portions 3803b of the semiconductor strips 1007 are reshaped using one or more etch processes. In some embodiments, the reshaping process for forming the lower portions 3901b of the fins 3901 in the PMOS region 205 and the lower portions 3903b of the fins 3903 in the NMOS region 207 may be similar to the reshaping process for forming the upper portions 3901a of the fins 3901 in the PMOS region 205 and the upper portions 3903a of the fins 3903 in the NMOS region 207 described above with reference to FIG. 39A and the description is not repeated herein. In some embodiments, the one or more etch processes of the reshaping process for forming the lower portions 3901b of the fins 3901 in the PMOS region 205 and the lower portions 3903b of the fins 3903 in the NMOS region 207 are different from the one or more etch processes of the reshaping process for forming the upper portions 39o1a of the fins 3901 in the PMOS region 205 and the upper portions 3903a of the fins 3903 in the NMOS region 207. In such embodiments, sidewalls of the upper portions 3901a of the fins 3901 and sidewalls of the lower portions 3901b of the fins 3901 have different slopes, and sidewalls of the upper portions 3903a of the fins 3903 and sidewalls of the lower portions 3903b of the fins 3903 have different slopes. After the reshaping process, widths of the lower portions 3901b of the fins 3901 decrease as the lower portions 3901b of the fins 3901 extend away from top surfaces of the adjacent STI regions 1401 and widths of the lower portions 3903b of the fins 3903 decrease as the lower portions 3903b of the fins 3903 extend away from top surfaces of the adjacent STI regions. Reshaping the semiconductor strips 1005 and 1007 into fins 3901 and 3903, respectively, as described above with reference to FIGS. 38A-41A allows for controlling strain in channels of the FinFET device 3800 at fin bottoms and reducing or eliminating fin wiggle/bend effect, and allows for the FinFET device 3800 having a uniform threshold voltage (Vt) along fin heights.

Figure 42A:
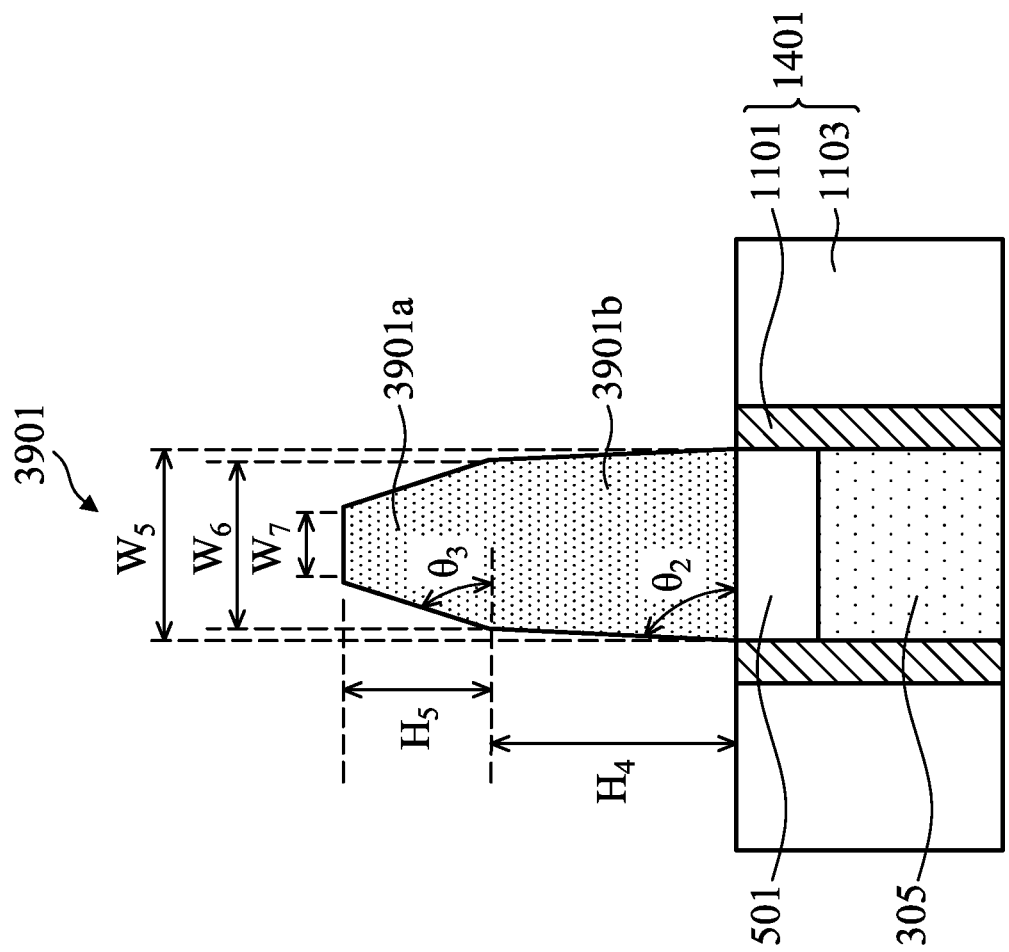

FIG. 42A illustrates a magnified view of a fin 3901 shown in FIG. 41A. In some embodiments, the lower portion 3901b of the fin 3901 has a height $H_4$ between about 20 nm and about 50 nm. In some embodiments, the upper portion 3901a of the fin 3901 has a height $H_5$ between about 5 nm and about 30 nm. A portion of the lower portion 3901b of the fin 3901 nearest the adjacent STI regions 1401 has a width $W_5$ and a portion of the lower portion 3901b of the fin 3901 farthest away from the adjacent STI regions 1401 has a width $W_6$. In some embodiments, the width $W_5$ is greater than the width $W_6$. In some embodiments, the width $W_5$ is between about 4 nm and about 15 nm. In some embodiments, the width $W_6$ is between about 3 nm and about 12 nm. The sidewalls of the lower portion 3901b of the fin 3901 form an angle $\theta_2$ with the topmost surfaces of adjacent STI regions 1401. In some embodiments, the angle $\theta_2$ is between about 85 degrees and about 90 degrees. A portion of the upper portion 3901a of the fin 3901 nearest the adjacent STI regions 1401 has the width $W_6$ and a portion of the upper portion 3901a of the fin 3901 farthest away from the adjacent STI regions 1401 has a width $W_7$. In some embodiments, the width $W_6$ is greater than the width $W_7$. In some embodiments, the width $W_7$ is between about 2 nm and about 10 nm. The sidewalls of the upper portion 3901a of the fin 3901 form an angle $\theta_3$ with a plane parallel to the topmost surfaces of adjacent STI regions 1401. In some embodiments, the angle $\theta_3$ is between about 70 degrees and about 85 degrees. In some embodiments, the angle $\theta_2$ is different from the angle $\theta_3$.

Referring further to FIG. 42A, in some embodiments where the fin 3901 comprises SiGe, the fin 3901 has a uniform Ge concentration. In such embodiments, the height $H_4$ is greater than the height $H_5$. In some embodiments, the uniform Ge concentration in the fin 3901 is between about 15 atomic % and about 40 atomic %. In other embodiments where the fin 3901 comprises SiGe, the fin 3901 has a non-uniform Ge concentration. In such embodiments, the height $H_4$ is less than the height $H_5$. In some embodiments where the fin 3901 has a non-uniform Ge concentration, the Ge concentration increases as the fin 3901 extends away from the adjacent STI regions 1401. In some embodiments, a Ge concentration of a portion of the fin 3901 nearest the adjacent STI regions 1401 is between about 10 atomic % and about 20 atomic %. In some embodiments, a Ge concentration of a portion of the fin 3901 farthest away from the adjacent STI regions 1401 is between about 25 atomic % and about 35 atomic %. In other embodiments where the fin 3901 has a non-uniform Ge concentration, the lower portion 3901b of the fin 3901 has a uniform Ge concentration and the upper portion 3901a of the fin 3901 has a non-uniform Ge concentration. In some embodiments, the lower portion 3901b of the fin 3901 has the uniform Ge concentration between about 15 atomic % and about 40 atomic %. In some embodiments, the Ge concentration increases as the upper portion 3901a of the fin 3901 extends away from the lower portion 3901b of the fin 3901. In some embodiments, a Ge concentration of a portion of the upper portion 3901a of the fin 3901 nearest the lower portion 3901b of the fin 3901 is between about 10 atomic % and about 20 atomic %. In some embodiments, a Ge concentration of a portion of the upper portion 3901a of the fin 3901 farthest away from the lower portion 3901b of the fin 3901 is between about 25 atomic % and about 35 atomic %. In some embodiments, the fins 3903

(see FIG. 41A) may have similar shapes and sizes as the fins 3901 and the description is not repeated herein.

Figure 43A:
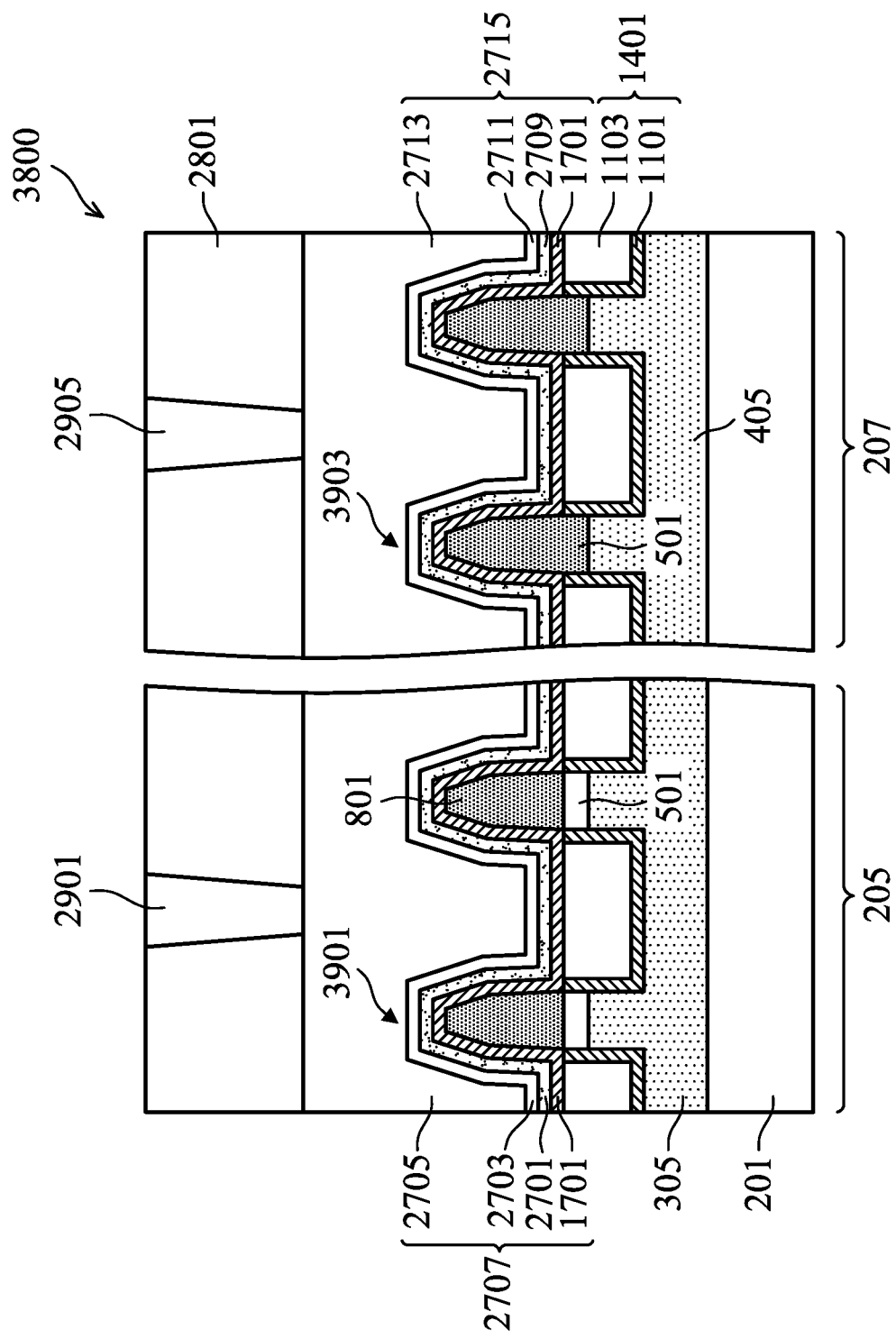
FIGS. 43A, 43B and 43C are cross-sectional views of an intermediate stage in the manufacture of a FinFET device in accordance with some embodiments.
Figure 43B:
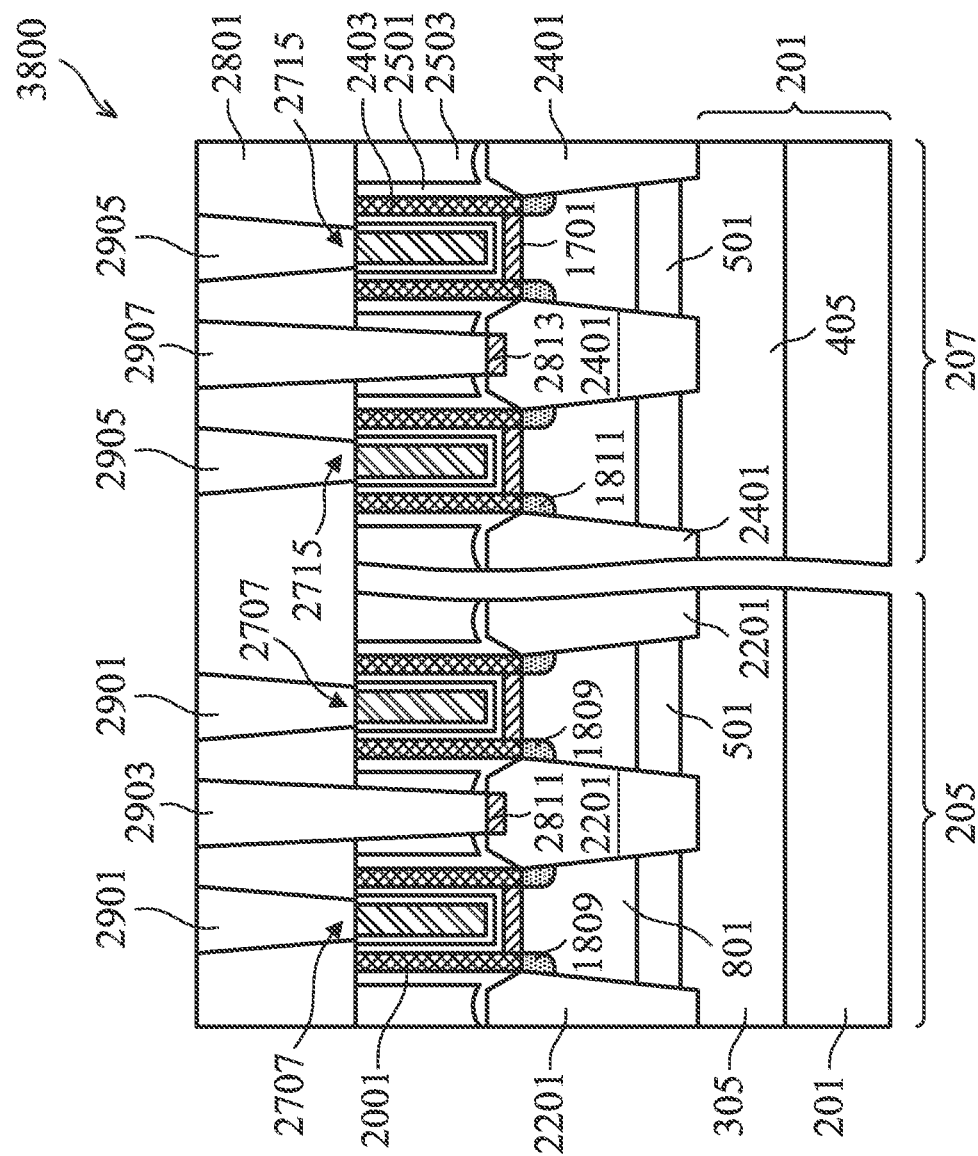
Figure 43C:
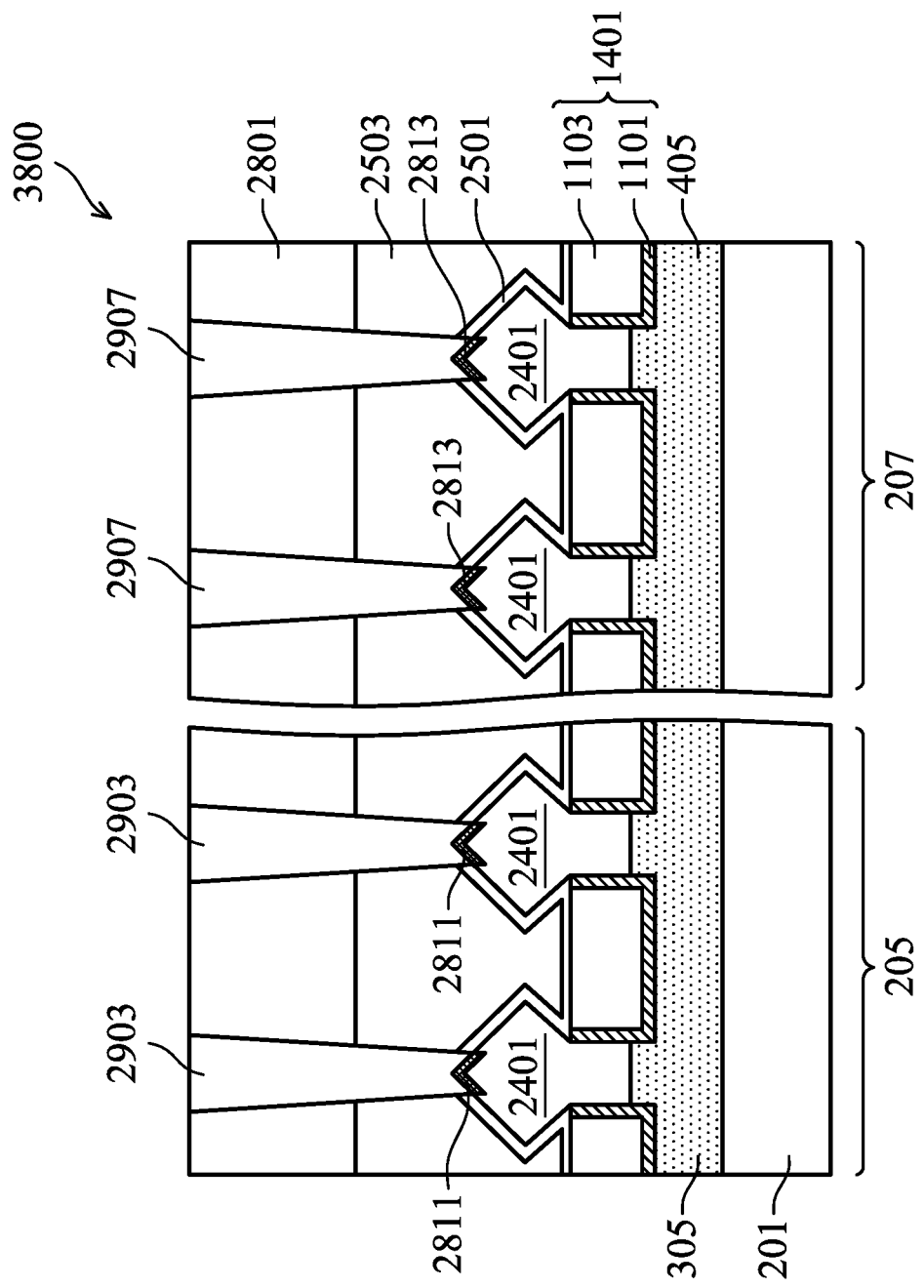

Referring to FIGS. 43A, 43B, and 43C, the process steps described above with reference to FIGS. 17A-22A, 24A-29A, 17B-22B, 24B-29B, and 18C-29C are performed on the structure of FIG. 41A to form the FinFET device 3800 and the description is not repeated herein.

FIGS. 44A, 45A, 45B, and 45C are cross-sectional views of intermediate stages in the manufacturing of a FinFET device 4400 in accordance with some embodiments. In FIGS. 44A, 45A, 45B, and 45C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 4400 may be similar to the process steps for forming the FinFET device 3800 described above with reference to FIGS. 38A-43A, 43B, and 43C, with like features labeled by like numerical references, and their description is not repeated herein.

Figure 44A:
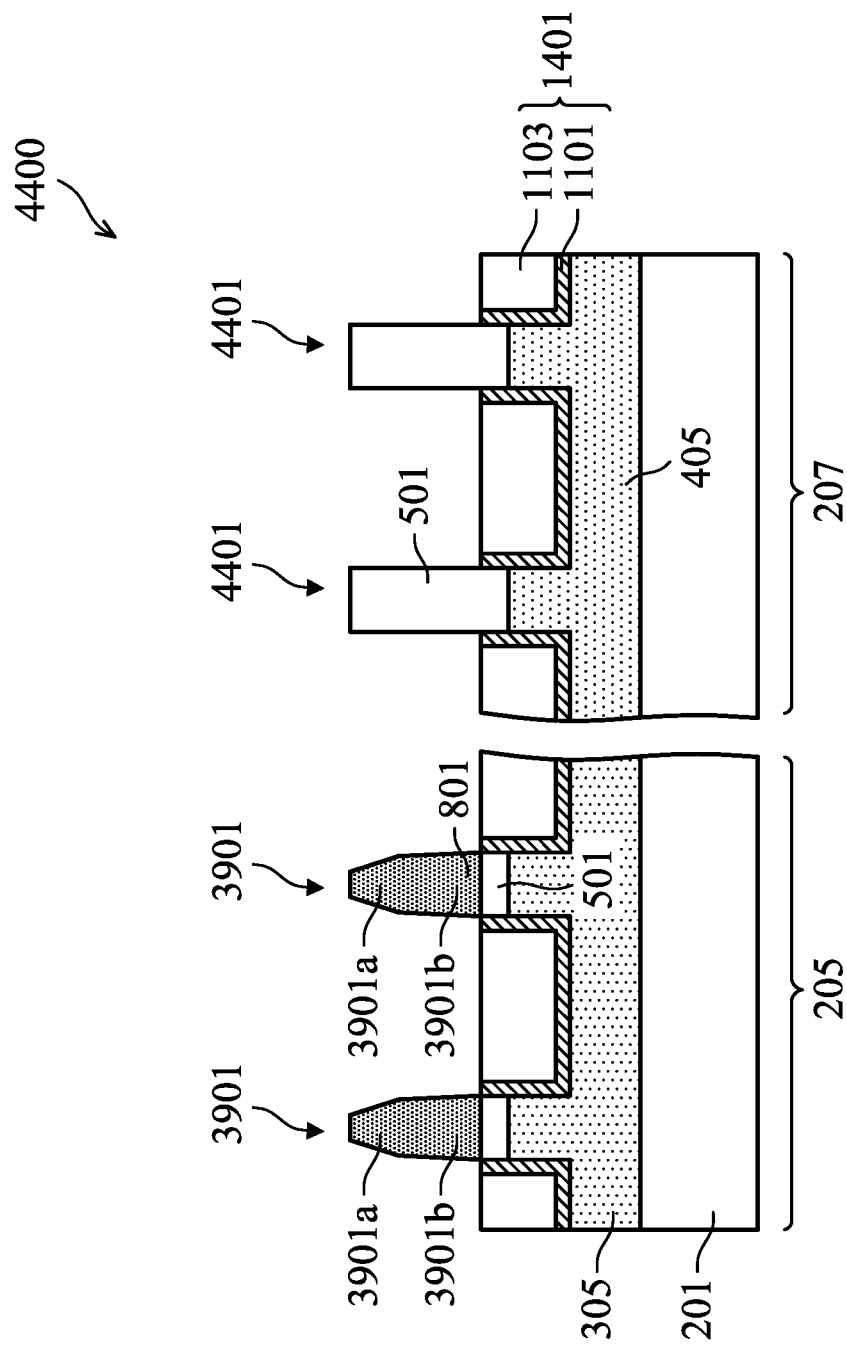
FIG. 44A is a cross-sectional view of an intermediate stage in the manufacture of a FinFET device in accordance with some embodiments.
Figure 45A:
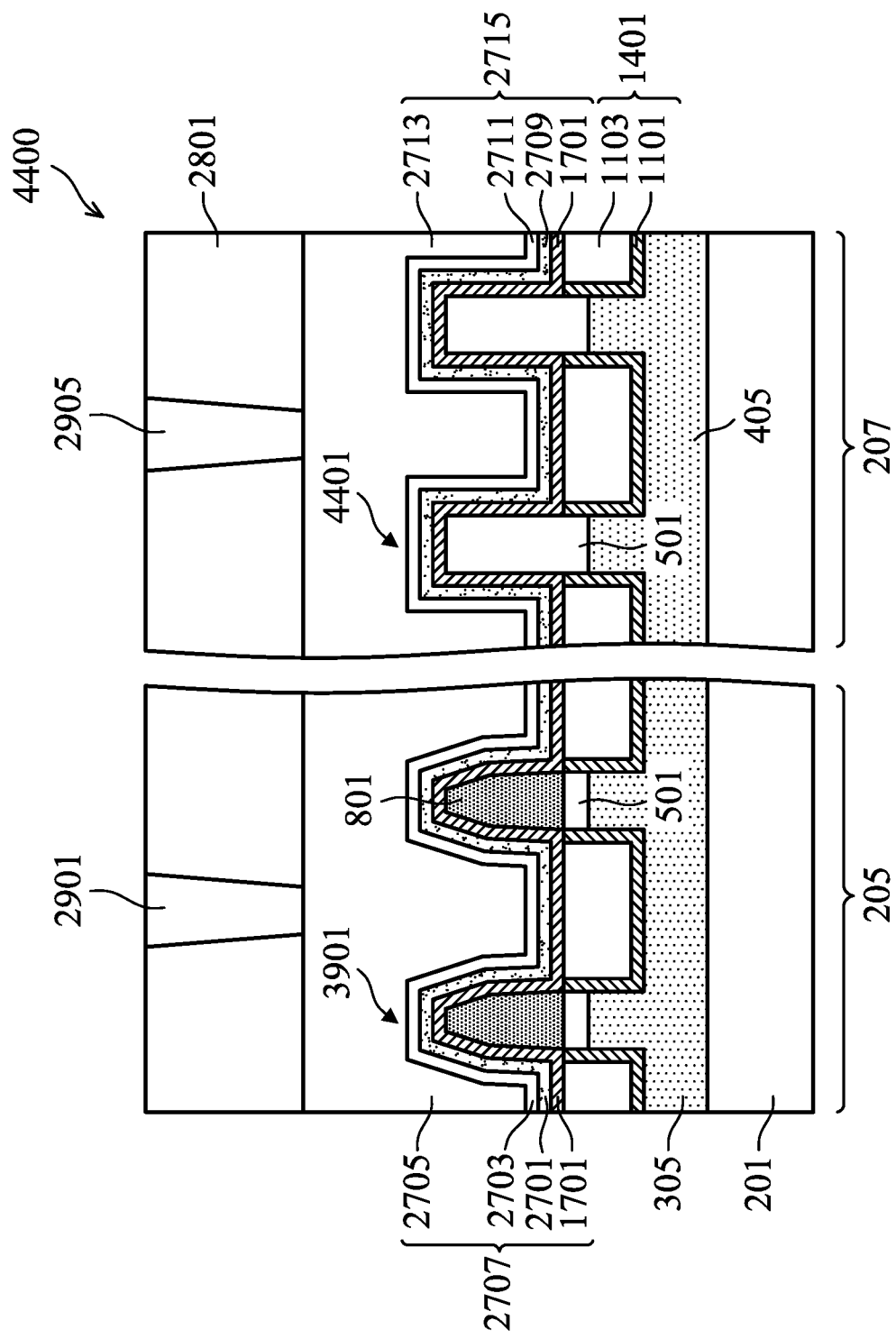
FIGS. 45A, 45B and 45C are cross-sectional views of an intermediate stage in the manufacture of a FinFET device in accordance with some embodiments.
Figure 45B:
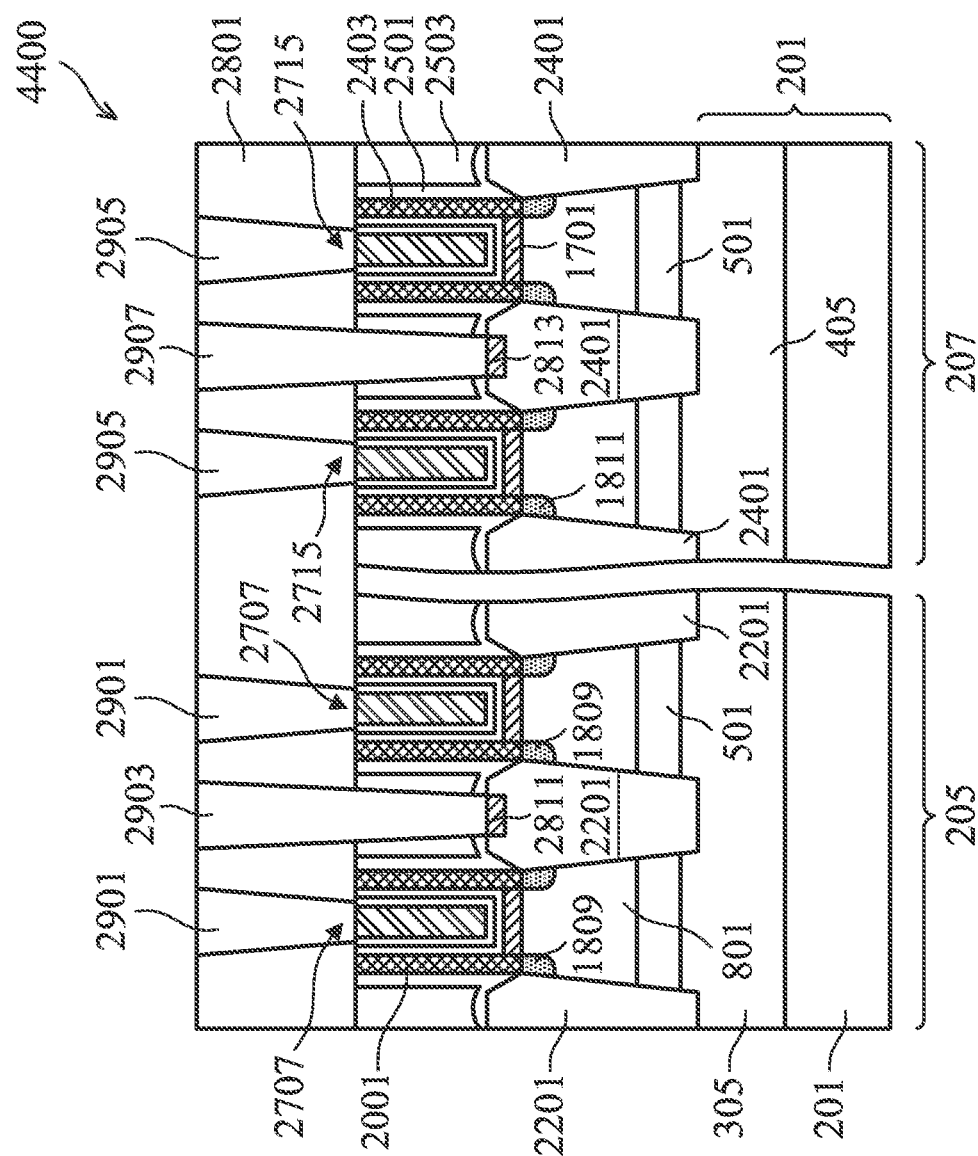
Figure 45C:
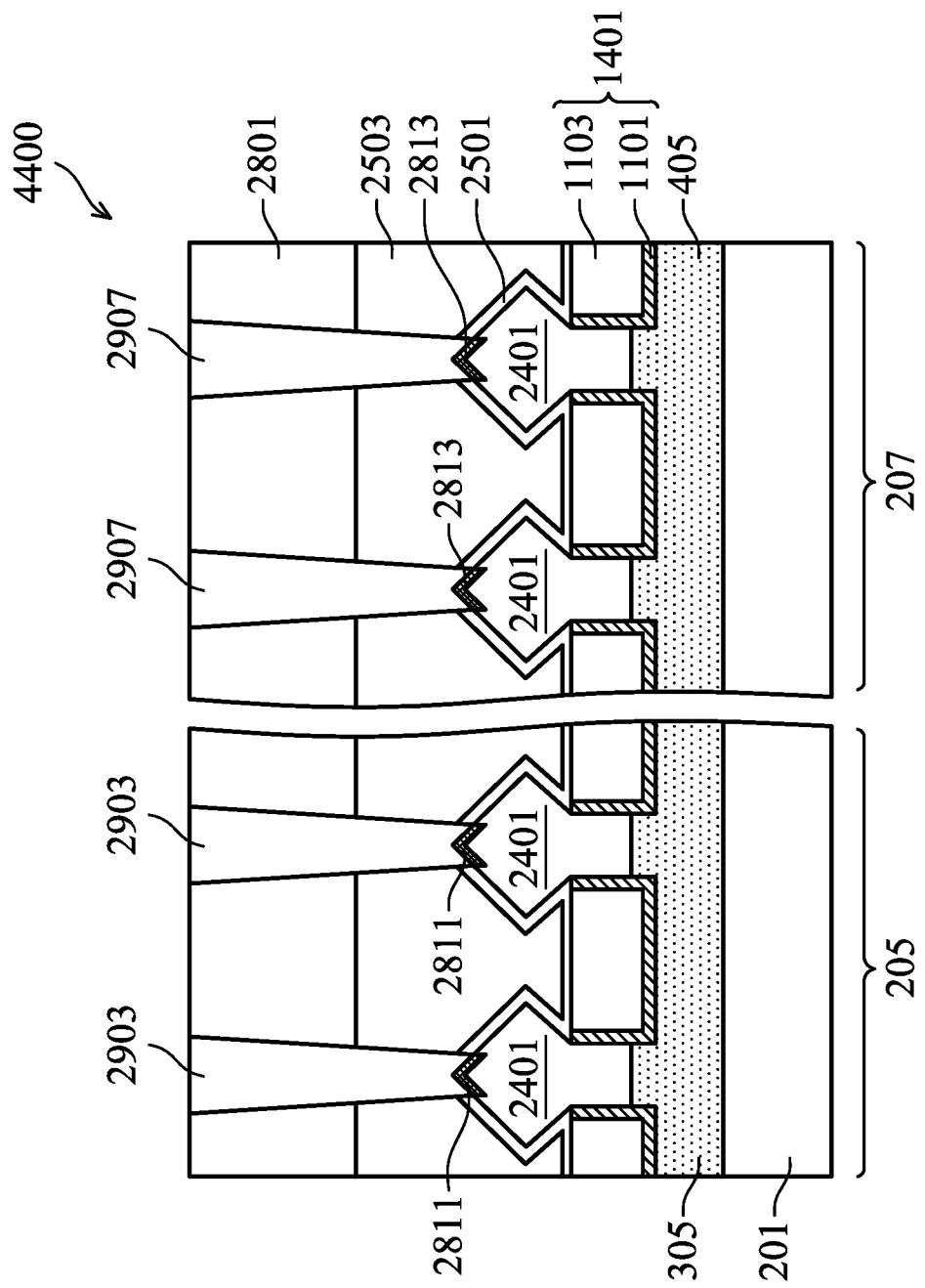

In some embodiments, the process of forming the FinFET device 4400 starts with forming a structure illustrated in FIG. 13A. Referring to FIG. 44A, the process steps described above with reference to FIGS. 38A-41A are performed on the PMOS region 205 of the structure of FIG. 13A to form the fins 3901, while protecting the NMOS region 207 of the structure of FIG. 13A with a mask (not shown). Furthermore, the recess process described above with reference to FIG. 14A is performed on the NMOS region 207 of the structure of FIG. 13A to expose portions of the semiconductor strips 1007 in the NMOS region 207, while protecting the PMOS region 205 of the structure of FIG. 13A with a mask (not shown). The exposed portions of the semiconductor strips 1007 form fins 4401 in the NMOS region 207. Referring to FIGS. 45A, 45B, and 45C, the process steps described above with reference to FIGS. 17A-22A, 24A-29A, 17B-22B, 24B-29B, and 18C-29C are performed on the structure of FIG. 44A to form the FinFET device 4400 and the description is not repeated herein.

FIGS. 46A-48A, 48B, and 48C are cross-sectional views of intermediate stages in the manufacturing of a FinFET device 4600 in accordance with some embodiments. In FIGS. 46A-48A, 48B, and 48C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 46A:
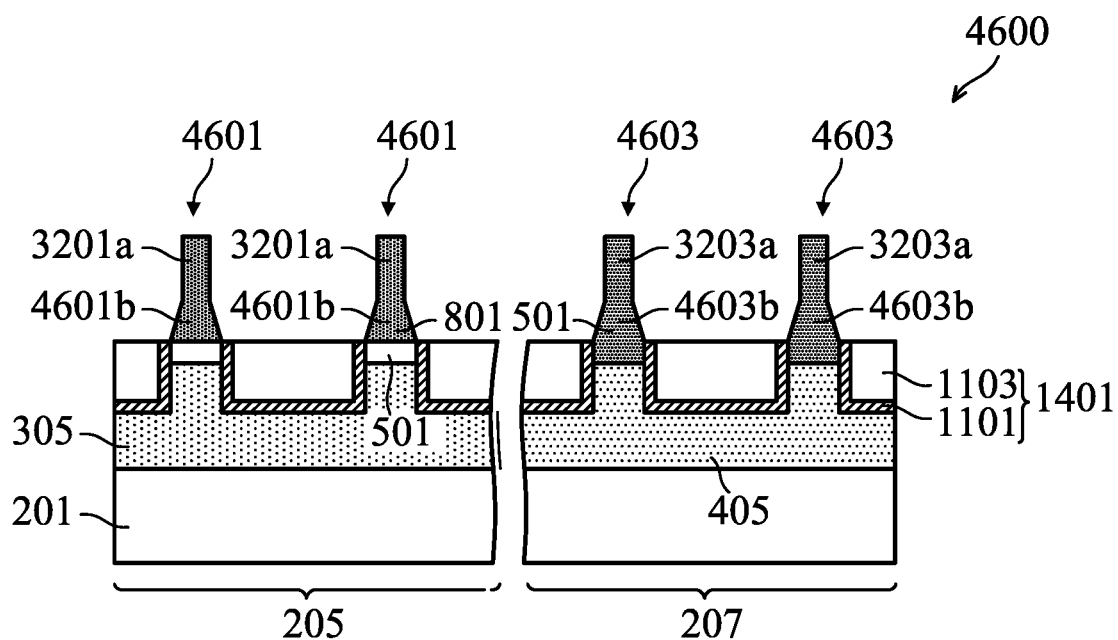
FIG. 46A is cross-sectional view of an intermediate stage in the manufacture of a FinFET device in accordance with some embodiments.

In some embodiments, the process of forming the FinFET device 4400 starts with forming a structure illustrated in FIG. 33A. Referring to FIG. 46A, various process steps are performed on the structure of FIG. 33A to form fins 4601 in the PMOS region 205 and fins 4603 in the NMOS region 207. In some embodiments, the lower portions 3201b of the fins 3201 are reshaped to form lower portions 4601b of the fins 4601 in the PMOS region 205, and the lower portions 3203b of the fins 3203 are reshaped to form lower portions 4603b of the fins 4603 in the NMOS region 207. In some embodiments, the reshaping process for forming the lower portions 4601b of the fins 4601 in the PMOS region 205 and the lower portions 4603b of the fins 4603 in the NMOS region 207 may be similar to the reshaping process for forming the fins 1501 in the PMOS region 205 and the fins 1503 in the NMOS region 207 described above with reference to FIG. 15A and the description is not repeated herein. After performing the reshaping process, widths of the lower portions 4601b of the fins 4601 decrease as the lower portions 4601b of the fins 4601 extend away from the adjacent STI regions 1401 and widths of the lower portions 4603b of the fins 4603 decrease as the lower portions 4603b of the fins 4603 extend away from the adjacent STI regions 1401. Reshaping the semiconductor strips 1005 and 1007 into fins 4601 and 4603, respectively, as described above with reference to FIG. 46A allows for controlling strain in channels of the FinFET device 4600 at fin bottoms and reducing or eliminating fin wiggle/bend effect, and allows for the FinFET device 4600 having a uniform threshold voltage (Vt) along fin heights.

Figure 47A:
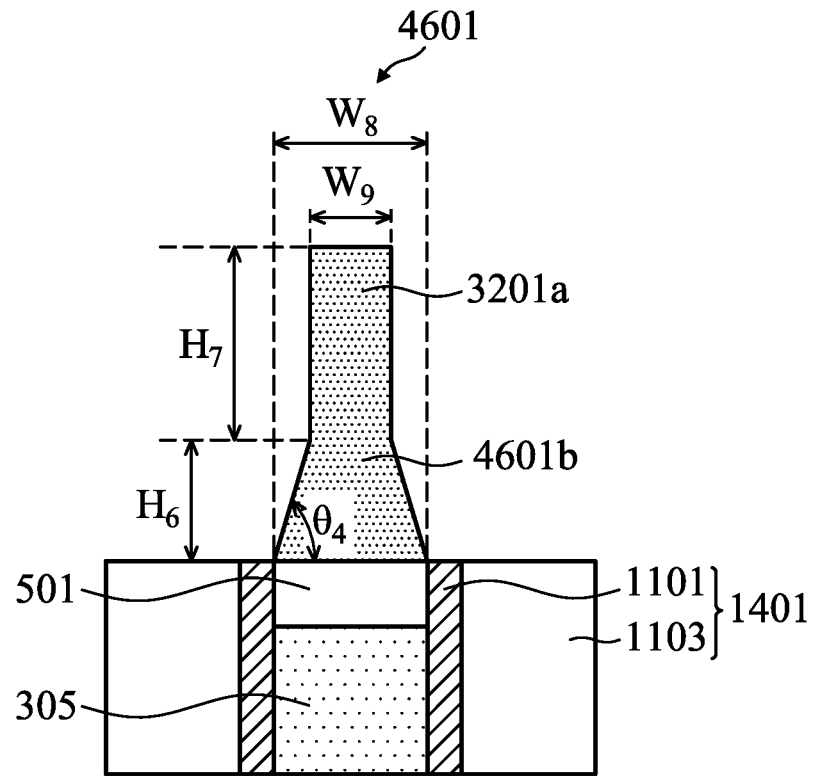
FIG. 47A is cross-sectional view of an intermediate stage in the manufacture of a FinFET device in accordance with some embodiments.

FIG. 47A illustrates a magnified view of a fin 4601 shown in FIG. 46A. In some embodiments, the lower portion 4601b of the fin 4601 has a height $H_6$ between about 10 nm and about 30 nm. In some embodiments, the upper portion 3201a of the fin 4601 has a height $H_7$ between about 20 nm and about 50 nm. In some embodiments, the height $H_6$ is less than a height $H_7$. A portion of the lower portion 4601b of the fin 4601 nearest the adjacent STI regions 1401 has a width $W_8$ and a portion of the lower portion 4601b of the fin 4601 farthest away from the adjacent STI regions 1401 has a width $W_9$. In some embodiments, the width $W_8$ is greater than the width $W_9$. In some embodiments, the width $W_8$ is between about 4 nm and about 15 nm. In some embodiments, the width $W_9$ is between about 3 nm and about 10 nm. The sidewalls of the lower portion 4601b of the fin 4601 form an angle $\theta_4$ with the topmost surfaces of adjacent STI regions 1401. In some embodiments, the angle $\theta_4$ is between about 80 degrees and about 90 degrees. In some embodiments, the upper portion 3201a of the fin 4601 has the width $W_9$.

Referring further to FIG. 47A, in some embodiments where the fin 4601 comprises SiGe, the fin 4601 has a uniform Ge concentration. In some embodiments, the uniform Ge concentration in the fin 4601 is between about 15 atomic % and about 40 atomic %. In other embodiments where the fin 4601 comprises SiGe, the fin 4601 has a non-uniform Ge concentration. In some embodiments where the fin 4601 has a non-uniform Ge concentration, the Ge concentration increases as the fin 4601 extends away from the adjacent STI regions 1401. In some embodiments, a Ge concentration of a portion of the fin 4601 nearest the adjacent STI regions 1401 is between about 10 atomic % and about 20 atomic %. In some embodiments, a Ge concentration of a portion of the fin 4601 farthest away from the adjacent STI regions 1401 is between about 25 atomic % and about 35 atomic %. In other embodiments where the fin 4601 has a non-uniform Ge concentration, the lower portion 4601b of the fin 4601 has a uniform Ge concentration and the upper portion 3201a of the fin 4601 has a non-uniform Ge concentration. In some embodiments, the lower portion 4601b of the fin 4601 has the uniform Ge concentration between about 15 atomic % and about 40 atomic %. In some embodiments, the Ge concentration increases as the upper portion 3201a of the fin 4601 extends away from the lower portion 4601b of the fin 4601. In some embodiments, a Ge concentration of a portion of the upper portion 3201a of the fin 4601 nearest the lower portion 4601b of the fin 4601 is between about 10 atomic % and about 20 atomic %. In some embodiments, a Ge concentration of a portion of the upper portion 3201a of the fin 4601 farthest away from the lower portion 4601b of the fin 4601 is between about 25 atomic % and about 35 atomic %. In some embodiments, the fins 4603 (see FIG. 46A) may have similar shapes and sizes as the fins 4601 and the description is not repeated herein.

Figure 48A:
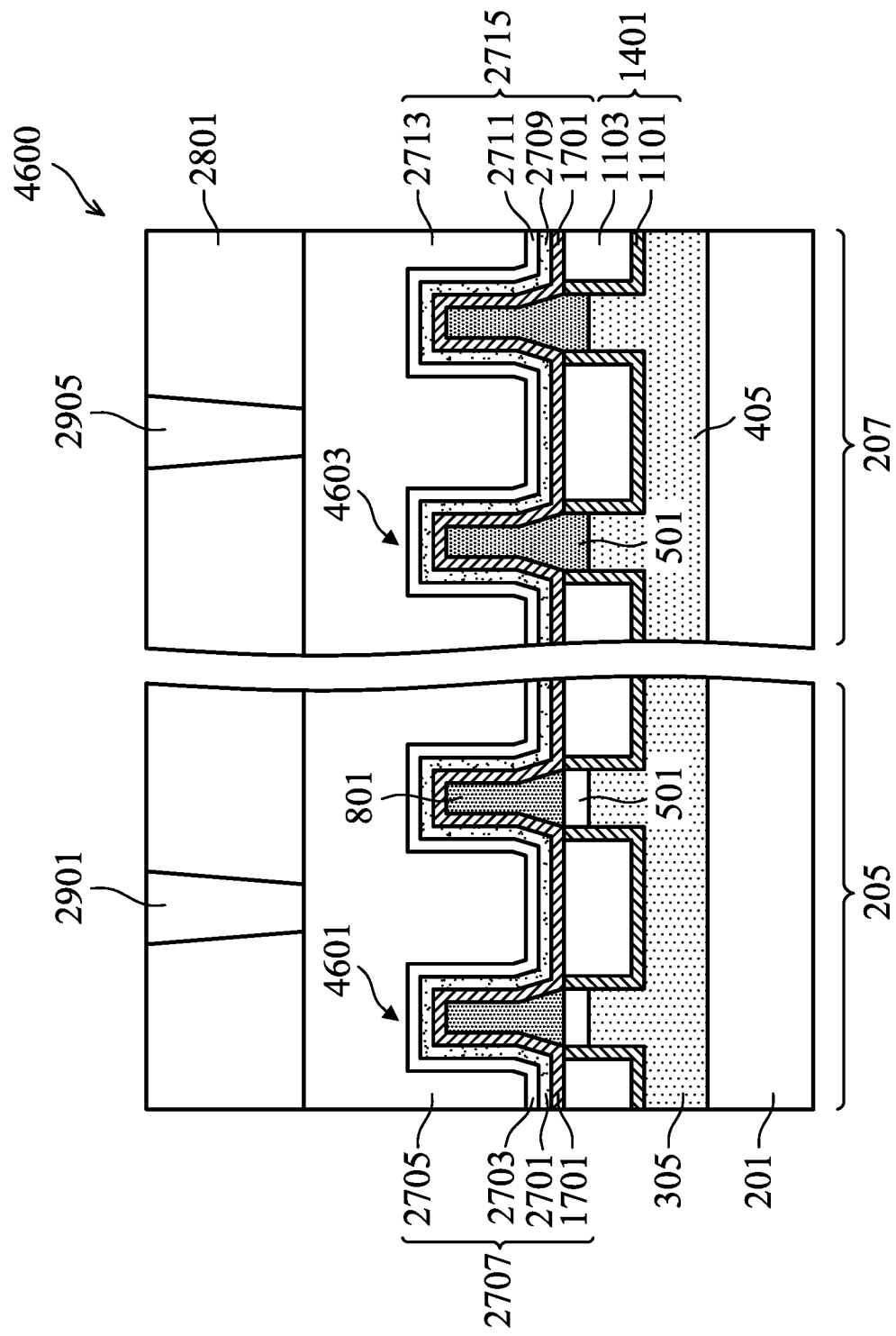
FIGS. 48A, 48B and 48C are cross-sectional views of an intermediate stage in the manufacture of a FinFET device in accordance with some embodiments.
Figure 48B:
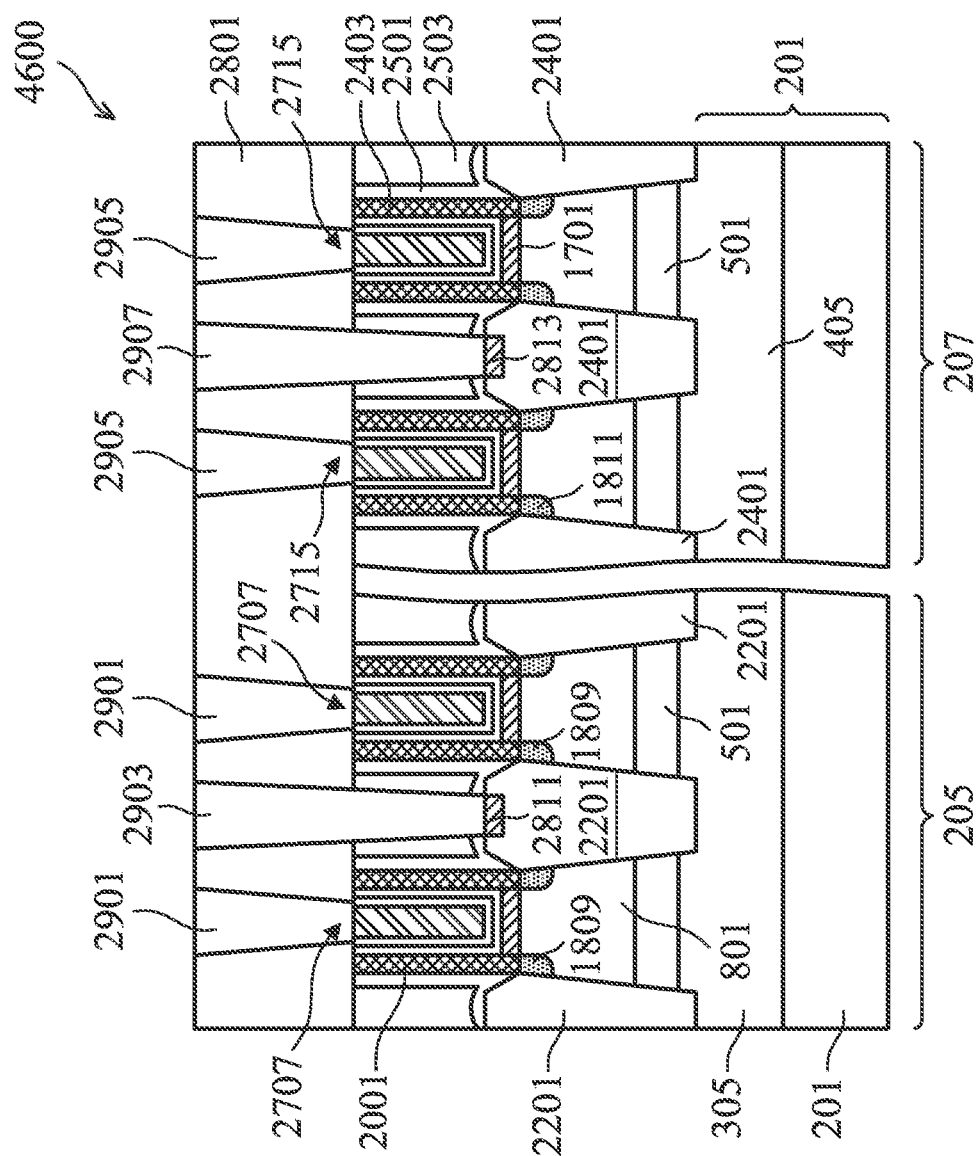
Figure 48C:
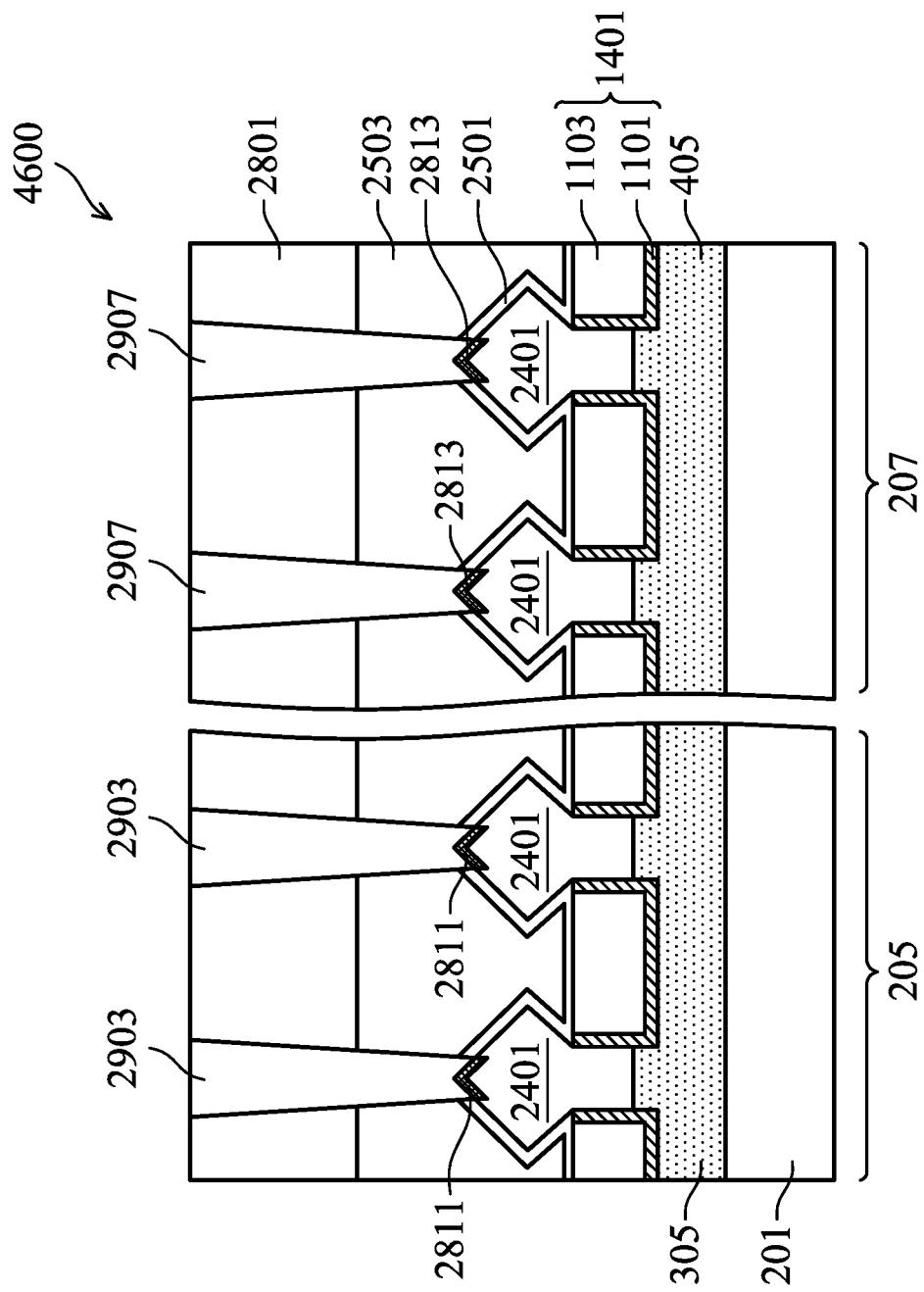

Referring to FIGS. 48A, 48B, and 48C, the process steps described above with reference to FIGS. 17A-22A, 24A-29A, 17B-22B, 24B-29B, and 18C-29C are performed on the structure of FIG. 46A to form the FinFET device 4600 and the description is not repeated herein.

FIGS. 49A, 50A, 50B, and 50C are cross-sectional views of intermediate stages in the manufacturing of a FinFET device 4900 in accordance with some embodiments. In FIGS. 49A, 50A, 50B, and 50C figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 4900 may be similar to the process steps for forming the FinFET device 4600 described above with reference to FIGS. 46A-48A, 48B, and 48C, with like features labeled by like numerical references, and their description is not repeated herein.

Figure 49A:
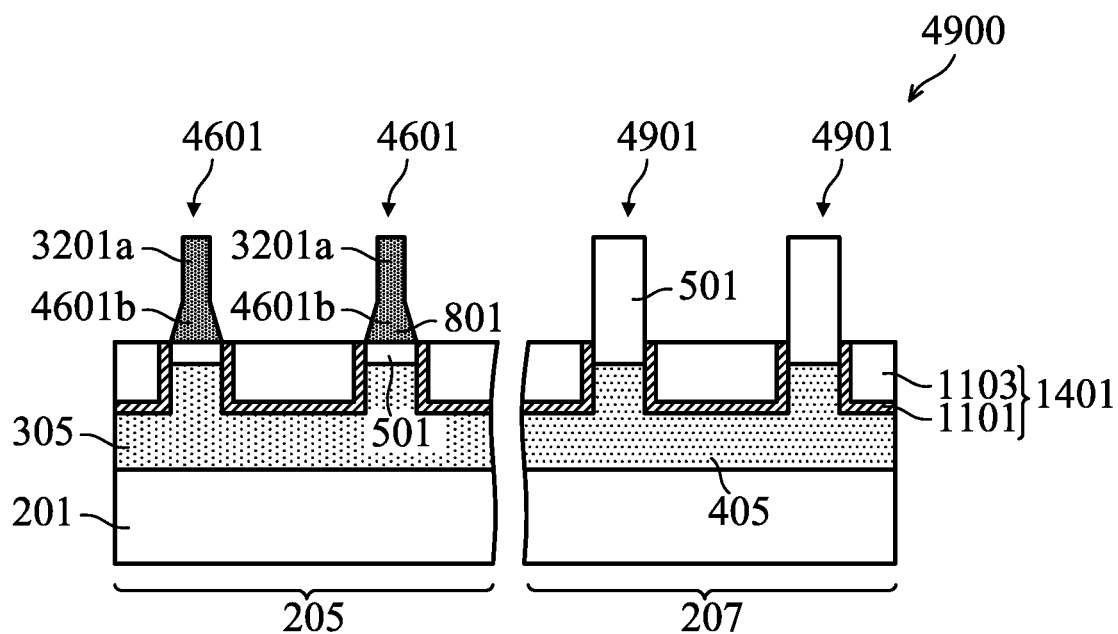
FIG. 49A is a cross-sectional view of an intermediate stage in the manufacture of a FinFET device in accordance with some embodiments.
Figure 50A:
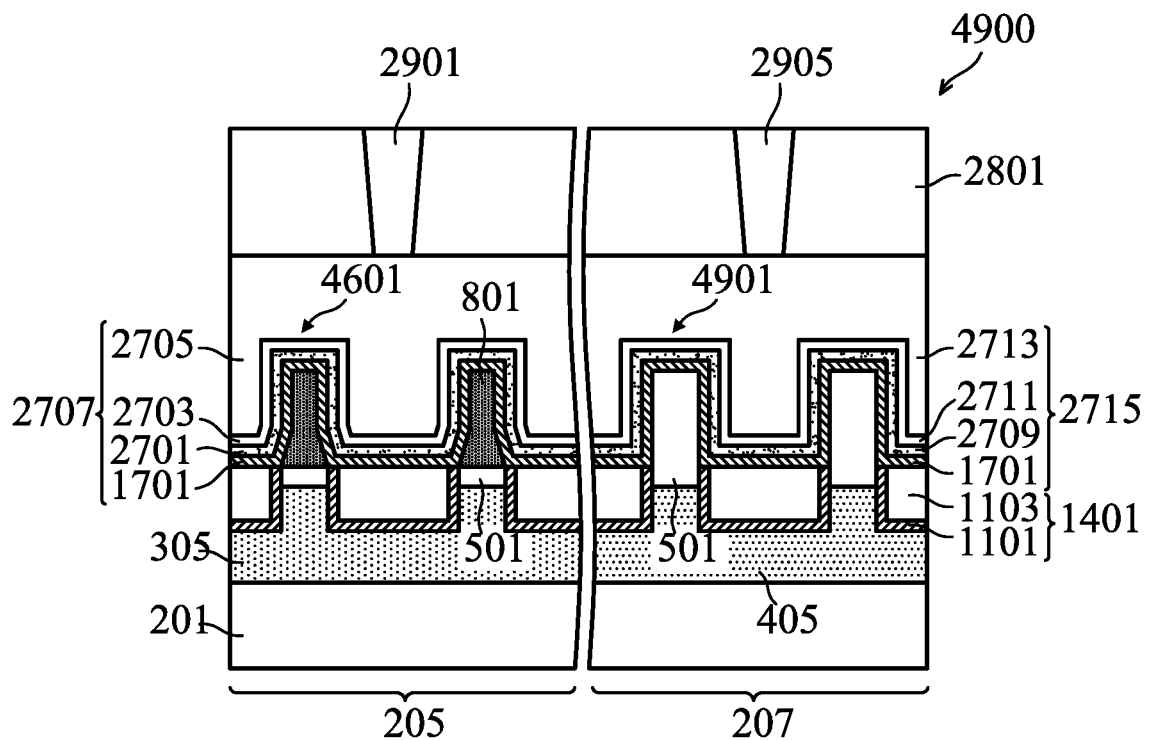
FIGS. 50A, 50B and 50C are cross-sectional views of an intermediate stage in the manufacture of a FinFET device in accordance with some embodiments.
Figure 50B:
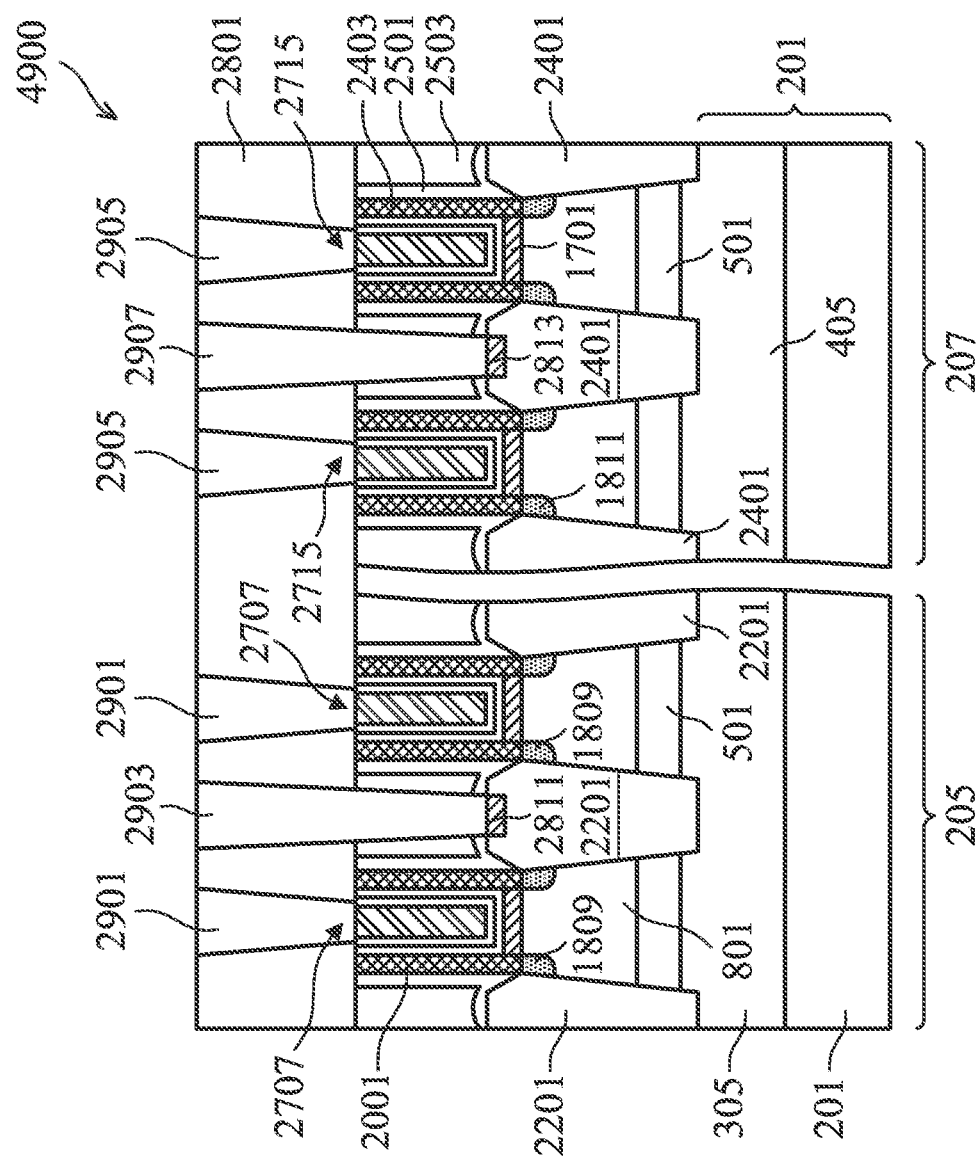
Figure 50C:
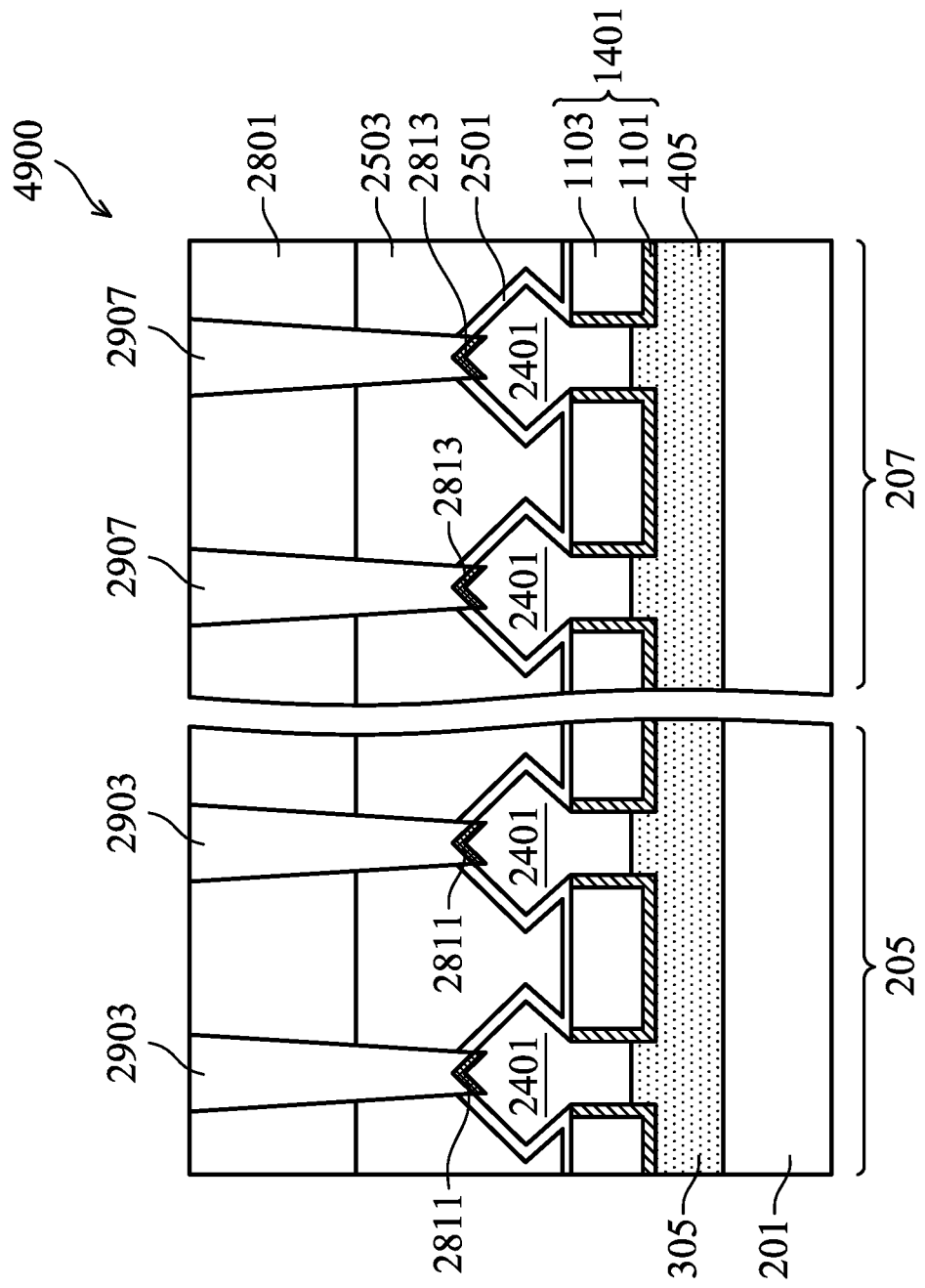

In some embodiments, the process of forming the FinFET device 4900 starts with forming a structure illustrated in FIG. 13A. Referring to FIG. 49A, the process steps described above with reference to FIGS. 32A, 33A, and 46A are performed on the PMOS region 205 of the structure of FIG. 13A to form the fins 4601 in the PMOS region 205, while protecting the NMOS region 207 of the structure of FIG. 13A with a mask (not shown). Furthermore, the recess process described above with reference to FIG. 14A is performed on the NMOS region 207 of the structure of FIG. 13A to expose portions of the semiconductor strips 1007 in the NMOS region 207, while protecting the PMOS region 205 of the structure of FIG. 13A with a mask (not shown). The exposed portions of the semiconductor strips 1007 form fins 4901 in the NMOS region 207. Referring to FIGS. 50A, 50B, and 50C, the process steps described above with reference to FIGS. 17A-22A, 24A-29A, 17B-22B, 24B-29B, and 18C-29C are performed on the structure of FIG. 49A to form the FinFET device 4900 and the description is not repeated herein.

Figure 51:
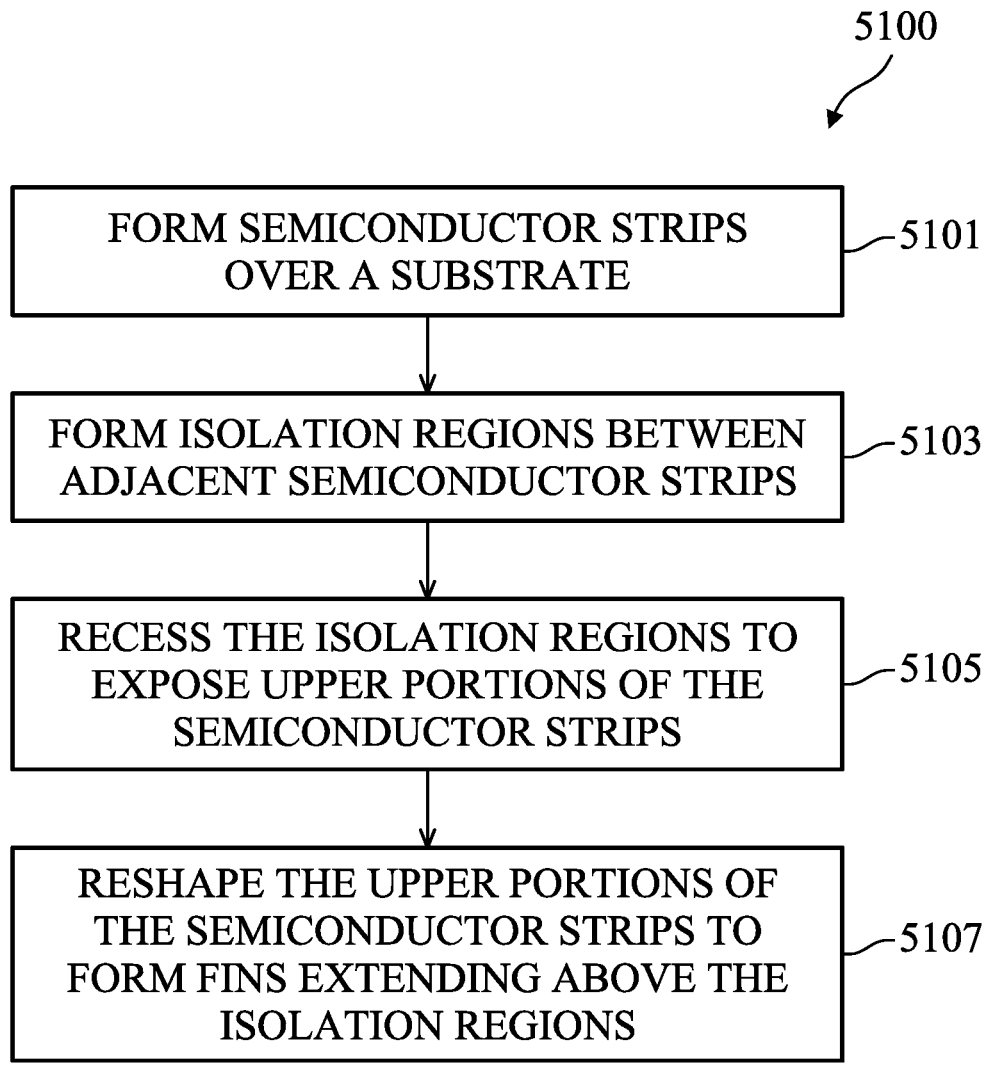
FIG. 51 is a flow diagram illustrating a method of forming a fin structure in accordance with some embodiments.

FIG. 51 is a flow diagram illustrating a method 5100 of forming a fin structure in accordance with some embodiments. The method 5100 starts with step 5101, where semiconductor strips (such as the semiconductor strips 1005 illustrated in FIG. 10A) are formed over a substrate (such as the substrate 201 illustrated in FIG. 10A) as described above with reference to FIGS. 2A-10A. In step 5103, isolation regions (such as the liner 1101 and the insulation material 1103 illustrated in FIG. 10A) are formed between adjacent semiconductor strips as described above with reference to FIGS. 11A-13A. In step 5105, the isolation regions are recessed to expose upper portions of the semiconductor strips as described above with reference to FIG. 14A. In step 5107, the upper portions of the semiconductor strips are reshaped to form fins (such as the fins 1501 illustrated in FIG. 15A) extending above the isolation regions as described above with reference to FIG. 15A.

Figure 52:
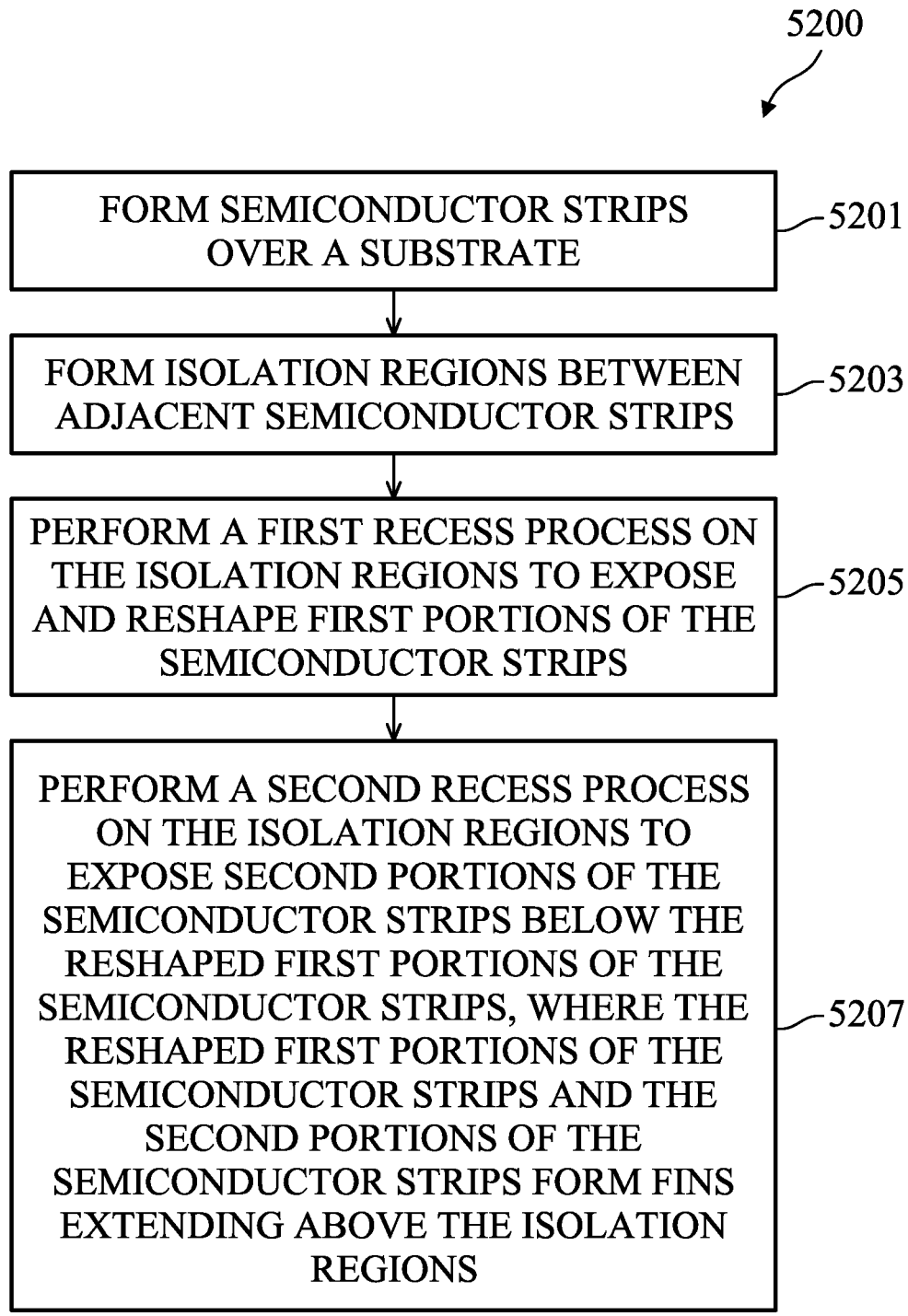
FIG. 52 is a flow diagram illustrating a method of forming a fin structure in accordance with some embodiments.

FIG. 52 is a flow diagram illustrating a method 5200 of forming a fin structure in accordance with some embodiments. The method 5200 starts with step 5201, where semiconductor strips (such as the semiconductor strips 1005 illustrated in FIG. 10A) are formed over a substrate (such as the substrate 201 illustrated in FIG. 10A) as described above with reference to FIGS. 2A-10A. In step 5203, isolation regions (such as the liner 1101 and the insulation material 1103 illustrated in FIG. 10A) are formed between adjacent semiconductor strips as described above with reference to FIGS. 11A-13A. In step 5205, a first recess process is performed on the isolation regions to expose and reshape first portions (such as the upper portions 3201a illustrated in FIG. 32A) of the semiconductor strips as described above with reference to FIG. 32A. In step 5207, a second recess process is performed on the isolation regions to expose second portions (such as the lower portions 3201b illustrated in FIG. 33A) of the semiconductor strips below the reshaped first portions of the semiconductor strips, where the reshaped first portions of the semiconductor strips and the second portions of the semiconductor strips form fins (such as the fins 3201 illustrated in FIG. 33A) extending above the isolation regions as described above with reference to FIG. 33A.

Figure 53:
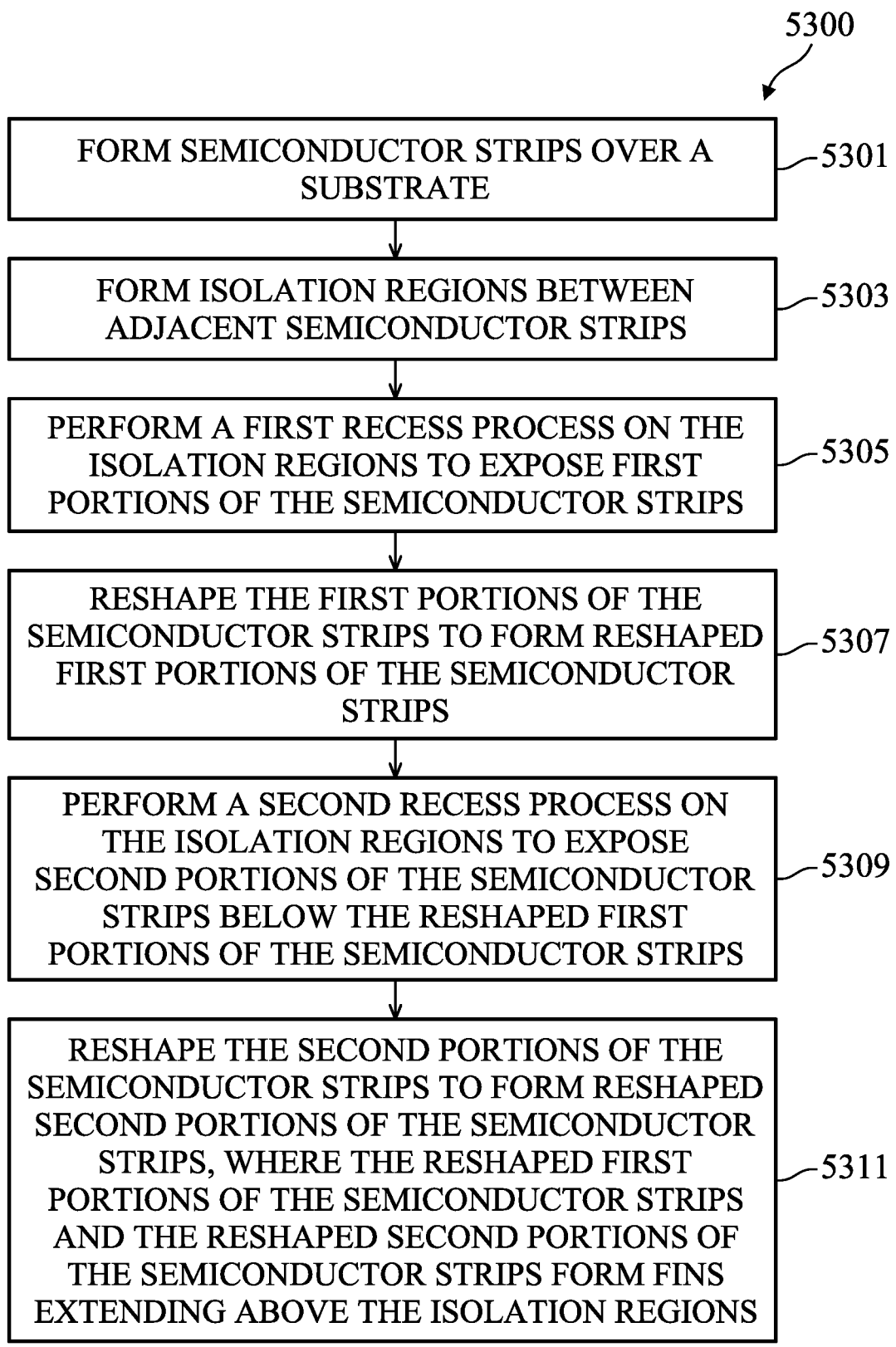
FIG. 53 is a flow diagram illustrating a method of forming a fin structure in accordance with some embodiments.

FIG. 53 is a flow diagram illustrating a method 5300 of forming a fin structure in accordance with some embodiments. The method 5300 starts with step 5301, where semiconductor strips (such as the semiconductor strips 1005 illustrated in FIG. 10A) are formed over a substrate (such as the substrate 201 illustrated in FIG. 10A) as described above with reference to FIGS. 2A-10A. In step 5303, isolation regions (such as the liner 1101 and the insulation material 1103 illustrated in FIG. 10A) are formed between adjacent semiconductor strips as described above with reference to FIGS. 11A-13A. In step 5305, a first recess process is performed on the isolation regions to expose first portions (such as the first portions 3801a illustrated in FIG. 38A) of the semiconductor strips as described above with reference to FIG. 38A. In step 5307, the first portions of the semiconductor strips are reshaped to form reshaped first portions (such as the upper portions 3901a illustrated in FIG. 39A) of the semiconductor strips as described above with reference to FIG. 39A. In step 5309, a second recess process is performed on the isolation regions to expose second portions (such as the second portions 3801b illustrated in FIG. 40A) of the semiconductor strips below the reshaped first portions of the semiconductor strips as described above with reference to FIG. 40A. In step 5311, the second portions of the semiconductor strips are reshaped to form reshaped second portions (such as the lower portions 3901b illustrated in FIG. 41A) of the semiconductor strips, where the reshaped first portions of the semiconductor strips and the reshaped second portions of the semiconductor strips form fins (such as the fins 3901 illustrated in FIG. 41A) extending above the isolation regions as described above with reference to FIG. 41A.

Figure 54:
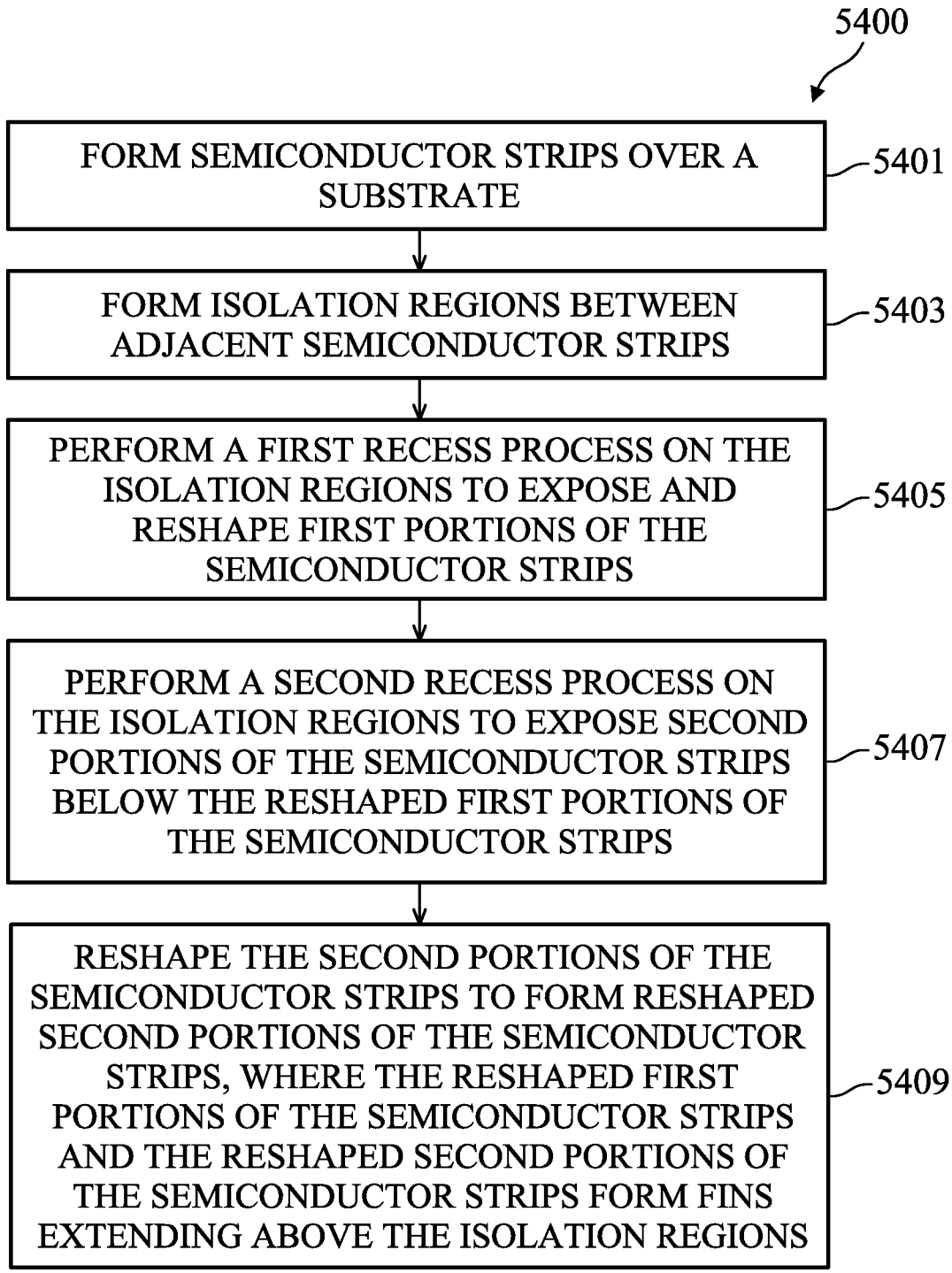
FIG. 54 is a flow diagram illustrating a method of forming a fin structure in accordance with some embodiments.

FIG. 54 is a flow diagram illustrating a method 5400 of forming a fin structure in accordance with some embodiments. The method 5400 starts with step 5401, where semiconductor strips (such as the semiconductor strips 1005 illustrated in FIG. 10A) are formed over a substrate (such as the substrate 201 illustrated in FIG. 10A) as described above with reference to FIGS. 2A-10A. In step 5403, isolation regions (such as the liner 1101 and the insulation material 1103 illustrated in FIG. 10A) are formed between adjacent semiconductor strips as described above with reference to FIGS. 11A-13A. In step 5405, a first recess process is performed on the isolation regions to expose and reshape first portions (such as the upper portions 3201a illustrated in FIG. 32A) of the semiconductor strips as described above with reference to FIG. 32A. In step 5407, a second recess process is performed on the isolation regions to expose second portions (such as the lower portions 3201b illustrated in FIG. 33A) of the semiconductor strips below the reshaped first portions of the semiconductor strips as described above with reference to FIG. 33A. In step 5409, the second portions of the semiconductor strips are reshaped to form reshaped second portions (such as the lower portions 4601*b* illustrated in FIG. 46A) of the semiconductor strips, where the reshaped first portions of the semiconductor strips and the reshaped second portions of the semiconductor strips form fins (such as the fins 4601 illustrated in FIG. 46A) extending above the isolation regions as described above with reference to FIG. 46A.

In accordance with an embodiment, a method includes: forming semiconductor strips over a substrate; forming isolation regions over the substrate and between adjacent semiconductor strips; performing a first recess process on the isolation regions to expose first portions of the semiconductor strips; reshaping the first portions of the semiconductor strips to form reshaped first portions of the semiconductor strips; performing a second recess process on the isolation regions to expose second portions of the semiconductor strips below the reshaped first portions of the semiconductor strips; and reshaping the second portions of the semiconductor strips to form reshaped second portions of the semiconductor strips, where the reshaped first portions of the semiconductor strips and the reshaped second portions of the semiconductor strips form fins, and where the fins extend away from topmost surfaces of the isolation regions. In an embodiment, the first recess process and the second recess process include a same etch process. In an embodiment, reshaping the first portions of the semiconductor strips includes a first etch process. In an embodiment, reshaping the second portions of the semiconductor strips includes a second etch process different from the first etch process. In an embodiment, reshaping the first portions of the semiconductor strips includes altering slopes of sidewalls of the first portions of the semiconductor strips. In an embodiment, reshaping the second portions of the semiconductor strips includes altering slopes of sidewalls of the second portions of the semiconductor strips. In an embodiment, sidewalls of the reshaped first portions of the semiconductor strips have a first slope, and sidewalls of the reshaped second portions of the semiconductor strips have a second slope different from the first slope.

In accordance with another embodiment, a method includes: forming semiconductor strips over a substrate; forming isolation regions between adjacent semiconductor strips; performing a first recess process on the isolation regions to expose first portions of the semiconductor strips, where performing the first recess process further includes reshaping the first portions of the semiconductor strips to form reshaped first portions of the semiconductor strips; performing a second recess process on the isolation regions to expose second portions of the semiconductor strips below the reshaped first portions of the semiconductor strips; and reshaping the second portions of the semiconductor strips to form reshaped second portions of the semiconductor strips, where the reshaped first portions of the semiconductor strips and the reshaped second portions of the semiconductor strips form fins, and where topmost surfaces of the fins are above topmost surfaces of the isolation regions. In an embodiment, the first recess process and the second recess process include different etch processes. In an embodiment, reshaping the first portions of the semiconductor strips includes narrowing the first portions of the semiconductor strips without altering slopes of sidewalls of the first portions of the semiconductor strips. In an embodiment, reshaping the second portions of the semiconductor strips includes altering slopes of sidewalls of the second portions of the semiconductor strips. In an embodiment, reshaping the second portions of the semiconductor strips includes an anisotropic etch process. In an embodiment, the anisotropic etch process is a reactive ion etch process. In an embodiment, widths of the reshaped second portions of the semiconductor strips decrease as the reshaped second portions of the semiconductor strips extend away from the topmost surfaces of the isolation regions.

In accordance with yet another embodiment, a device includes: a substrate; an isolation region over the substrate; and a fin over the substrate and adjacent the isolation region, a topmost surface of the fin being above a topmost surface of the isolation region, wherein the fin includes: a first portion, a first sidewall of the first portion having a first slope; and a second portion between the first portion and the substrate, a second sidewall of the second portion having a second slope, the first sidewall and the second sidewall being on a same side of the fin, the first slope being different from the second slope. In an embodiment, the first portion of the fin has a uniform width. In an embodiment, a width of the first portion of the fin decreases as the first portion of the fin extends away from the second portion of the fin. In an embodiment, a width of the second portion of the fin decreases as the second portion of the fin extends away from the isolation region. In an embodiment, a first height of the first portion of the fin is greater than a second height of the second portion of the fin. In an embodiment, a first height of the first portion of the fin is less than a second height of the second portion of the fin.

In accordance with yet another embodiment, a device includes a substrate, an isolation region over the substrate, and a semiconductor strip over the substrate and extending through the isolation region. A top surface of the semiconductor strip is above a top surface of the isolation region. The semiconductor strip includes a first portion and a second portion between the first portion and the substrate. The first portion has vertical sidewalls. The second portion has sloped sidewalls. The first portion and the second portion are above the top surface of the isolation region.

In accordance with yet another embodiment, a device includes a substrate, a semiconductor strip over the substrate, and an isolation region over the substrate and adjacent the semiconductor strip. The semiconductor strip includes a first portion and a second portion between the first portion and the substrate. The first portion has a uniform width. A width of the second portion decreases as the second portion extends away from the substrate toward the first portion. A top surface of the first portion of the semiconductor strip is above a top surface of the isolation region.

In accordance with yet another embodiment, a method includes forming semiconductor strips over a substrate. Isolation regions are formed between adjacent semiconductor strips. A first etch process is performed on the isolation regions and the semiconductor strips. The first etch process exposes and reshapes first portions of the semiconductor strips to form reshaped first portions of the semiconductor strips. The reshaped first portions of the semiconductor strips have vertical sidewalls. A second etch process is performed on the isolation regions to expose second portions of the semiconductor strips below the reshaped first portions of the semiconductor strips. A third etch process is performed on the second portions of the semiconductor strips to form reshaped second portions of the semiconductor strips. The reshaped second portions of the semiconductor strips have sloped sidewalls.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate;
an isolation region over the substrate;
a semiconductor strip over the substrate and extending through the isolation region, a top surface of the semiconductor strip being above a top surface of the isolation region, wherein the semiconductor strip comprises:
  a first portion, the first portion having first sloped sidewalls, the first sloped sidewalls having a first slope; and
  a second portion between the first portion and the substrate, the second portion having second sloped sidewalls, the second sloped sidewalls having a second slope, the first slope being less than the second slope, the first portion and the second portion being above the top surface of the isolation region; and
a gate structure extending along the first sloped sidewalls and the second sloped sidewalls.

2. The device of claim 1, wherein the first slope is between 70 degrees and 85 degrees.

3. The device of claim 2, wherein the second slope is between 85 degrees and 90 degrees.

4. The device of claim 1, wherein a width of the semiconductor strip at a base of the semiconductor strip is in a range between 4 nm and 15 nm.

5. The device of claim 4, wherein a width of the semiconductor strip at an intersection of the first sloped sidewalls and the second sloped sidewalls is in a range between 3 nm and about 12 nm.

6. The device of claim 5, wherein a width of the semiconductor strip at a top of the semiconductor strip is in a range between 2 nm and 10 nm.

7. The device of claim 1, wherein the semiconductor strip further comprises a base portion having a uniform width, the base portion being between the second portion and the substrate.

8. A device comprising:
a substrate;
a semiconductor strip over the substrate, wherein the semiconductor strip comprises:
  a base portion;
  a first portion above the base portion, a width of the first portion decreasing as the first portion extends away from the substrate toward a top of the semiconductor strip, wherein the base portion is between the first portion and the substrate; and
  a second portion between the first portion and the base portion, a width of the second portion decreasing as the second portion extends away from the base portion toward the first portion, wherein the width of the first portion decreases at a different rate than the width of the second portion decreases, wherein a slope of a sidewall of the base portion is different than a slope of a sidewall of the first portion and a slope of a sidewall of the second portion;
an isolation region over the substrate and adjacent the semiconductor strip, a top surface of the first portion of the semiconductor strip being above a top surface of the isolation region; and
a gate structure extending along the sidewall of the first portion and the sidewall of the second portion.

9. The device of claim 8, wherein a first height of the first portion is in a range between 5 nm and 30 nm.

10. The device of claim 9, wherein a second height of the second portion is in a range between 20 nm and 50 nm.

11. The device of claim 10, wherein the semiconductor strip comprises silicon germanium.

12. The device of claim 11, wherein the first portion has a higher germanium concentration than the second portion.

13. The device of claim 8, wherein the second portion extends above the top surface of the isolation region.

14. The device of claim 8, wherein the semiconductor strip comprises a third portion between the second portion and the substrate, wherein a slope of the third portion is different than a slope of sidewalls of the first portion and a slope of sidewalls of the second portion.

15. A method comprising:
forming semiconductor strips over a substrate;
forming isolation regions between adjacent semiconductor strips;
performing a first etch process on the isolation regions and the semiconductor strips, the first etch process exposing and reshaping first portions of the semiconductor strips to form reshaped first portions of the semiconductor strips, the reshaped first portions of the semiconductor strips having first sloped sidewalls having a first slope;
performing a second etch process on the isolation regions to expose second portions of the semiconductor strips below the reshaped first portions of the semiconductor strips; and
performing a third etch process on the second portions of the semiconductor strips to form reshaped second portions of the semiconductor strips, wherein the reshaped second portions of the semiconductor strips have second sloped sidewalls having a second slope, the first slope being different than the second slope.

16. The method of claim 15, wherein the first etch process is different from the second etch process.

17. The method of claim 16, wherein the third etch process is different from the first etch process and the second etch process.

18. The method of claim 15, further comprising forming a gate structure along sidewalls of the first sloped sidewalls.

19. The method of claim 15, wherein the semiconductor strips comprise SiGe, and wherein the semiconductor strips have non-uniform Ge concentrations.

20. The method of claim 15, further comprising forming a gate structure along sidewalls of the first sloped sidewalls and sidewalls of the second sloped sidewalls.

\* \* \* \* \*